United States Patent
Ikegami et al.

(10) Patent No.: US 10,141,038 B2
(45) Date of Patent: Nov. 27, 2018

(54) COMPUTER SYSTEM AND MEMORY DEVICE

(71) Applicant: Toshiba Memory Corporation, Minato-Ku (JP)

(72) Inventors: Kazutaka Ikegami, Inagi (JP); Hiroki Noguchi, Yokohama (JP); Keiko Abe, Yokohama (JP)

(73) Assignee: Toshiba Memory Corporation, Minato-Ku (JP)

( * ) Notice: Subject to any disclaimer, the term of this patent is extended or adjusted under 35 U.S.C. 154(b) by 0 days.

(21) Appl. No.: 15/703,438

(22) Filed: Sep. 13, 2017

(65) Prior Publication Data
US 2018/0277187 A1    Sep. 27, 2018

(30) Foreign Application Priority Data
Mar. 21, 2017  (JP) .................................. 2017-054585

(51) Int. Cl.
  *G11C 11/16*    (2006.01)
(52) U.S. Cl.
  CPC ...... *G11C 11/1673* (2013.01); *G11C 11/1655* (2013.01); *G11C 11/1675* (2013.01); *G11C 11/1693* (2013.01)
(58) Field of Classification Search
  CPC . G11C 11/16; G11C 11/1655; G11C 11/1673; G11C 11/1675
  USPC .............. 365/158, 148, 171, 173, 189.07
  See application file for complete search history.

(56) References Cited

U.S. PATENT DOCUMENTS

| 7,203,088 B2 * | 4/2007 | Ikegawa ................. G11C 11/16 365/158 |
| 2004/0004856 A1 | 1/2004 | Sakimura et al. |
| 2013/0117627 A1 | 5/2013 | Lee et al. |
| 2013/0229861 A1 * | 9/2013 | Ueda ................... G11C 11/1673 365/158 |
| 2014/0269029 A1 * | 9/2014 | Kinney ............... G11C 11/1673 365/158 |
| 2014/0269042 A1 * | 9/2014 | Berger .................. G11C 11/16 365/158 |

(Continued)

FOREIGN PATENT DOCUMENTS

| JP | 3821066 | 9/2006 |
| JP | 2008-217842 | 9/2008 |
| JP | 2016-62513 | 4/2016 |

(Continued)

*Primary Examiner* — Tan T. Nguyen
(74) *Attorney, Agent, or Firm* — Oblon, McClelland, Maier & Neustadt, L.L.P.

(57) ABSTRACT

According to one embodiment, a system includes: a device including a memory cell array, the device configured to execute first read operation of a first read method and second read operation of a second read method on the memory cell array; a processor configured to receive a first data from the device, the first data from a selected region in the memory cell array by the first read operation, configured to execute first calculation processing using the first data during the second read operation to the selected region, and configured to acquire a result of the first calculation processing by a first signal based on a comparison result of the first data and a second data, the first signal indicating that the first data is valid, and the second data from the selected region by the second read operation.

20 Claims, 29 Drawing Sheets

(56) References Cited

U.S. PATENT DOCUMENTS

2015/0212871 A1    7/2015   Kinney et al.

FOREIGN PATENT DOCUMENTS

| JP | 2016-516255 | 6/2016 |
| WO | WO 2016/043271 A1 | 3/2016 |

* cited by examiner

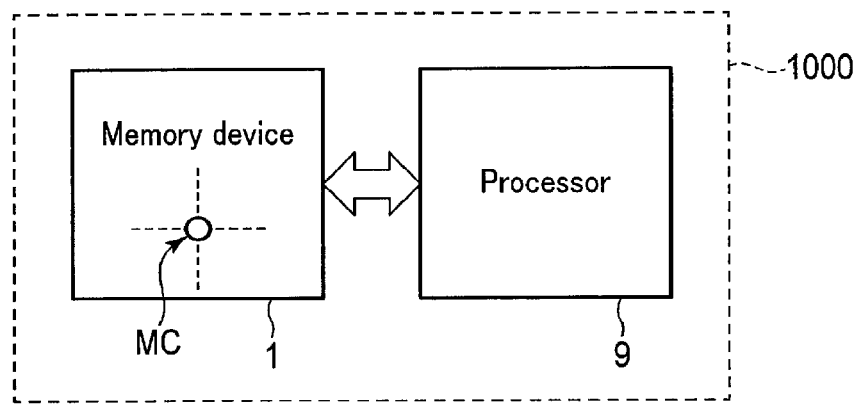
F I G. 1
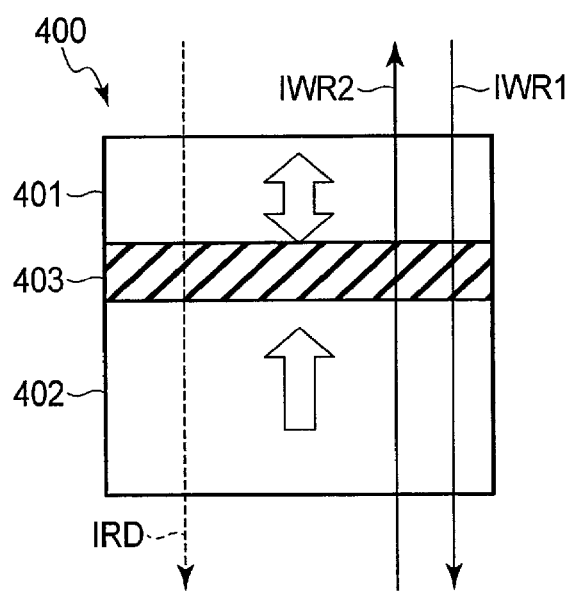
F I G. 2

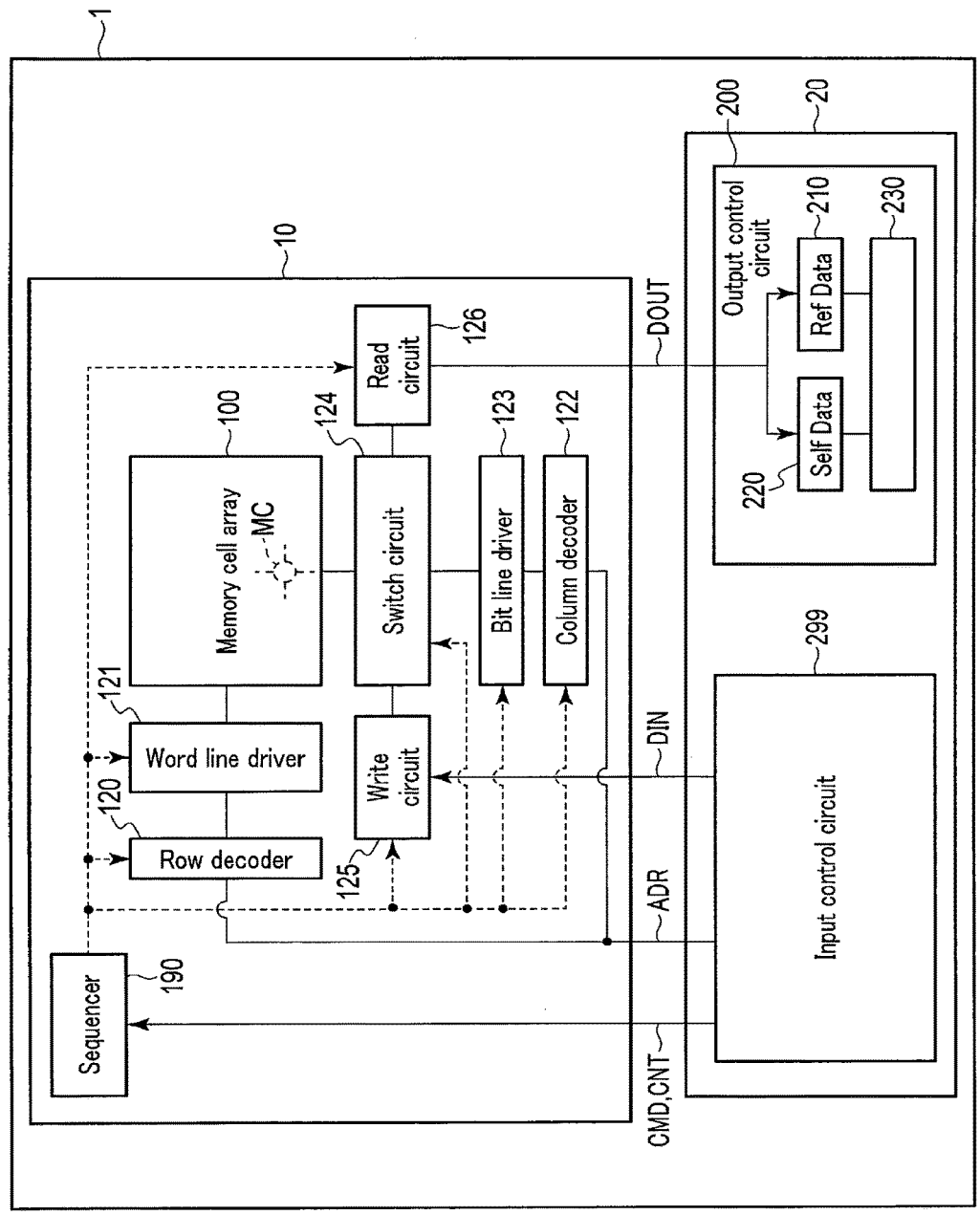
F I G. 7

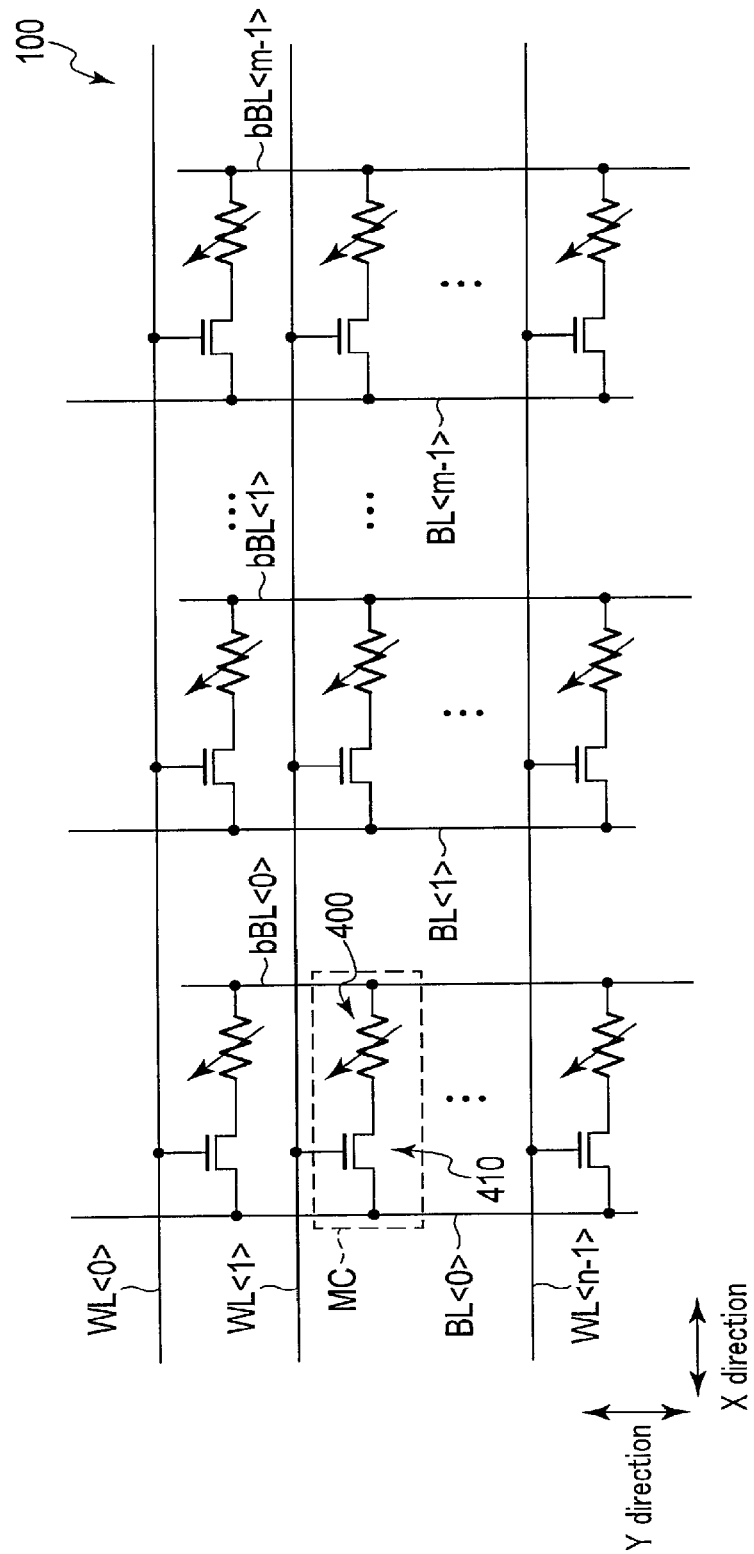
F I G. 8

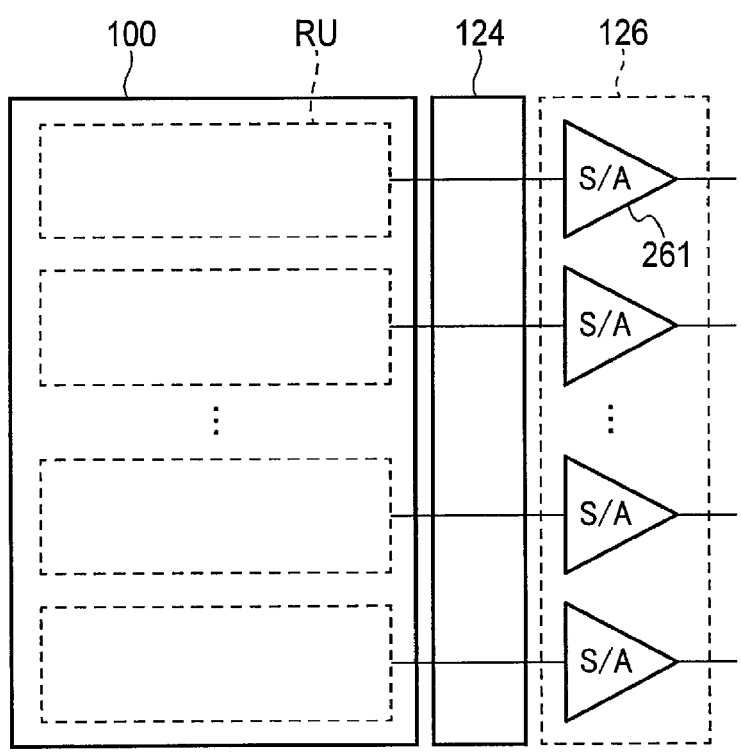
F I G. 9

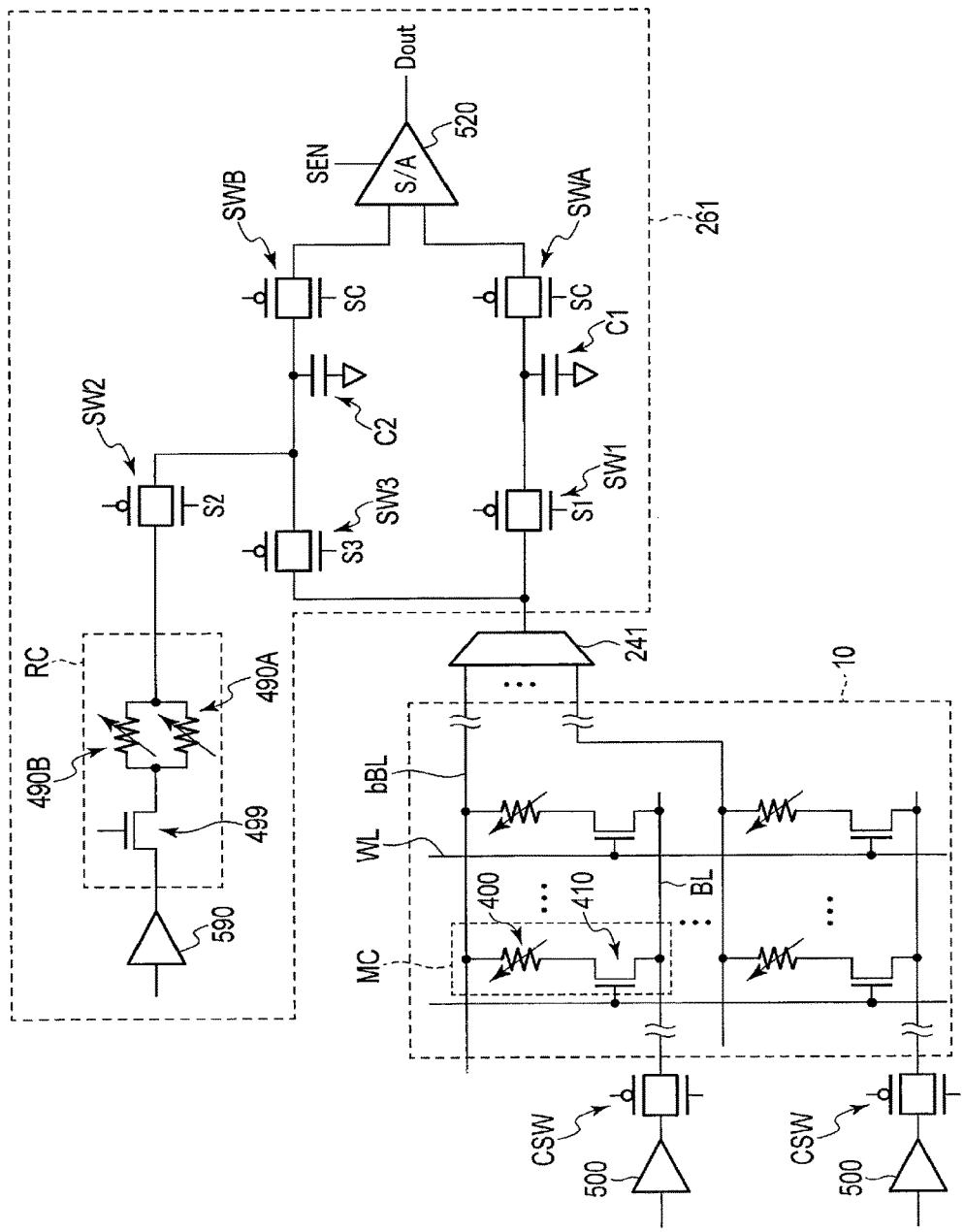
F I G. 10

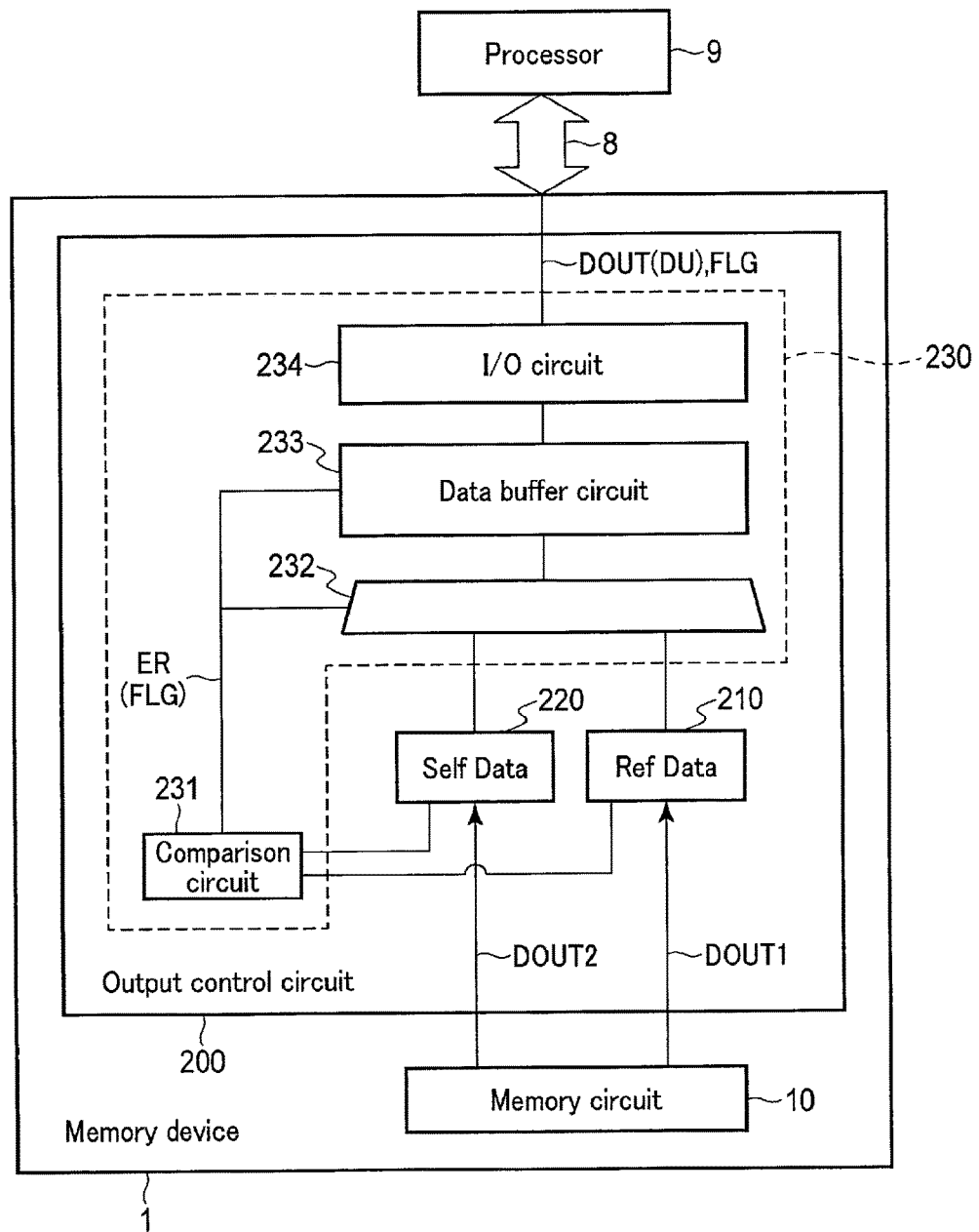
F I G. 11

| Entry | Busy | Instruction | | Operand1 | | Operand2 | | Destination | | Value | State |
|---|---|---|---|---|---|---|---|---|---|---|---|
| | | | error | address | error | address | error | address | error | | |
| | | | 661 | 662 | | 663 | | 664 | | 665 | 666 |
| 1 | no | Load | valid | | | | | address | error | Mem[address] | Commit |
| 2 | no | Add | valid | F1 | valid | F4 | valid | F1 | valid | V[F1]+V[F6] | Commit |
| 3 | yes | Div | wait | F1 | valid | F8 | wait | F10 | valid | V[F1]/V[F8] | Waiting |
| ... | | ... | | ... | | ... | | ... | | ... | ... |

FIG. 14

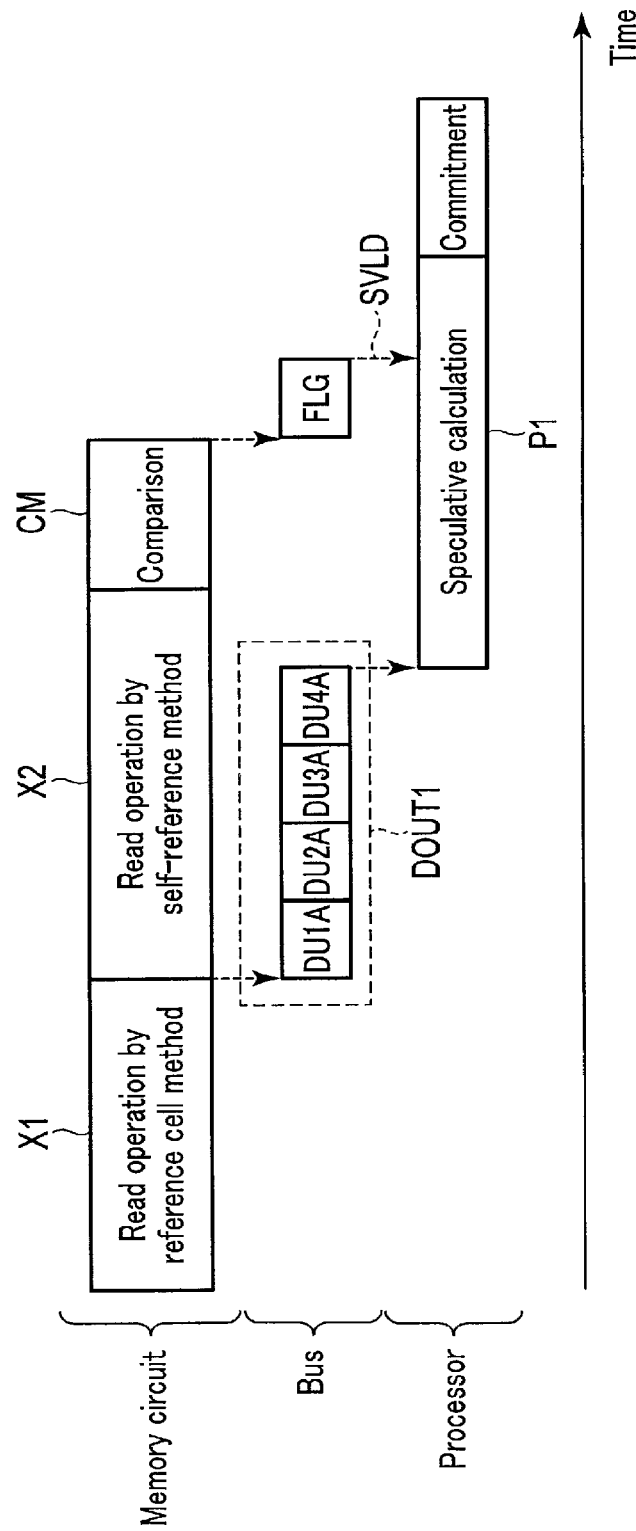
F I G. 15

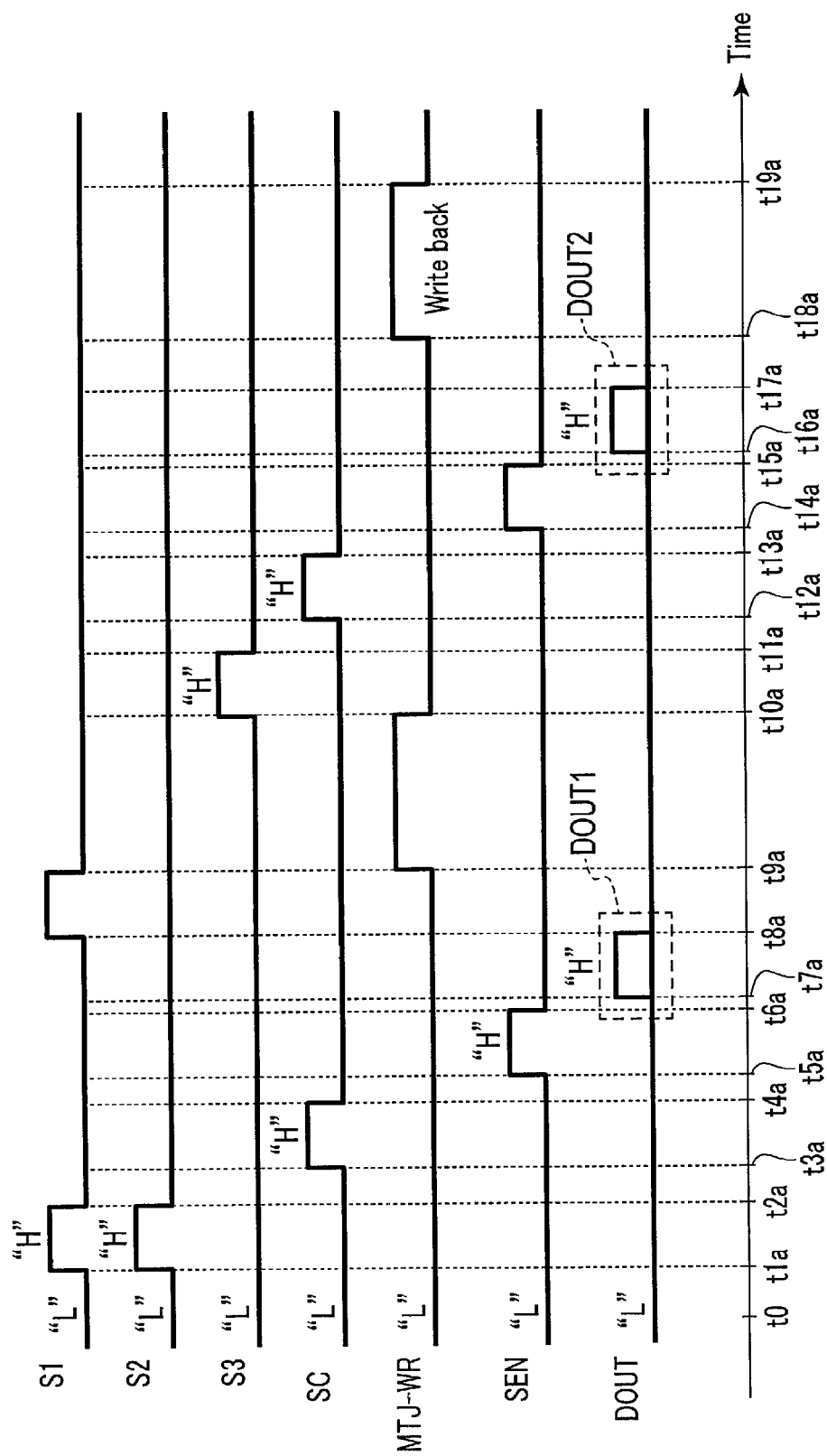
F I G. 16

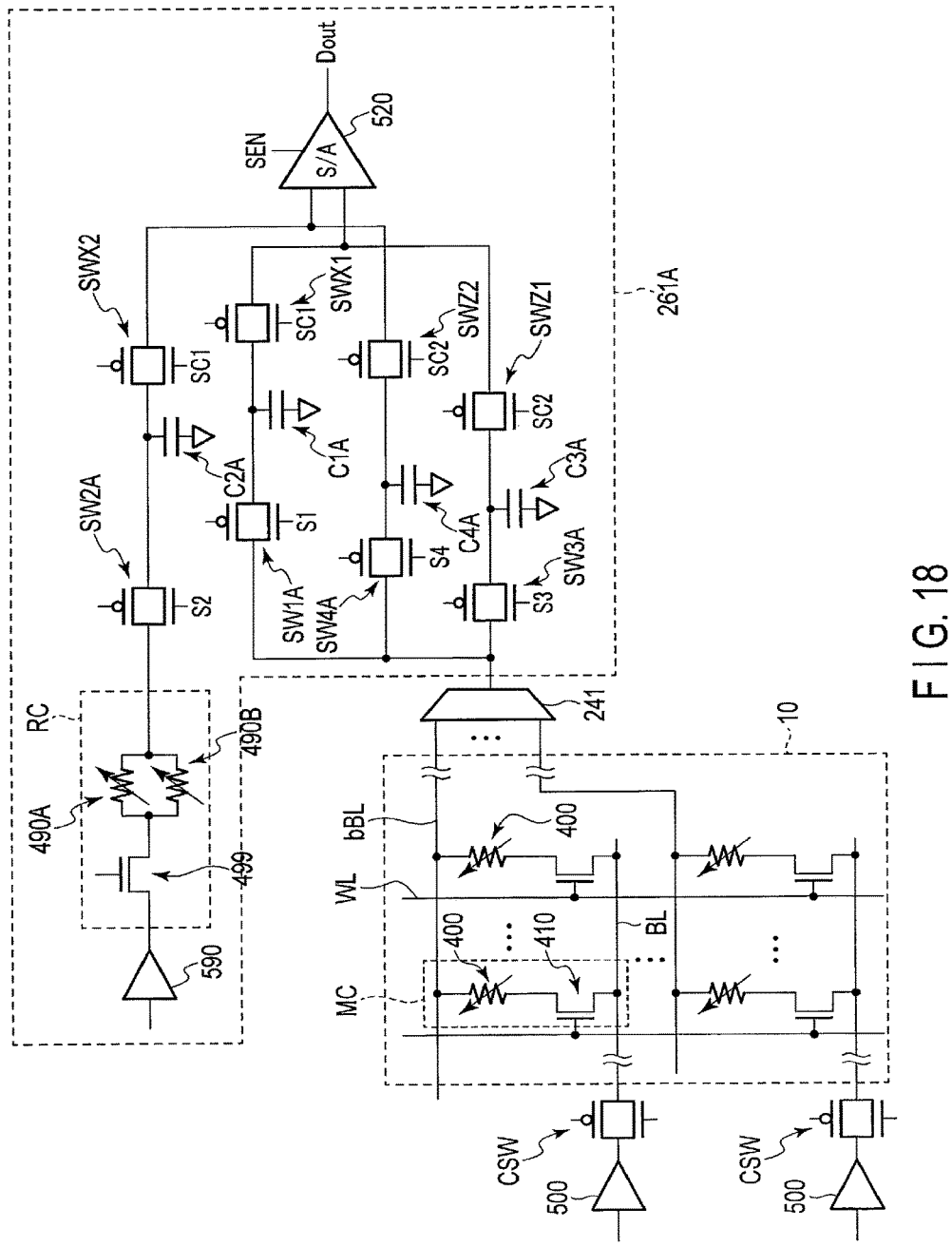
F I G. 18

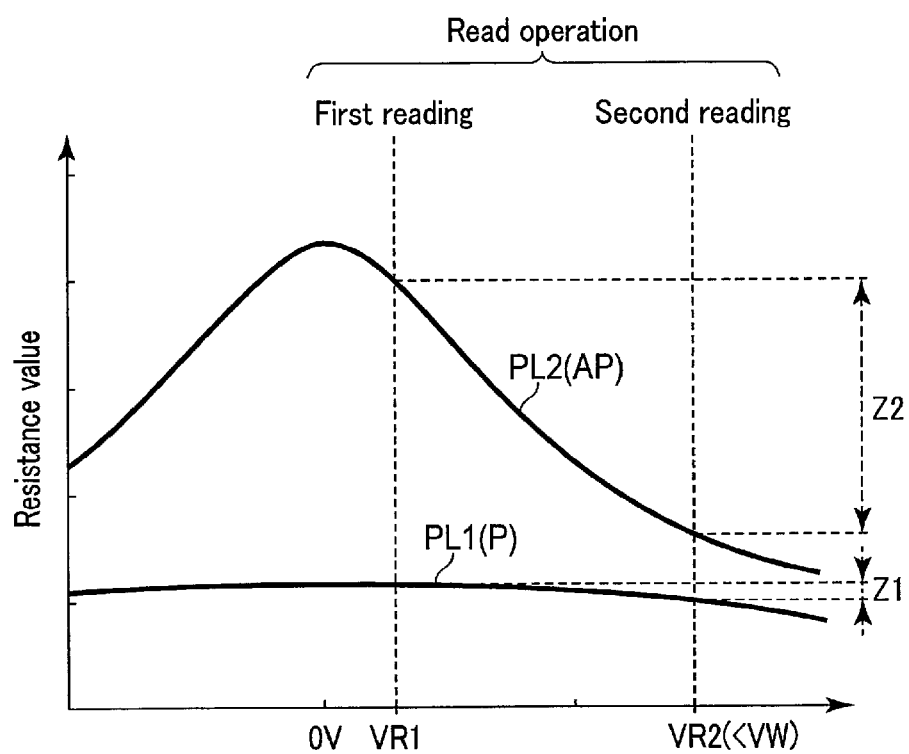
F I G. 20

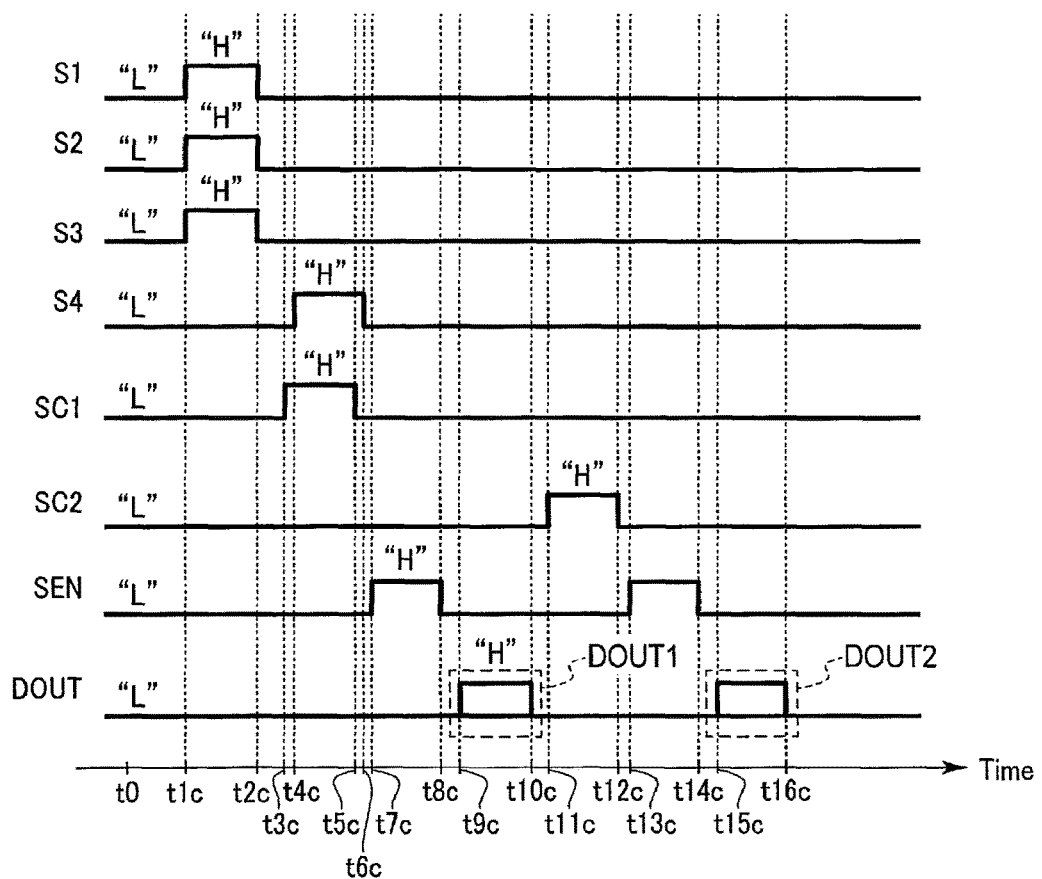
F I G. 22

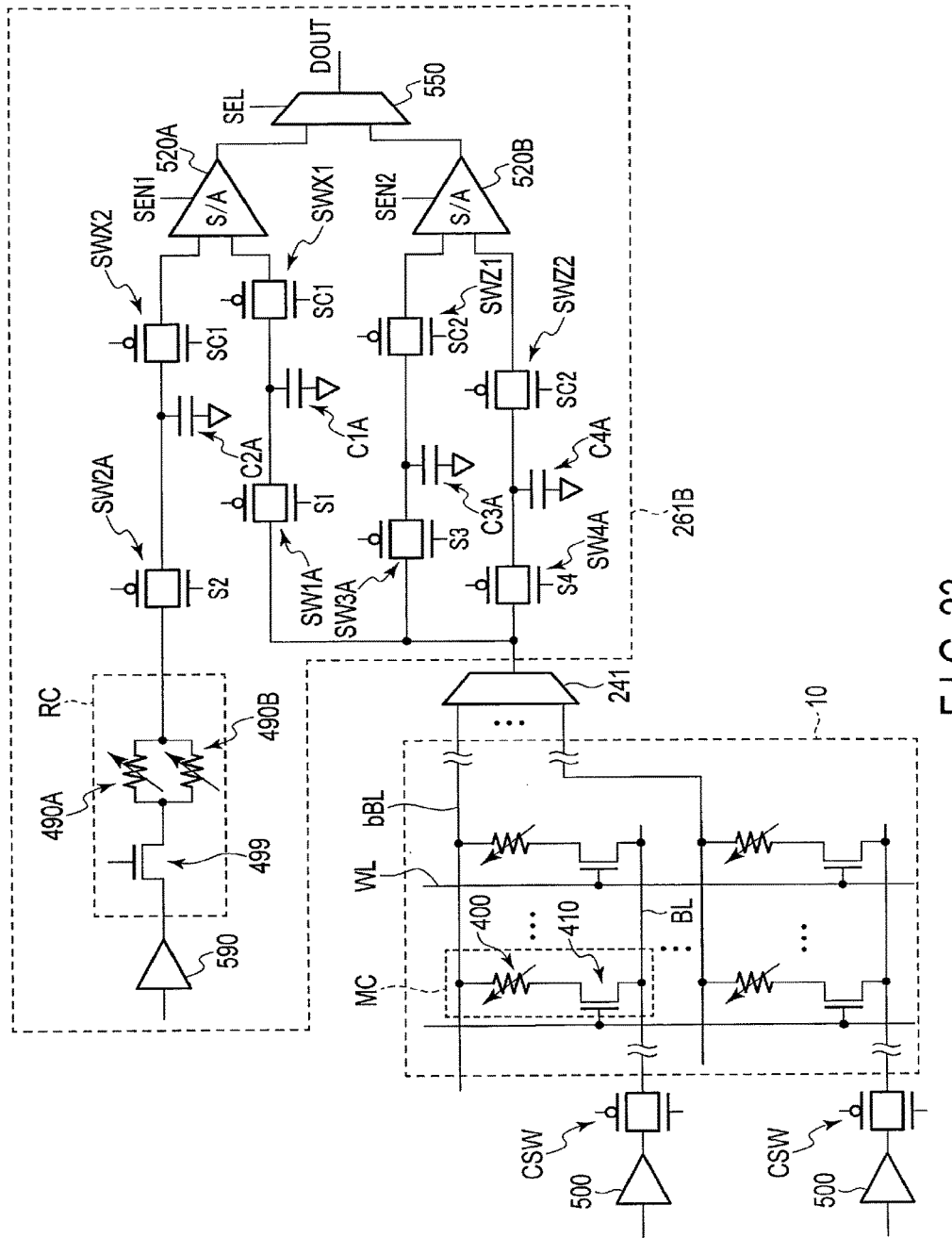
F I G. 23

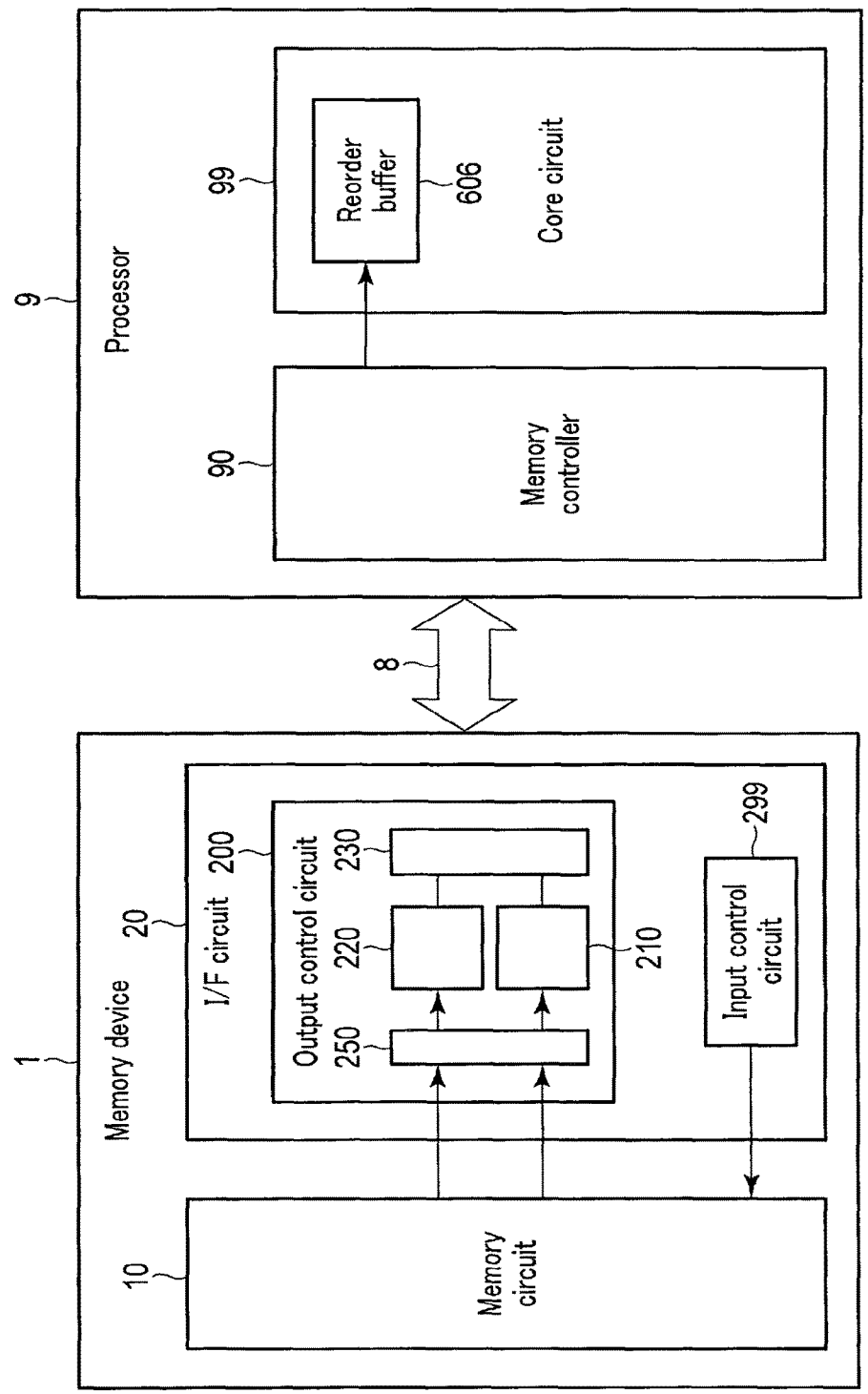
F I G. 26

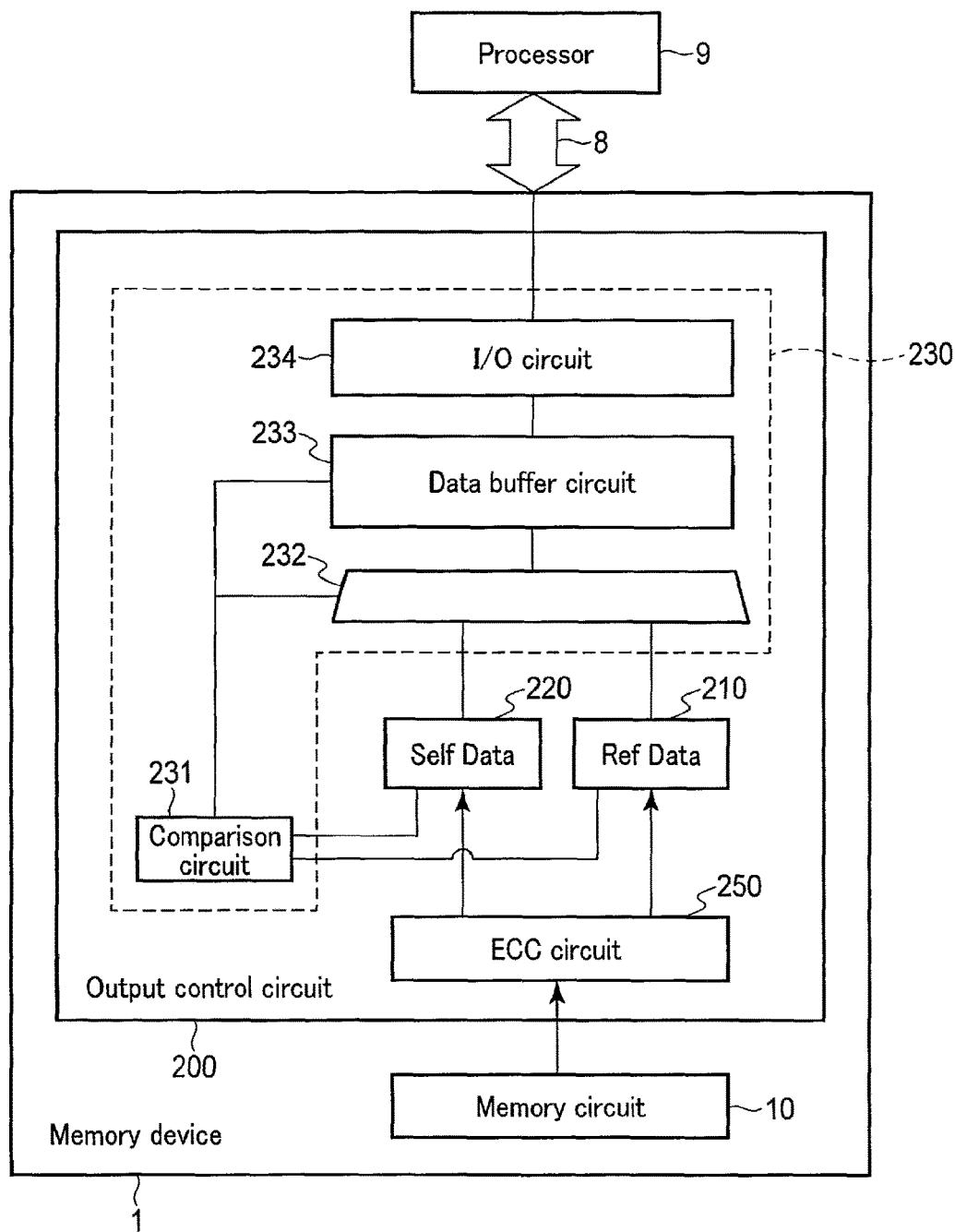
F I G. 27

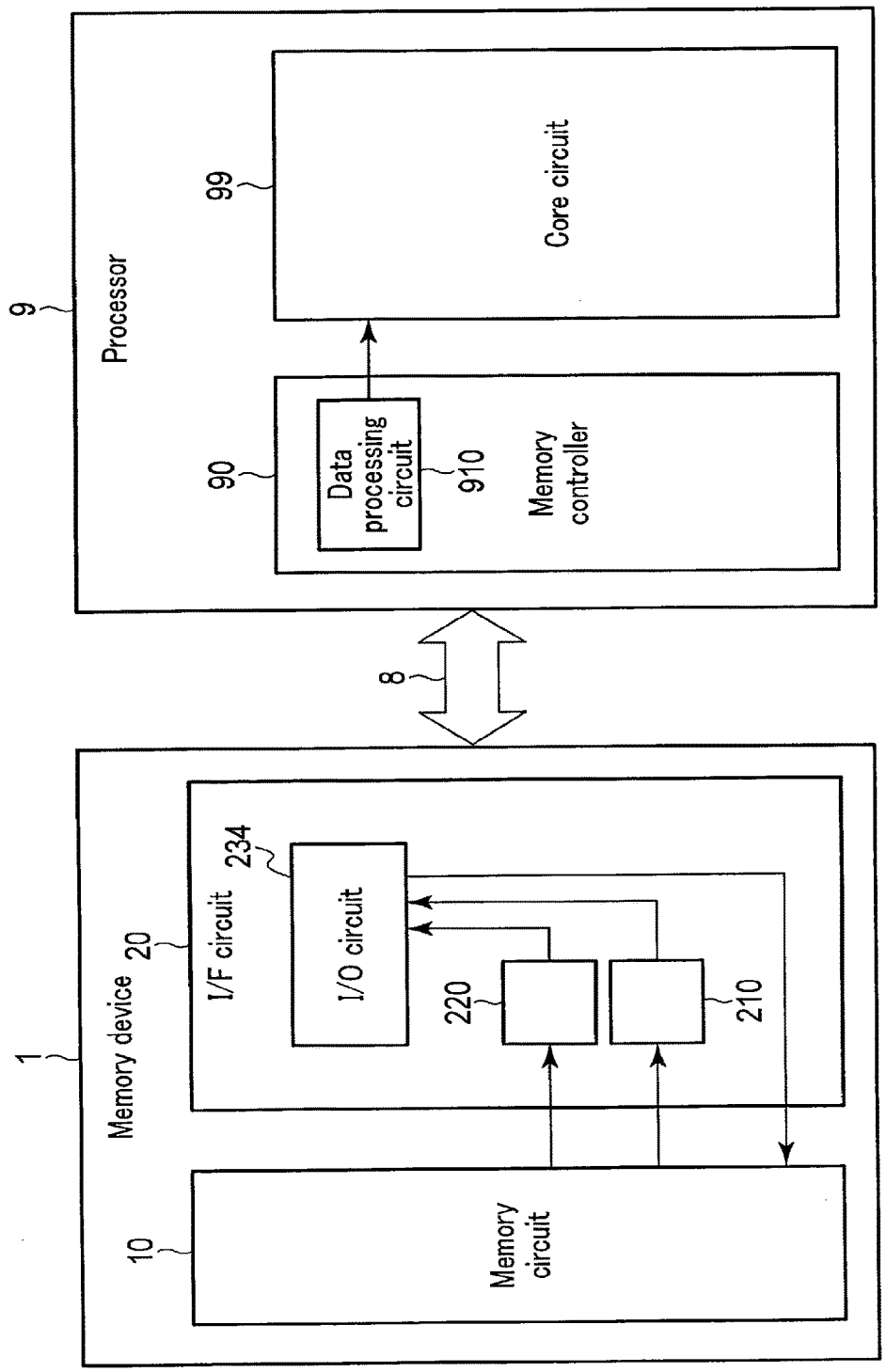
F I G. 28

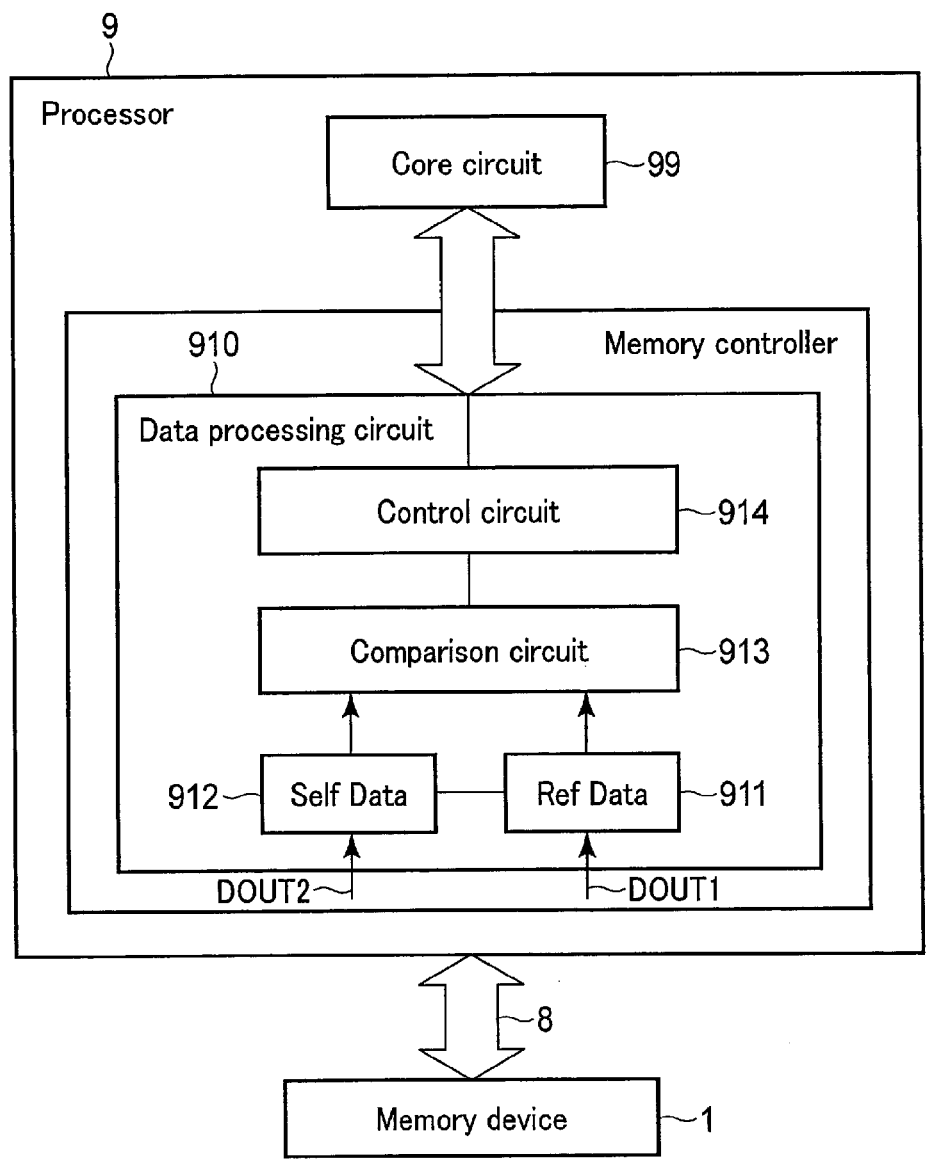
F I G. 29

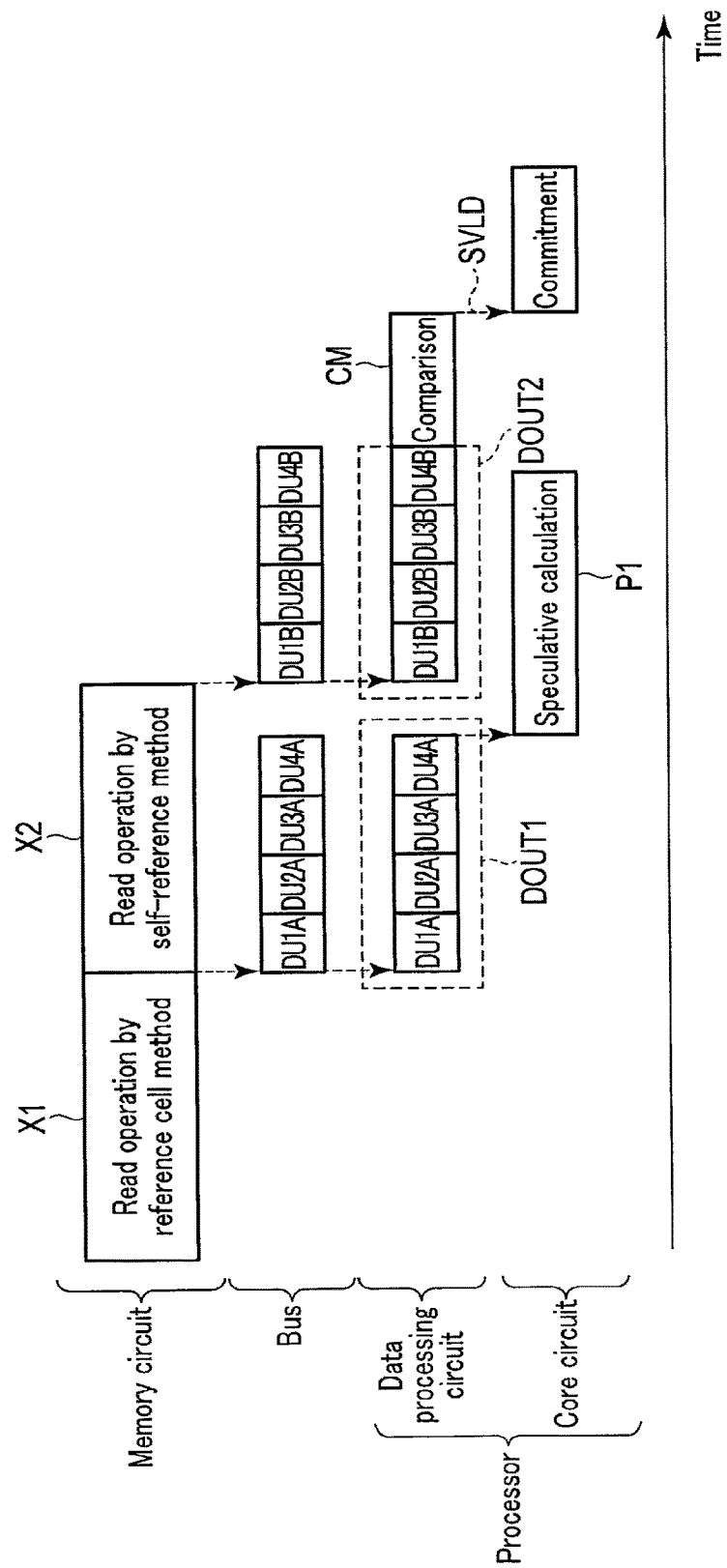
F I G. 30

COMPUTER SYSTEM AND MEMORY DEVICE

CROSS-REFERENCE TO RELATED APPLICATIONS

This application is based upon and claims the benefit of priority from Japanese Patent Application No. 2017-054585, filed Mar. 21, 2017, the entire contents of which are incorporated herein by reference.

FIELD

Embodiments described herein relate generally to a computer system and a memory device.

BACKGROUND

In recent years, the development of a computer system using a resistance change type memory such as MRAM is being promoted.

BRIEF DESCRIPTION OF THE DRAWINGS

FIGS. 1, 2, 3, 4 and 5 are diagrams for explaining a basic example of a computer system of an embodiment;

FIGS. 6, 7, 8, 9, 10, 11, 12, 13, 14, 15, 16, and 17 are diagrams for explaining an operation example of a computer system of a first embodiment;

FIGS. 18 and 19 are diagrams for explaining a configuration example of a computer system of a second embodiment;

FIGS. 20, 21, and 22 are diagrams for explaining an operation example of a computer system of a third embodiment;

FIGS. 23, 24, and 25 are diagrams for explaining an operation example of a computer system of a fourth embodiment;

FIGS. 26 and 27 are diagrams for explaining a configuration example of a computer system of a fifth embodiment; and FIGS. 28, 29, 30, and 31 are diagrams for explaining an operation example of a computer system of a sixth embodiment.

DETAILED DESCRIPTION

Figure 3:
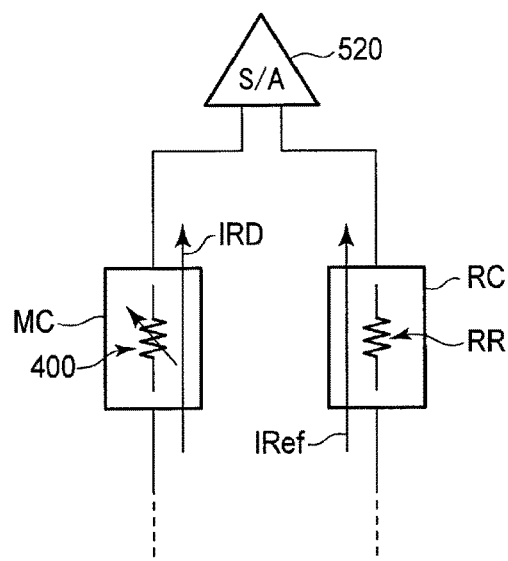

In general, according to one embodiment, a computer system includes: a memory device including a memory cell array, the memory device configured to execute first read operation of a first read method and second read operation of a second read method on the memory cell array; and a processor configured to receive a first data from the memory device, the first data read from a selected region in the memory cell array by the first read operation, configured to execute first calculation processing using the first data during the second read operation to the selected region, and configured to acquire a result of the first calculation processing by a first signal based on a comparison result of the first data and a second data, the first signal indicating that the first data is valid, and the second data read from the selected region by the second read operation.

[Embodiment]

A computer system of each embodiment and a memory device of each embodiment will be described with reference to FIGS. 1 to 31.

In the following explanation, the same reference numerals denote constituent elements having the same functions and configurations. In the following embodiments, when constituents (such as word lines WL, bit lines BL, and various voltages and signals) having numerals/letters added at ends of reference numerals for differentiation are not distinguished from each other, an expression in which the last number/letter is omitted is used.

[A] Basic Mode

A basic mode of a computer system of an embodiment will be described with reference to FIGS. 1 to 5.

(A1) Configuration

FIG. 1 is a schematic diagram for explaining a configuration example of the computer system of this embodiment.

As shown in FIG. 1, the computer system of this embodiment includes a memory device 1 and a processor 9.

The processor 9 executes calculation processing.

The processor 9 causes the memory device 1 to execute various instructions (requests).

For example, the processor 9 instructs the memory device 1 to write data.

When executing the calculation processing, the processor 9 instructs the memory device 1 to read data from a desired address (selected address) in the memory device 1. The processor 9 uses the read data in the calculation processing.

The memory device 1 includes a memory area for holding data. The memory area includes a memory cell array. A plurality of memory cells MC are provided in the memory cell array.

The memory device 1 executes various operations, such as data writing and data reading, based on an instruction from the processor 9.

The memory device 1 reads data based on an instruction from the processor 9.

The memory device 1 reads data with respect to a selected address by using first read operation and second read operation when reading data in a selected address in a memory cell array 100. A data reading method used in the first read operation is different from a data reading method used in the second read operation. The memory device 1 successively executes two read operations for a selected address based on a command.

The memory device 1 of this embodiment is, for example, a resistance change type memory. In a resistance change type memory, a variable resistance element is used for a memory element in a memory cell.

A resistance state of the variable resistance element changes as a voltage or current of a certain magnitude is supplied to the variable resistance element. Consequently, the variable resistance element is turned to have a plurality of resistance states (resistance values). One or more bits of data are associated with a plurality of resistance states that the variable resistance element is turned to have. In this way, the variable resistance element is used as a memory element.

Whether the resistance state of the variable resistance element is changed by supply of a voltage or changed by supply of a current depends on the type of the variable resistance element.

In this embodiment, the resistance change type memory is, for example, MRAM (Magnetoresistive random access memory). In the MRAM1, a magnetoresistive effect element is used for a memory element.

<Basic Operation of Memory Element>

The principle of operation of a magnetoresistive effect element as a memory element will be described with reference to FIG. 2.

As shown in FIG. 2, a magnetoresistive effect element 400 includes at least two magnetic layers 401 and 402 and a nonmagnetic layer 403.

Each of the two magnetic layers 401 and 402 has magnetization. The direction of magnetization of the magnetic layer 401 is variable. The direction of magnetization of the magnetic layer 402 is invariable (fixed state).

In this embodiment, the magnetic layer 401, which has a variable direction of magnetization, is referred to as a storage layer 401, and the magnetic layer 402, which has an invariable direction of magnetization, referred to as a reference layer 402.

The nonmagnetic layer 403 is provided between the two magnetic layers 401 and 402. The nonmagnetic layer 403 functions as a tunnel barrier layer 403. For example, the tunnel barrier layer 403 is an insulating layer including magnesium oxide.

For example, a magnetic tunnel junction is formed by the two magnetic layers 401 and 402 and the tunnel barrier layer 403. In this embodiment, the magnetoresistive effect element 400 having a magnetic tunnel junction is referred to as an MTJ element 400.

For example, the magnetic layers 401 and 402 have perpendicular magnetic anisotropy. The directions of magnetization (easy magnetization axis directions) of the magnetic layers 401 and 402 are substantially perpendicular to layer surfaces of the magnetic layers. The magnetization directions of the magnetic layers 401 and 402 are substantially parallel to the stacking direction of the layers 401, 402, and 403. The perpendicular magnetic anisotropy of the magnetic layers 401 and 402 is generated by utilizing interface magnetic anisotropy of the magnetic layer and the like. An MTJ element utilizing the perpendicular magnetic anisotropy of the magnetic layer is referred to as a perpendicular magnetization type MTJ element.

A resistance state of the MTJ element (magnetoresistive effect element) 400 changes according to a relative relationship (magnetization alignment) between the magnetization direction of the storage layer 401 and the magnetization direction of the reference layer 402.

When the magnetization direction of the storage layer 401 is the same as the magnetization direction of the reference layer 402, the MTJ element 400 has a first resistance state (first magnetization alignment state).

When the magnetization direction of the storage layer 401 is opposite to the magnetization direction of the reference layer 402, the MTJ element 400 has a second resistance state (second magnetization alignment state). The resistance value of the MTJ element 400 having the second resistance state is higher than the resistance value of the MTJ element 400 having the first resistance state.

In this way, the MTJ element 400 is turned to have one of a low resistance state and a high resistance state according to the magnetization alignment of the two magnetic layers 401 and 402.

For example, the MTJ element 400 holds 1 bit of data ("0" data and "1" data). In this case, the resistance state of the MTJ element 400 is set to the first resistance state, whereby the memory cell MC is set to a first data holding state (for example, "0" data holding state). The resistance state of the MTJ element 400 is set to the second resistance state, whereby the memory cell MC is set to a second data holding state (for example, "1" data holding state).

In this embodiment, a magnetization alignment state in which the magnetization direction of the storage layer 401 and the magnetization direction of the reference layer 402 in the MTJ element 400 are the same is referred to as a parallel state (or P state).

A magnetization alignment state in which the magnetization direction of the storage layer 401 and the magnetization direction of the reference layer 402 in the MTJ element 400 are opposite to each other is also referred to as an antiparallel state (or AP state).

For example, in writing data to the MTJ element 400, a spin transfer torque method is used. The spin transfer torque method is a writing method in which the magnetization direction of the storage layer 401 is controlled by a spin torque generated when write currents IWR1 and IWR2 flow into the MTJ element 400.

When the magnetization alignment state of the MTJ element 400 is changed from the AP state to the P state, the write current IWR1 flowing from the storage layer 401 to the reference layer 402 is supplied to the MTJ element 400.

In this case, a spin torque of electrons having a spin in the same direction as the magnetization direction of the reference layer 402 is applied to the magnetization of the storage layer 401.

When the magnetization direction of the storage layer 401 is opposite to the magnetization direction of the reference layer 402, the magnetization direction of the storage layer 401 is set to be the same as the magnetization direction of the reference layer 402 by the applied spin torque.

As a result, the MTJ element 400 is set to the P state. In this way, the "0" data is written to the memory cell MC.

When the write current IWR1 is supplied to the MTJ element 400 in the P state, the magnetization direction of the storage layer 401 does not change. Thus, the MTJ element 400 maintains the P state.

When the magnetization alignment state of the MTJ element 400 is changed from the P state to the AP state, the write current IWR2 flowing from the reference layer 402 to the storage layer 401 is supplied to the MTJ element 400.

In this case, a spin torque of electrons having a spin in the opposite direction to the magnetization direction of the reference layer 402 is applied to the magnetization of the storage layer 401.

When the magnetization direction of the storage layer 401 is the same as the magnetization direction of the reference layer 402, the magnetization direction of the storage layer 401 is set to be opposite to the magnetization direction of the reference layer 402 by the applied spin torque.

As a result, the MTJ element 400 is set to the AP state. In this way, the "1" data is written to the memory cell MC.

When the write current IWR2 is supplied to the MTJ element 400 in the AP state, even if a spin torque is applied to the magnetization of the storage layer 401, the magnetization direction of the storage layer 401 does not change. Thus, the MTJ element 400 maintains the AP state.

At the time of reading data from the MTJ element 400 (discriminating the resistance state of the MTJ element 400), a read current IRD flows through the MTJ element 400. A current value of the read current IRD is smaller than a magnetization switching threshold value of the storage layer 401.

Reading of data is executed based on the current value of the read current IRD, a variation of a potential of a certain node due to the read current IRD, or a sense result such as a charge accumulation amount caused by the read current IRD.

For example, the current value of the read current IRD output from the MTJ element 400 in the high resistance state (AP state) is smaller than the current value of the read current IRD output from the MTJ element 400 in the low resistance state (P state).

The data held by the MTJ element 400 is discriminated based on a fluctuation of the current IRD according to a difference in the resistance state of the MTJ element 400 as described above.

As described above, in the computer system of this embodiment, two different reading methods are used at the time of reading data from the memory device (MRAM).

For example, a period (execution period) for read operation by the first read method is shorter than a period for read operation by the second read method. The speed of the read operation by the first read method is higher than the speed of the read operation by the second read method.

For example, the reliability of data obtained by the read operation by the second read method is higher than the reliability of data obtained by the read operation by the first read method.

In this embodiment, in order to read data from a selected address, read operation by a reference cell method and read operation by a self-reference method are executed.

FIG. 3 is a schematic diagram for explaining a basic principle of the read operation by the reference cell method of the MRAM in the computer system of this embodiment.

As shown in FIG. 3, a reference cell RC is used in the read operation by the reference cell method of the MRAM.

The reference cell RC includes a reference resistance element RR. The reference resistance element RR may be an MTJ element or a fixed resistance element using metal or a semiconductor.

The resistance value of the reference resistance element RR has a resistance value between the resistance value (R1) of the MTJ element 400 in the low resistance state and the resistance value (R2) of the MTJ element 400 in the high resistance state.

The memory cell MC including the MTJ element 400 is connected to one input terminal of a sense amplifier circuit 520. The reference cell RC is connected to the other input terminal of the sense amplifier circuit 520.

At the time of data reading, the read current (cell current) IRD flows through the MTJ element 400 in a memory cell to be read (such a memory cell is hereinafter referred to as a selected cell).

A current (hereinafter referred to as a reference current) IRef flows through the reference resistance element RR.

The sense amplifier circuit 520 senses a value (electric quantity) based on the reference current IRef at a certain time and a value based on the read current IRD.

The sense amplifier circuit 520 compares a value based on the sensed reference current IRef with a value based on the read current IRD. Based on the comparison result, data held in the memory cell MC is read.

At a certain time, a current value of the reference current IRef is lower than the current value of the read current IRD of the MTJ element 400 in the P state and higher than the current value of the read current IRD of the MTJ element 400 in the AP state. In this way, the reference current IRef is a reference value for discriminating between the current value of the read current IRD of the MTJ element 400 in the P state and the current value of the read current IRD of the MTJ element 400 in the AP state.

Thus, the resistance state of the MTJ element 400 can be discriminated by comparing the reference current IRef and the read current IRD.

Consequently, the data held in the memory cell MC is discriminated.

As described above, the read operation by the reference cell method in the MRAM1 is executed.

Thus, in the read operation by the reference cell method, data can be read at a relatively high speed (in a short time).

Figure 4:
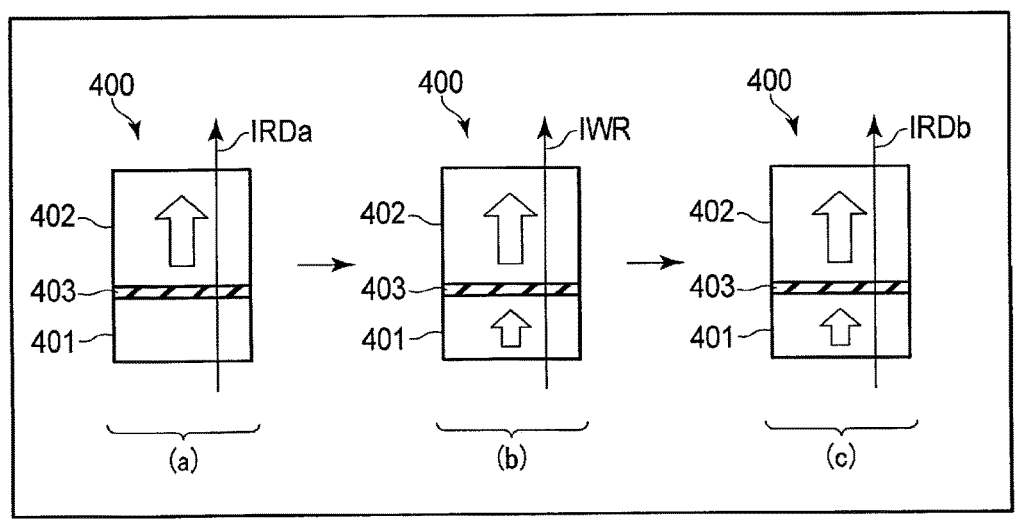

FIG. 4 is a schematic diagram for explaining a basic principle of the read operation by the self-reference method of the MRAM in the computer system of this embodiment.

In FIG. 4, as the read operation by the self-reference method, read operation by data destructive self-reference method is exemplified.

In the read operation by the self-reference method, the reference cell RC is not used.

As shown in FIG. 4, two data reading (two read current supply operations) are executed to the selected cell MC in the read operation by the self-reference method. In this embodiment, in order to distinguish the explanation, two data reading for discriminating data in the self-reference method may also be referred to as internal reading.

In the read operation by the self-reference method, the amount of electricity due to a read current IRDa in the first data reading to the selected cell MC is compared with the amount of electricity due to a read current IRDb in the second data reading to the selected cell MC by a sense amplifier circuit (not shown).

For example, in the read operation by data destructive self-reference method, a write current IWR is supplied to the MTJ element 400 between the first data reading and the second data reading.

The write current IWR supplied at the time of the read operation by the self-reference method is a current for writing preset data to the MTJ element 400. Here, the preset data is data serving as a reference for determining the data (data before the supply of the write current IWR) stored in the MTJ element. In this embodiment, in order to distinguish the explanation, supply of a write current between the first data reading and the second data reading in the read operation by the self-reference method is also referred to as reference data writing.

For example, after the first data reading, a write current for writing the "0" data is supplied to the MTJ element 400 to be read.

When the magnetization alignment state of the MTJ element 400 is the AP state, the magnetization alignment state of the MTJ element 400 changes from the AP state to the P state due to the supply of the write current IWR.

When the magnetization alignment state of the MTJ element 400 is the P state, even if the write current IWR is supplied, the MTJ element 400 maintains the P state.

As described above, the MTJ element 400 is set to the P state at the time of the second read current supply operation ((c) of FIG. 4). At the time of the first read current supply operation (in (a) of FIG. 4), the MTJ element 400 is set to the AP state or the P state according to data to be stored.

For example, the read currents IRDa and IRDb flow in the same direction as the write current IWR flowing in a direction in which the magnetization alignment state of the MTJ element changes from the AP state to the P state. However, current values of the read currents IRDa and IRDb are smaller than a current value of the write current IWR.

When the magnetization alignment state of the MTJ element 400 changes due to the supply of the write current IWR, magnitude of the first read current is different from a magnitude of the second read current.

As described above, when the magnetization alignment state of the MTJ element 400 changes from the AP state to the P state, a magnitude of the second read current IRDb is larger than a magnitude of the first read current.

As a result, it is discriminated that data held in the selected cell MC is the "1" data.

When the magnetization alignment state of the MTJ element 400 does not change, the magnitude of the second read current IRDb is substantially the same as the magnitude of the first read current IRDa. In this case, a difference between the second read current IRDb and the first read current IRDa is very small.

As a result, it is discriminated that the data held in the selected cell MC is the "0" data.

The "1" data may be set as reference data in the self-reference read operation. In this case, a write current for writing the "1" data is supplied to the MTJ element 400 to be read.

In this way, the read operation by the self-reference method is executed by comparing two outputs from a selected cell itself.

The reliability of data read by the read operation by the self-reference method is higher than the reliability of data read by the read operation by the reference cell method. However, a period of the read operation by the self-reference method is longer than a period of the read operation by the reference cell method.

Hereinafter, the data read by the self-reference method is also referred to as correction data or replacement data.

When reading data from the memory device 1, the computer system of this embodiment successively executes two different read methods to read data.

As described below, the computer system of this embodiment executes calculation processing of a processor by using data read from the memory device by two different read methods.

(A2) Operation

An example of basic operation of the computer system of this embodiment will be described with reference to FIG. 5.

Figure 5:
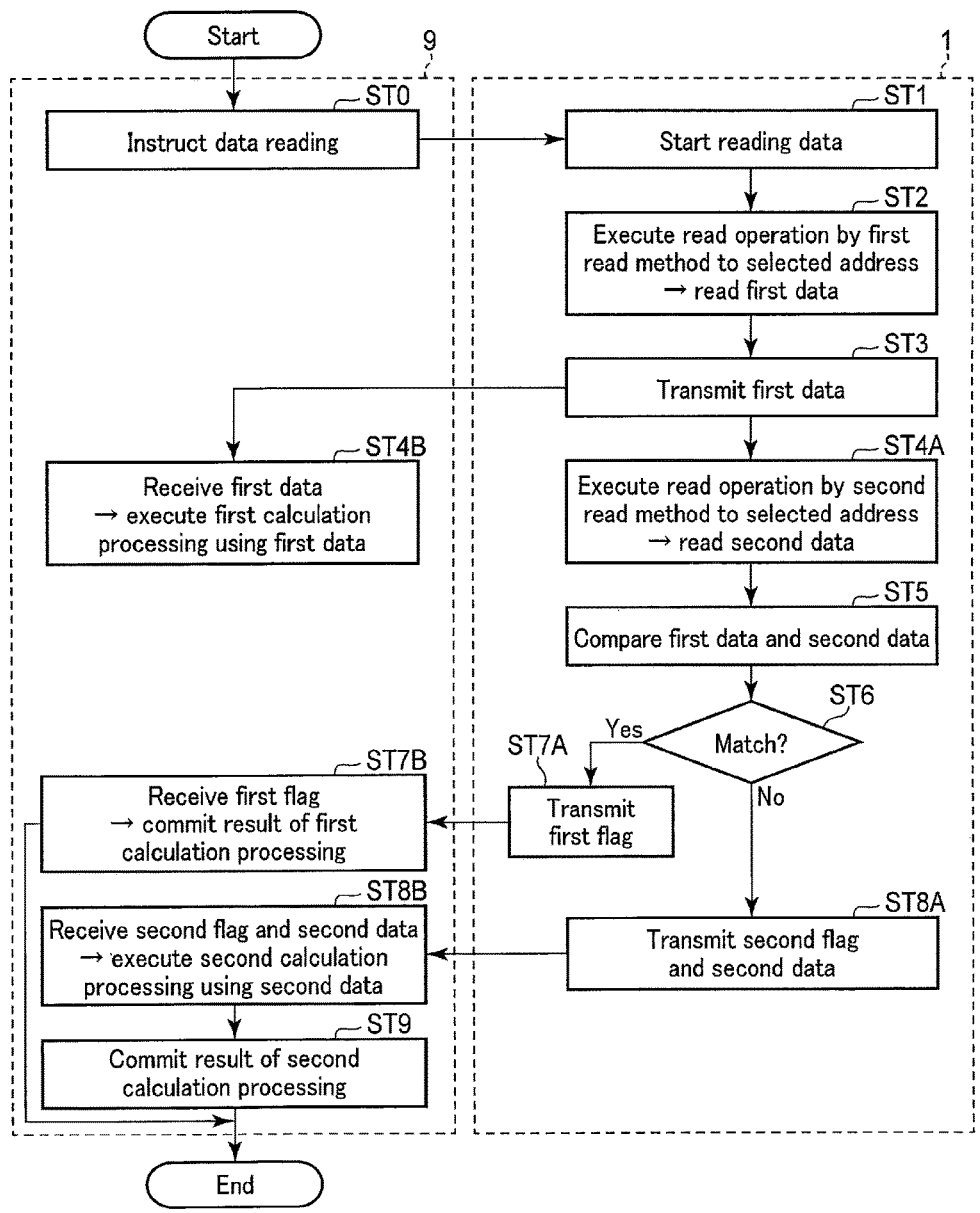

FIG. 5 is a flowchart for explaining the basic operation of the computer system of this embodiment.

As shown in FIG. 5, when the computer system executes calculation processing, the processor 9 instructs the memory device to read data used for the calculation processing (step ST0).

The processor 9 transmits to the MRAM1 a read command, an address (selected address) indicating a storage location of data to be read, and various control signals.

The MRAM1 receives the read command, the selected address, and the control signal.

Based on the read command and the control signal, the MRAM1 starts reading data with respect to the selected address (step ST1).

When executing data reading, the MRAM1 reads data from the selected address by the read operation by the reference cell method (step ST2). Consequently, the MRAM1 obtains data (first data) based on the reference cell method.

The MRAM1 transmits the data based on the reference cell method to the processor 9 (step ST3).

After the read operation by the reference cell method, the MRAM1 reads data from the selected address by the read operation by the self-reference method (step ST4A). In this embodiment, the read operation by the self-reference method may be executed concurrently with transmission of the data based on the reference cell method from the MRAM1 to the processor 9. In this embodiment, the read operation by the self-reference method may overlap with a part of the period for transmission of the data based on the reference cell method. In this embodiment, the timing of starting the read operation by the self-reference method may be before the timing of starting the transmission of the data based on the reference cell method.

The processor 9 receives the first data from the MRAM1. In parallel with the read operation by the self-reference method in the MRAM1, the processor 9 executes calculation processing using the data based on the reference cell method (step ST4B).

In this embodiment, calculation processing executed using data of the result of the read operation by the reference cell method in parallel with the read operation by the self-reference method is referred to as speculative calculation processing. For example, the speculative calculation processing starts before termination of the read operation by the self-reference method or before starting comparison of the data based on the reference cell method and the data based on the self-reference method.

The period of the speculative calculation processing may not be completely parallel with the period of the read operation by the self-reference method. A portion of the period of the speculative calculation processing may be parallel with the period of the read operation by the self-reference method.

After reading data based on the reference cell method, the MRAM1 obtains data (second data) based on the self-reference method.

The MRAM1 executes comparison processing between the data based on the reference cell method and the data based on the self-reference method (step ST5). For example, the data comparison processing is performed concurrently with the speculative calculation processing.

Based on the data comparison processing, the MRAM1 determines whether or not the data based on the reference cell method matches the data based on the self-reference method (step ST6).

The MRAM1 transmits a flag based on the result of the comparison processing between the two pieces of data to the processor 9. According to the flag, the MRAM1 notifies the processor 9 whether the data by the reference cell method is valid or error. In this embodiment, the flag for notifying valid/error of the data by the reference cell method is also referred to as an error notification flag.

When the data based on the reference cell method matches the data based on the self-reference method, it is determined that the data based on the reference cell method is valid (normal or has no error).

In this case, the MRAM1 transmits a first flag, including a valid signal indicating that the data by the reference cell method is valid, to the processor 9 (step ST7A).

The processor 9 receives the flag. If the received flag includes the valid signal, the processor 9 commits the result (calculated value) of the speculative calculation processing (step ST7B). The meaning of commitment is to consider a calculated value, obtained by the calculation processing, as valid and write the value in the data holding area (for example, register).

Consequently, when the data by the reference cell method is valid, the processor 9 terminates the calculation processing by acquiring the result of the speculative calculation processing.

When the data based on the reference cell method does not match the data based on the self-reference method, the MRAM1 transmits, to the processor 9, a second flag including an error signal indicating that the data by the reference cell method is not valid (that the data by the reference cell method includes an error) (step ST8A).

The MRAM1 transmits, to the processor 9, the data based on the self-reference method as correction data together with a flag including an error signal (also referred to as an invalid signal). The data transferred together with the error signal need not be the entire data based on the self-reference method. For example, in the data based on the self-reference method, a data portion corresponding to a portion including an error in the data by the reference cell method may be transmitted together with the error signal.

The processor 9 receives the flag and the data. When the received flag includes an error signal, the processor 9 executes calculation processing (hereinafter referred to as recalculation processing) using the data based on the self-reference method (step ST8B). For example, the processor 9 discards the result of the speculative calculation processing.

When the result of the recalculation processing is obtained, the processor 9 commits the result of the recalculation processing (step ST9).

In this way, when the data by the reference cell method is error, the processor 9 terminates the calculation processing by acquiring the result of the calculation processing using data by the self-reference method.

As described above, the operation of the computer system of this embodiment is completed.

(A3) Summary

In the computer system of this embodiment, the memory device successively executes the first read operation with a relatively high speed and the second read operation with a relatively high reliability.

The memory device transmits the first data read by the first read operation to the processor.

In parallel with execution of the second read operation in the memory device, the processor executes the calculation processing (speculative calculation processing) using the first data.

The memory device reads the second data by the second read operation.

The memory device compares the first data with the second data to determine whether or not the first data is valid.

When it is determined that the first data is valid based on the comparison result, it is determined that the result of the calculation processing using the first data is valid.

When it is determined that the first data is not valid based on the comparison result, the processor executes the second calculation processing using the second data.

In this way, the computer system of the embodiment can speed up the operation (calculation processing) of the system by the first read operation and the calculation processing using the data based on the first read operation.

The computer system of this embodiment can secure the reliability of data and calculation results based on the second data based on the second read operation and the calculation result using the second data.

Accordingly, in the computer system of this embodiment, the speed of operation can be increased, and the reliability of operation can be improved.

[B] First Embodiment

A computer system and its control method (operation example) of the first embodiment will be described with reference to FIGS. 6 to 17.

(B1) Configuration Example

A configuration example of the computer system of the first embodiment will be described with reference to FIGS. 6 to 14.

<Configuration of Computer System>

Figure 6:
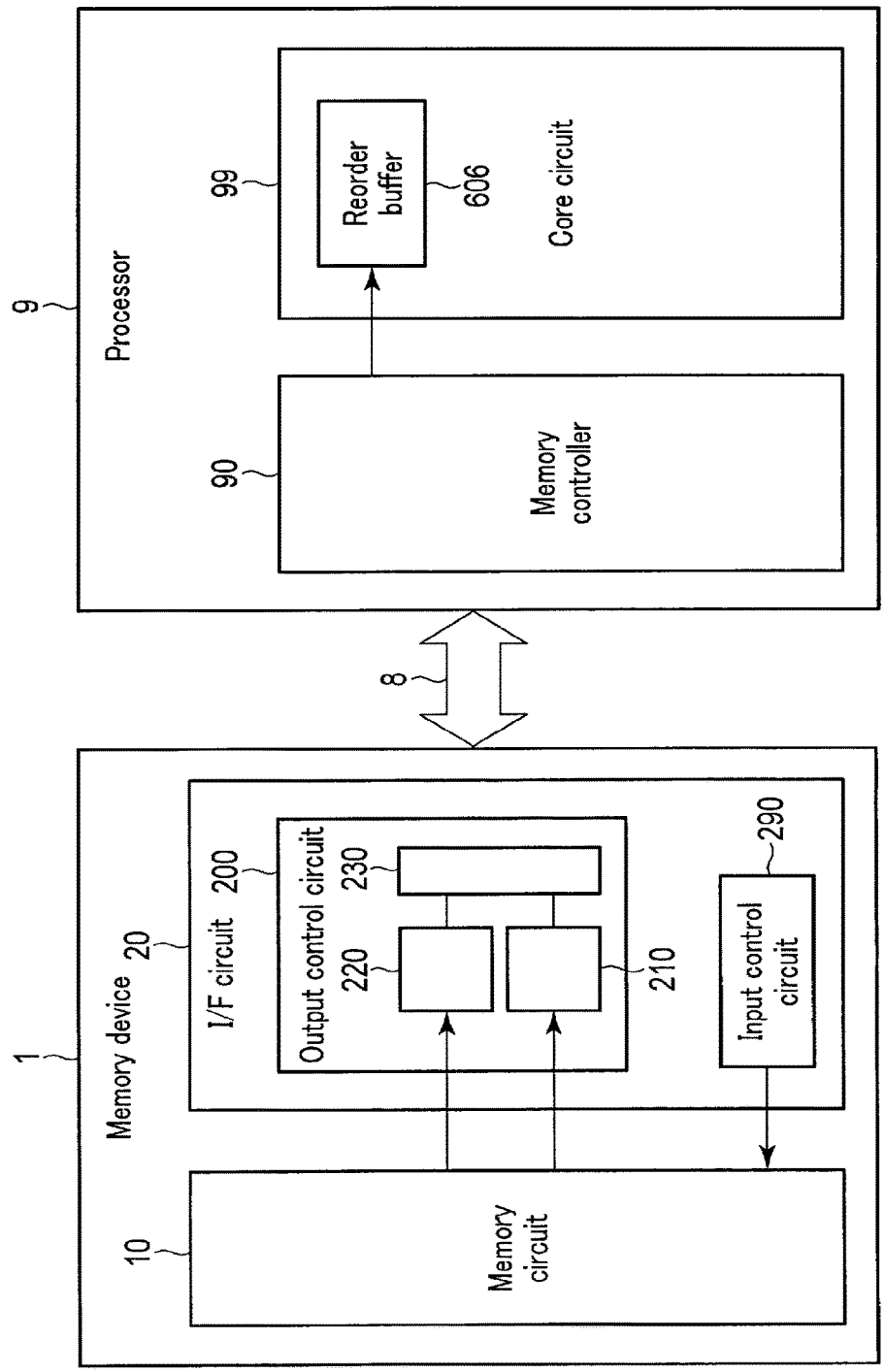

FIG. 6 is a block diagram showing the configuration example of the computer system of this embodiment.

As shown in FIG. 6, a computer system 1000 includes a memory device 1 and a processor 9. The memory device 1 is connected to the processor 9 via a bus 8. The bus 8 is a data transfer network based on a certain standard. For example, the bus 8 includes at least one of a cable, a connector, wireless communication, an Internet, an intranet, and the like.

The memory device 1 includes a memory circuit 10 and an interface circuit 20.

The memory circuit 10 includes a memory cell array for storing data, a write circuit, a read circuit, and the like.

The interface circuit 20 includes an output control circuit 200 and an input control circuit 290.

The output control circuit 200 can control output of data.

For example, the output control circuit 200 includes two data holding circuits 210 and 220 and a control circuit 230.

The data holding circuits 210 and 220 respectively hold two pieces of data read by two different read methods. The control circuit 230 performs various controls on the data in the data holding circuits 210 and 220.

The output control circuit 200 can compare data (value of data) read by the reference cell method with data (value of data) read by the self-reference method.

The input control circuit 290 can control input of data, addresses, commands, and various control signals from the processor 9 to the memory circuit 10.

The processor 9 includes a memory controller 90, a core circuit 99, and the like.

The memory controller 90 controls input and output of data and various signals between the memory device 1 and the processor 9.

The core circuit 99 executes various calculation processing.

The core circuit 99 includes a calculation circuit (operation unit), a data holding circuit, and the like. For example, the core circuit 99 includes a reorder buffer 606 for controlling speculative calculation processing.

Hereinafter, internal configurations of the memory device 1 and the processor 9 will be described more specifically.

<Configuration of Memory Device>

An internal configuration of the memory circuit in the memory device of the computer system of this embodiment will be described with reference to FIGS. 7 to 11.

The memory circuit 10 receives a command CMD, an address ADR, input data DIN, and various control signals CNT from the processor 9 via an input control circuit 299.

The memory circuit 10 sends output data DOUT to the output control circuit 200.

In the MRAM1, the memory circuit 10 includes at least a memory cell array 100, a row decoder 120, a word line driver (row line control circuit) 121, a column decoder 122, a bit line driver (column line control circuit) 123, a switch circuit 124, a write circuit (write control circuit) 125, a read circuit (read control circuit) 126, and a sequencer 190.

The memory cell array 100 includes a plurality of memory cells MC.

The row decoder 120 decodes a row address included in the address ADR.

The word line driver 121 selects a row (for example, a word line) of the memory cell array 100 based on the decoding result of the row address.

The column decoder 122 decodes a column address included in the address ADR.

The bit line driver 123 selects a column (for example, a bit line) of the memory cell array 100 based on the decoding result of the column address. The bit line driver 123 is connected to the memory cell array 100 via the switch circuit 124.

The switch circuit 124 connects one of the write circuit 125 and the read circuit 126 to the memory cell array 100 and the bit line driver 123. Consequently, the MRAM1 executes operation corresponding to a command.

During the write operation, the write circuit 125 supplies various voltages and currents for data writing to selected cells based on the address ADR. The data DIN is supplied to the write circuit 125 as data to be written to the memory cell array 100. Consequently, the write circuit 125 writes the data DIN into the memory cell MC. The write circuit 125 includes a write driver/sinker, for example.

During the read operation, the read circuit 126 supplies various voltages or currents for data reading to the memory cell (selected cell) selected based on the address ADR. Consequently, the data stored in the memory cell MC is read.

The read circuit 126 supplies the data, read from the memory cell array 100 and serving as the output data DOUT, to the data holding circuits 210 and 220 in the output control circuit 200.

The read circuit 126 includes, for example, a read driver and a sense amplifier circuit.

In the MRAM of this embodiment, the read circuit 126 includes a function (circuit portion) for executing the read operation by the reference cell method and a function for executing the read operation by the self-reference method.

The sequencer 190 receives the command CMD and the various control signals CNT. The sequencer 190 controls the operation of each of the circuits 120 to 126 in the memory circuit 10 based on the command CMD and the control signal CNT. The sequencer 190 can transmit the control signal CNT to a memory controller 5 via the interface circuit 20 according to the operation state in the memory circuit 10.

For example, the sequencer 190 holds various kinds of information regarding write operation and read operation as setting information.

FIG. 8 is an equivalent circuit diagram showing an example of an internal configuration of the memory cell array of the MRAM.

As shown in FIG. 8, a plurality (n) of word lines WL (WL <0>, WL <1>, . . . , WL <n-1>) are provided in the memory cell array 100. A plurality (m) of bit lines BL (BL <0>, BL <1>, . . . , BL <m-1>) and a plurality (m) of bit lines bBL (bBL <0>, bBL <1>, . . . , bBL <m-1>) are provided in the memory cell array 100. The bit line BL and the bit line bBL form a pair of bit lines. In the following description, the bit line bBL may be referred to as a source line in order to clarify the explanation.

The memory cells MC are arranged in a matrix form in the memory cell array 100.

The memory cells MC aligned in the x direction (row direction) are connected to a common word line WL. The word line WL is connected to the word line driver 121. The word line driver 121 controls the potential of the word line WL based on the row address. Consequently, the word line WL (row) indicated by the row address is selected and activated.

The memory cells MC aligned in the y direction (column direction) are commonly connected to the two bit lines BL and bBL belonging to a bit line pair.

For example, the memory cell MC includes a variable resistance element (MTJ element) 400 and a cell transistor 410. The cell transistor 410 functions as a selection element of the memory cell MC. The memory cell MC may include two or more MTJ elements 400 or two or more cell transistors 410.

One end of the MTJ element 400 is connected to the bit line bBL. The other end of the MTJ element 400 is connected to one end (one of the source/drain) of the cell transistor 410. The other end (the other of the source/drain) of the cell transistor 410 is connected to the bit line BL. The word line WL is connected to the gate of the cell transistor 410.

The memory cell array 100 may have a structure of a hierarchical bit line system. In this case, two global bit lines are provided in the memory cell array 100. Each of the bit lines BL is connected to one of the global bit lines via a corresponding switch element.

Each of the source lines bBL is connected to the other global bit line via a corresponding switch element. The global bit line is connected to the write circuit 125 and the read circuit 126 via the switch circuit 124.

FIGS. 9 and 10 are equivalent circuit diagrams showing a configuration example of the read circuit in the MRAM of this embodiment.

FIG. 9 is a schematic diagram for explaining an example of a configuration of the read circuit for the memory cell array.

For example, the read circuit 126 includes a plurality of sense amplifier units 261.

In the memory cell array 100, a plurality of read units RU are set.

One of the sense amplifier units 261 is provided for the read unit RU. One of the sense amplifier units 261 is connected to the corresponding read unit RU via the switch circuit 124.

For example, at the time of data read operation, the sense amplifier units 261 are driven in parallel. The read operation is executed in parallel with respect to the memory cell MC to be read of each of the read units RU.

Consequently, the read circuit 126 can read data of a certain data size (two or more bits of data) for a read command.

The sense amplifier units 261 may be driven one by one. The sense amplifier units 261 are sequentially driven, whereby data of a certain data size may be read from the memory cell array 100.

The sense amplifier unit 261 may be provided in the memory cell array 100. In this case, the sense amplifier unit 261 reads 1 bit of data from the memory cell array 100. Alternatively, the sense amplifier unit 261 sequentially accesses a plurality of selected cells, whereby data of a certain data size is read.

FIG. 10 is an equivalent circuit diagram showing an example of an internal configuration of the sense amplifier unit of the MRAM of this embodiment.

In FIG. 10, a connection relation of each circuit at the time of the read operation in the MRAM is shown. In FIG. 10, a sense amplifier unit and each circuit corresponding to the read unit are extracted.

As shown in FIG. 10, a read driver 500 is connected to the bit line BL via a column selection switch element CSW. At the time of the read operation, when the column selection switch element CSW is turned on, the read driver 500 supplies current (or voltage) to the bit line BL.

Turning on/off of the column selection switch element CSW is controlled based on a decoded column address.

For example, the read driver 500 is a constituent of the bit line driver 123. However, the read driver 500 may be a constituent of the read circuit 126. For example, the column selection switch element CSW is a constituent in the switch circuit 124. However, the column selection switch element CSW may be a constituent of the read circuit 126 or the bit line driver 123.

The bit lines (source lines) bBL are connected to the sense amplifier unit 261 via a multiplexer 241 in the switch circuit 124.

At the time of the read operation, the source line bBL is connected to the sense amplifier unit 261 via the multiplexer 241 based on the decoded column address. For example, the switch circuit 124 includes the multiplexers 241. The multiplexer 241 is provided so as to correspond to the read unit RU.

The sense amplifier unit 261 includes a sense amplifier circuit 520, a plurality of capacitors C1 and C2, a reference cell RC, a reference cell driver 590, and a plurality of switch elements SW1, SW2, SW3, SWA, and SWB.

The switch elements SW1, SW2, SW3, SWA, and SWB are, for example, MOS switches.

Each one end of the switch element SW1 and the switch element SW3 is connected to the multiplexer 241. The other end of the switch element SW1 is connected to one input terminals of the sense amplifier circuit 520 via the switch element SWA. The other end of the switch element SW3 is connected to the other input terminal of the sense amplifier circuit 520 via the switch element SWB.

One end of the capacitor C1 is connected to a connection node between the switch element SW1 and the switch element SWA. The other end of the capacitor C1 is grounded.

One end of the capacitor C2 is connected to a connection node between the switch element SW3 and the switch element SWB. The other end of the capacitor C2 is grounded.

The capacitors C1 and C2 may be capacitive elements connected to the input terminal of the sense amplifier circuit 520. The capacitor C1 maybe a capacitance component (parasitic capacitance) included in an interconnect (and element) connecting the input terminal of the sense amplifier circuit 520 and the memory cell array 100 (selected cell MC). The capacitor C2 may be a capacitance component (parasitic capacitance) included in an interconnect (and element) connecting the input terminal of the sense amplifier circuit 520 and the reference cell RC.

A control signal S1 is supplied to a control terminal (gate) of the switch element SW1. The switch element SW1 controls connection between the capacitor C1 and the multiplexer 241 based on the control signal S1. When the switch element SW1 is turned on, the capacitor C1 is connected to the selected cell MC via a multiplexer 510.

A control signal S3 is supplied to a control terminal of the switch element SW3. The switch element SW3 controls connection between the capacitor C2 and the multiplexer 510 based on the control signal S3. When the switch element SW3 is turned on, the capacitor C2 is connected to the selected cell MC via the multiplexer 510.

The sense amplifier unit 261 (read circuit 126) includes the reference cell RC in order to execute the read operation by the reference cell method.

One end of the reference cell RC is connected to the read driver 590. The other end of the reference cell RC is connected to the switch element SW2. The reference cell RC is connected to one end of the capacitor C2 via the switch element SW2. The reference cell RC is connected to the other input terminal of the sense amplifier circuit 520 via the switch elements SW2 and SWB.

The reference cell RC includes a plurality of variable resistance elements 490A and 490B and a cell transistor 499.

One end (one of the source/drain) of the cell transistor 499 is connected to an output terminal of the driver 590. The other end (the other of the source/drain) of the cell transistor 499 is connected to one ends of the variable resistance elements 490A and 490B. The other ends of the variable resistance elements 490A and 490B are connected to the capacitor C2 via the switch element SW2.

The two variable resistance elements 490A and 490B are connected in parallel. Thereby, a resistance value between the resistance value R1 of the MTJ element 400 in the low resistance state (P state) and the resistance value R2 of the MTJ element 400 in the high resistance state (AP state) is formed.

At the time of the read operation by the reference cell method, an ON voltage of the transistor 499 is applied to the gate of the cell transistor 499. Consequently, the reference cell RC is activated to generate a reference current IRef.

The switch element SW2 controls connection between the reference cell RC and the capacitor C2.

The control signal S2 is supplied to a control terminal of the switch element SW2. Turning on/off of the switch element SW2 is controlled based on the control signal S2.

The switch element SWA controls connection between the capacitor C1 and one input terminal of the sense amplifier circuit 520. The switch element SWB controls connection between the capacitor C2 and one input terminal of the sense amplifier circuit 520. For example, a common control signal SC is supplied to control terminals of the two switch elements SWA and SWB.

The sense amplifier circuit 520 is connected to the capacitors C1 and C2 via the switch elements SWA and SWB. A signal from the capacitor C1 is supplied to one input terminal of the sense amplifier circuit 520 via the switch element SWA. A signal from the capacitor C2 is supplied to the other input terminal of the sense amplifier circuit 520 via the switch element SWB.

A control signal (sense enable signal) SEN is supplied to the sense amplifier circuit 520. The sense amplifier circuit 520 is activated or deactivated at a timing based on a change in the signal level of the sense enable signal SEN.

The sense amplifier circuit 520 senses the signals from the capacitors C1 and C2 supplied to the input terminals and amplifies the sensed signals. The sense amplifier circuit 520 compares the two sensed signals. The sense amplifier circuit 520 outputs a value based on the comparison result as data DOUT.

The capacitors C1 and C2 hold a quantity of electricity for data reading at the time of the read operation.

In this embodiment, the sense amplifier unit 261 is a differential type sense amplifier of a charge integration system.

At the time of the read operation by the reference cell method, the capacitor C1 accumulates a signal charge generated by the read current from the selected cell MC. The capacitor C2 accumulates a signal charge generated by the reference current from the reference cell RC.

At the time of the read operation by the self-reference method, the capacitor C1 accumulates the signal charge generated by the read current from the selected cell MC in the first internal reading. The capacitor C2 accumulates the signal charge generated by the read current from the selected cell MC in the second internal reading.

At the time of each read operation, a signal corresponding to the signal charge (potential) in the two capacitors C1 and C2 is compared by the sense amplifier circuit 520, whereby the data in the selected cell MC is discriminated.

Consequently, the data in the selected cell MC is read.

The sense amplifier unit 261 may be connected to the bit line BL. In this case, the sense amplifier unit 261 holds a charge caused by discharge of the bit line BL.

<Output Control Circuit>

FIG. 11 shows a configuration example of an output control circuit of the MRAM according to this embodiment.

As shown in FIG. 11, the output control circuit 200 includes two read buffer circuits (data holding circuits) 210 and 220 and a control circuit 230.

The control circuit 230 includes a comparison circuit 231, a selection circuit 232, a data buffer circuit 233, an input/output circuit (I/O circuit) 234, and the like.

The read buffer circuits 210 and 220 are connected to the memory circuit 10. Read data from the memory circuit 10 is supplied to the read buffer circuits 210 and 220.

The read buffer circuit 210 temporarily holds data DOUT1 read by the reference cell method. The read buffer circuit 220 temporarily holds data DOUT2 read by the self-reference method.

The comparison circuit 231 compares values of the read data in the read buffer circuits 210 and 220.

The comparison circuit 231 controls the signal level of a signal ER (flag FLG) based on the comparison result of the two read data. The comparison circuit 231 supplies the signal ER to the selection circuit 232 and the data buffer circuit 233.

Based on the signal ER, the selection circuit 232 selects one of the data DOUT1 based on the reference cell method and the data DOUT2 based on the self-reference method. The selection circuit 232 outputs the selected data to the data buffer circuit 233.

The data buffer circuit 233 temporarily holds the data from the selection circuit 232.

The I/O circuit 234 controls the timing of outputting data to the processor 9.

Figure 12:
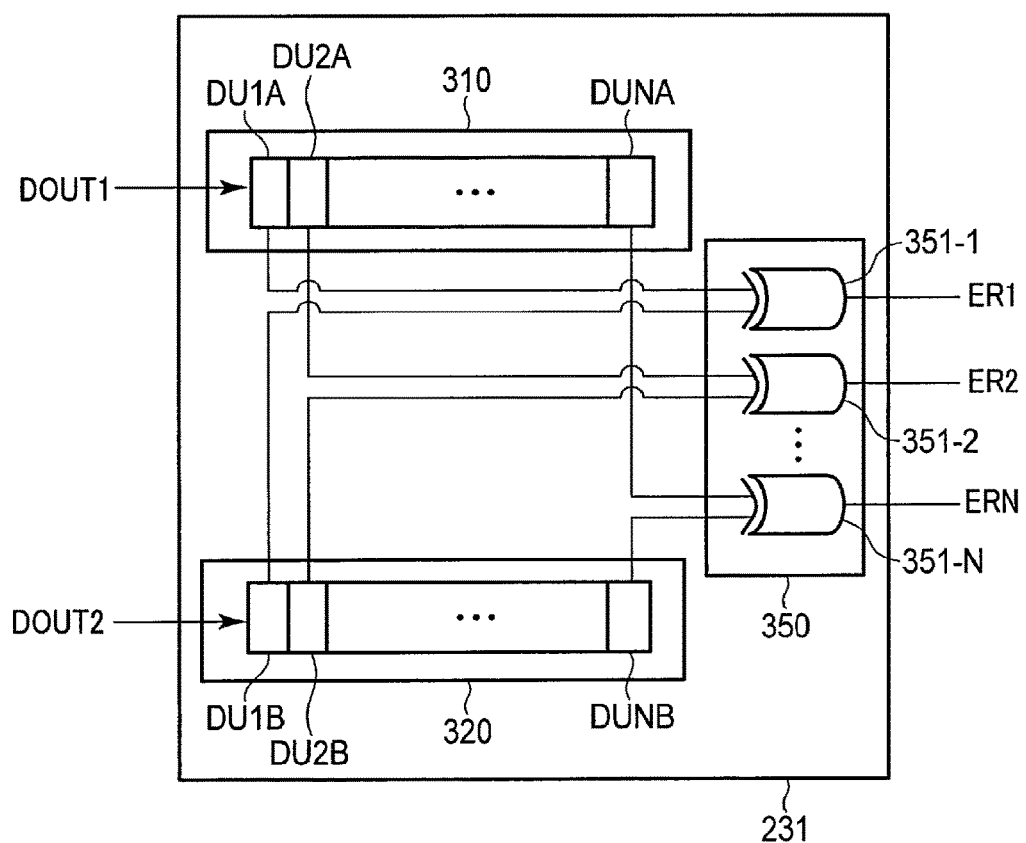

FIG. 12 is a diagram showing a configuration example of the comparison circuit in the output control circuit in the MRAM of this embodiment.

As shown in FIG. 12, the data DOUT1 read by the reference cell method and the data DOUT2 read by the self-reference method are supplied to the comparison circuit 231 from the read buffer circuits 210 and 220.

For example, the data DOUT1 and the data DOUT2 have a certain data length (data size or number of bits).

The comparison circuit 231 divides each of the data DOUT1 and DOUT2 into N data units. For example, the data DOUT1 includes N data units DU (DU1A, DU2A, . . . , DUNA), and the data DOUT2 includes N data units DU (DU1B, DU2B, . . . , DUNB).

For example, the comparison circuit 231 includes latch circuits 310 and 320. The latch circuits 310 and 320 temporarily hold the data unit DU.

The comparison circuit 231 includes a determination circuit 350. The determination circuit 350 determines whether or not the data units DU corresponding to each other in the two pieces of data DOUT1 and DOUT2 match.

The determination circuit 350 includes N XOR gates 351 (351-1, 351-1, . . . , 351-N), for example.

One input terminal of the XOR gate 351 is connected to the latch circuit 310, and the other input terminal of the XOR gate 351 is connected to the latch circuit 320. The corresponding data unit DU is supplied to the input terminal of each of the XOR gates 351.

The XOR gate 351 outputs the signal ER (ER1, ER2, . . . , ERN) indicating a result of XOR operation (exclusive OR) with respect to the two data units DU.

The XOR gate 351 outputs "0" when data values ("0" or "1") of the corresponding two data units DU1 and DU2 match. The XOR gate 351 outputs "1" when the data values of the corresponding data units DU1 and DU2 do not match.

Based on output results ER from the XOR gates 351, it is detected that an error exists in the data unit DU corresponding to the XOR gate 351 which has outputted "1".

In this way, the position of an error existing in the data DOUT1 is specified.

For example, the error notification flag FLG is a set of the signals ER. The signal ER is transmitted as the flag FLG to the processor 9.

When values of all of the signals ER1, ER2, . . . , and ERN are "0", the flag FLG indicates a valid signal.

If the value of at least one of the signals ER1, ER2, . . . , and ERN is "1", the flag FLG indicates an error signal XX. A position (data unit DU) including the error of the data DOUT1 is indicated in accordance with the position (digit) of "1" in the flag FLG including the error signal XX.

The signal ER is supplied, for example, as a control signal to the selection circuit 232 and the data buffer circuit 233.

The selection circuit 232 can select the data unit DU corresponding to the error data unit DU1 in the data DOUT1 among the data units DU in the data DOUT2, based on the position of "1" of the signal ER. The selection circuit 232 can output the selected data unit DU to the data buffer circuit 233.

For example, the data buffer circuit 233 can hold the signal ER as the flag FLG.

The data buffer circuit 233 transmits the flag FLG including the signal ER to the processor 9 via the I/O circuit 234.

The data buffer circuit 233 may selectively output the data unit DU, corresponding to the signal ER as "1", from the data units in the data DOUT2.

<Configuration Example of Processor>

An example of an internal configuration of the processor in the computer system of this embodiment will be described with reference to FIGS. 13 and 14.

Figure 13:
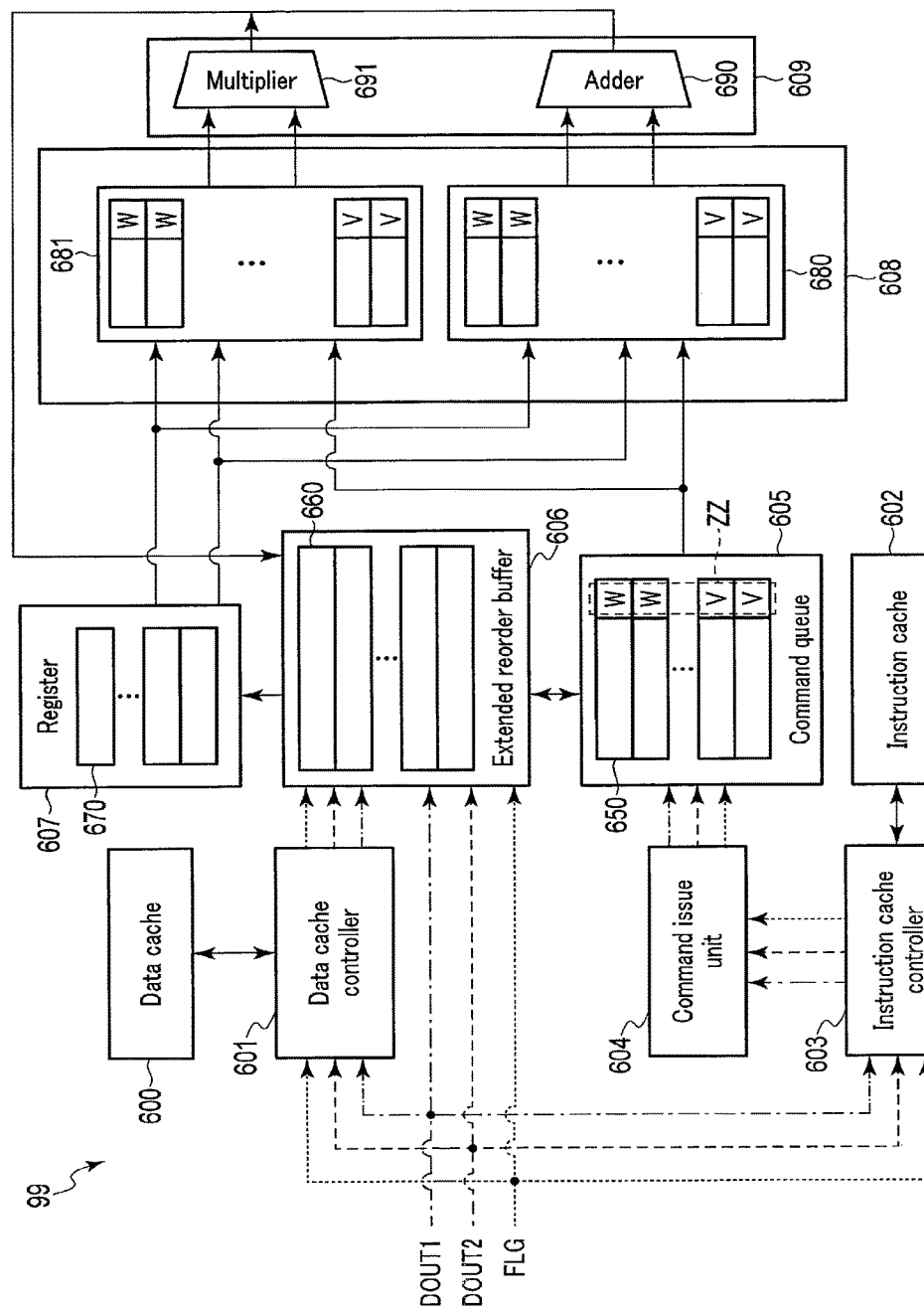

FIG. 13 is a block diagram showing an example of an internal configuration of the core circuit in the processor.

As shown in FIG. 13, the core circuit 99 includes a data cache 600, a data cache controller 601, an instruction cache 602, an instruction cache controller 603, a command issue unit 604, a command queue 605, an extended reorder buffer (reorder buffer circuit) 606, a register 607, a reservation station 608, and a calculation circuit 609.

The data cache 600 stores data read from the MRAM1 according to a request from the processor 9.

The data cache controller 601 controls and manages the data cache 600. For example, the data cache controller 601 controls access to the data cache 600. The data cache controller 601 determines whether or not the data based on the request from the processor 9 is stored in the data cache 600. The data cache controller 601 performs various types of access controls to the MRAM1 in a case where data is not stored in the cache 600.

The data cache controller 601 can transfer data from the MRAM1 to the extended reorder buffer 606.

The instruction cache 602 stores a program corresponding to an instruction.

The instruction cache controller 603 controls and manages the instruction cache 602.

For example, the instruction cache controller 603 controls access to the instruction cache 602. The instruction cache controller 603 can read a program from the instruction cache 602.

The command issue unit 604 can control the instruction cache controller 603 to supply instructions (or data) to the command queue 605.

The command queue (for example, FIFO) 605 has a plurality of data holding areas 650. The command queue 605 holds an instruction (or data) and a flag corresponding to the instruction in the data holding area 650. In the command queue 605, a flag (hereinafter also referred to as a state flag) ZZ indicating a state such as a valid state (indicated by "V") or a check waiting state (indicated by "W") is appended to an instruction or data.

The register 607 holds one or more operands (numerical values, data) for calculation processing. The register 607 has a plurality of data holding areas 670.

The calculation circuit 609 includes one or more operation units such as an adder 690 and a multiplier 691. Calculation processing corresponding to an instruction is executed by each of the operation units 690 and 691.

The reservation station 608 holds at least one of an instruction and data in which the calculation processing by the calculation circuit 690 is in a waiting state.

A storage area is provided in the reservation station 608 so as to correspond to each of the operation units 690 and 691. For example, at the reservation station 608, a first station 680A is provided for the adder 690, and a second station 680B is provided for the multiplier 691. The reservation station 608 has a plurality of data holding areas (instruction holding areas) 681 in each of the stations 680A and 680B.

The reservation station 608 can request the extended reorder buffer 606 to transfer the data in the buffer 606. For example, the data in the extended reorder buffer 606 is supplied to the reservation station 608 via the register 607.

The extended reorder buffer 606 has a plurality of data holding areas 660 capable of holding entries. The entry includes various pieces of information on the calculation processing to be executed on data.

The extended reorder buffer 606 can hold instructions from the command queue 605.

The extended reorder buffer 606 can transfer operands to the register 607.

The extended reorder buffer 606 can hold calculation results from the calculation circuit 609.

The extended reorder buffer 606 receives the data (data based on the reference cell method) DOUT1, the data (data based on the self-reference method) DOUT2, and the flag FLG from the MRAM1, the data cache controller 601, or the command queue 605.

The extended reorder buffer 606 and the reservation station 608 function as storage areas for controlling execution of speculative calculation processing.

The number of constituents in the core circuit 99, such as the number and type of the operation units in the calculation circuit 609 and the number of entries and the number of registers (data holding areas) of the reservation station 608, are designed appropriately according to the ability required for the processor 9.

An example of the extended reorder buffer of the processor in the computer system of this embodiment will be described with reference to FIG. 14.

As shown in FIG. 14, in the extended reorder buffer 606, with respect to calculation processing (entry) currently waiting for commitment, an entry number of each calculation processing, a busy flag indicating whether calculation processing is being executed, an instruction (Instruction), operands (Operand1, Operand2), a write destination address (Destination) in the register 607, a calculation result, and a state flag indicating whether commitment is possible are held.

In data holding fields 661, 662, 663, and 664 concerning items including the instruction, the operands, and the write destination address, a flag FX is set for data (value) and an instruction.

The flag FX indicates whether the data/instruction corresponding to each item is valid (V: Valid) or waiting for check (W: Wait).

For example, immediately after the extended reorder buffer 606 receives the data DOUT1 from the MRAM1, the received data DOUT1 is data before check. Thus, the extended reorder buffer 606 assigns a wait flag ("W") to the data DOUT1 immediately after it is received.

When there is a data transfer request from the reservation station 608 to the extended reorder buffer 606, the extended reorder buffer 606 transfers the wait flag "W" together with the data DOUT1 to the reservation station 608.

The extended reorder buffer 606 stores the calculation result of the calculation circuit 609 in a value field 665.

The error notification flag (and correction data) is transferred from the MRAM1 to the data which is held in the extended reorder buffer 606 and to which the wait flag "W" is assigned.

When the flag FLG indicates valid, the extended reorder buffer 606 sets the flags FX in the instruction field 661 corresponding to valid data and the operand fields 662 and 663 to a valid state ("V").

For example, when the flag FLG indicates an error, the extended reorder buffer 606 flushes (erases) all entries subsequent to the entry corresponding to the correction data DOUT2 received together with the flag FLG. The extended reorder buffer 606 writes the data (data unit) DOUT2, received together with the error signal XX, into the data holding area 660.

After the entries are flushed, the command issue unit 604 fetches a new instruction, whereby the calculation processing may be continued. The entry of the extended reorder buffer 606 is written back to the command queue 605, and the calculation processing may be continued.

For each entry, when the calculation processing is completed and the flags FLG in all the entries become valid, the extended reorder buffer 606 sets the corresponding state flag in a state flag field 666 to commitment (Commit).

By such a control of the extended reorder buffer 606, it is possible to simultaneously realize speed-up of calculation by the speculative calculation processing using the data DOUT1 before error judgment and securement of the reliability of data due to the fact that correct data received after the error judgment can be written to the register.

(B2) Operation Example

An operation example (control method) of the computer system and the memory device of this embodiment will be described with reference to FIGS. 15 to 17.

In addition to FIGS. 15 to 17, FIGS. 9 to 14 are also used as appropriate for the explanation of the operation of the system and device of this embodiment.

FIG. 15 is a timing chart showing an operation example in the case where the data based on the reference cell method and the data based on the self-reference method in the computer system of this embodiment match.

When executing the calculation processing, the processor 9 instructs (requests) the MRAM1 to read data for the calculation processing. The processor 9 transmits the read command, the selected address, and various control signals to the MRAM1.

The MRAM1 receives an instruction from the processor 9. The MRAM1 starts reading data with respect to the selected address based on the command.

The sequencer 190 controls operation of each circuit in the memory circuit 10 based on the command CMD and the control signal CNT from the input control circuit 299.

The word line driver 121 controls activation and deactivation of the word line WL based on the decoding result of the selected address ADR by the row decoder 120. The bit line driver 123 controls activation and deactivation of the bit line BL based on the decoding result of the selected address ADR by the column decoder 122. The switch circuit 124 controls connection between the memory cell (selected cell) MC and each of the circuits 123 and 126.

The read circuit 126 is activated under the control of the sequencer 190. The read circuit 126 sequentially executes the read operation X1 by the reference cell method and the read operation X2 by the self-reference method.

FIG. 16 is a timing chart for explaining an operation example of the read circuit in the MRAM of this embodiment.

As shown in FIG. 16, at time t0, the MRAM1 starts reading data with respect to the selected address ADR based on the command and the control signal.

In the read circuit of FIG. 10, the column switch element CSW corresponding to the selected address is set to an ON state. The read driver 500 supplies a current or voltage for reading data to the bit line EL via the column switch element CSW in the ON state.

The multiplexer 241 selects one of the source lines bBL based on the selected address.

The cell transistor 499 is set to the ON state, and the reference cell RC is activated.

The read driver 590 supplies the reference cell RC with a current or voltage for generating the reference current IRef At time t1a, the signal levels of the signals S1 and S2 are set to "H" level.

The capacitor C1 is charged by a charge caused by the read current IRD of the selected cell MC via the switch element SW1 in the ON state.

The capacitor C2 is charged by a charge caused by the reference current IRef of the reference cell RC via the switch element SW2 in the ON state.

At time t2a, the signal levels of the signals S1 and S2 are set to "L" level. Consequently, the capacitors C1 and C2 are electrically separated from the selected cell MC and the reference cell RC by the switch elements SW1 and SW2 in the OFF state.

At time t3a, the signal level of the signal SC is set to the "H" level. Consequently, the charges of the capacitors C1 and C2 are respectively supplied to the two input terminals of the sense amplifier circuit 520.

At time t5a, the signal level of the sense enable signal SEN is set to the "H" level. Consequently, the differential amplifier type sense amplifier circuit 520 is activated.

In FIG. 16, the signal SC is set to the "L" level before the signal level of the signal SEN is set to the "H" level (for example, at time t4a). However, the signal level of the signal SC maybe either the "L" level or the "H" level when the signal SEN is set to the "H" level. The capacitors C1 and C2 are electrically separated from the sense amplifier circuit 520 by the signal SC at the "L" level.

The sense amplifier circuit 520 senses a signal from the capacitor C1 and a signal from the capacitor C2. The sense amplifier circuit 520 compares the magnitudes of the two sensed signals and amplifies a signal indicating the comparison result.

At time t6a, the signal level of the control signal SEN is set to the "L" level. Consequently, the sense amplifier circuit 520 is deactivated. The comparison result of the sense amplifier circuit 520 is latched in the sense amplifier circuit 520.

In a period from time t7a to time t8a, the result of the signal processing of the sense amplifier circuit 520 is output from the memory circuit 10, as the data DOUT1 read by the reference cell method.

The MRAM1 transfers the data DOUT1, obtained by the read operation by the reference cell method, to the processor 9 via the bus 8.

The data DOUT1 read by the reference cell method is stored in the read buffer circuit 210 in the output control circuit 200.

The output control circuit 200 transfers the value of the data DOUT1 in the read buffer circuit 210 to the processor 9 via the selection circuit 232, the data buffer circuit 233, and the I/O circuit 234.

In the processor 9, when receiving the data DOUT1 from the MRAM1, the core circuit 99 transfers the value of the data DOUT1 to the extended reorder buffer 606.

At that time, the extended reorder buffer 606 assigns the flag FX indicating "W" (waiting for check) to an item associated with the data DOUT1 in the extended reorder buffer 606 and each item of data corresponding to the data DOUT1.

As shown in FIG. 15, the processor 9 executes speculative calculation processing P1 using the data DOUT1. The core circuit 99 waits for transfer of the flag FLG from the MRAM1 while executing the speculative calculation processing P1.

Upon execution of the speculative calculation processing P1 in the core circuit 99, when receiving instruction data from the instruction cache 602 or the MRAM1, the instruction cache controller 603 adds an instruction (for example, an instruction associated with processing of the data DOUT1) into the command queue 605 via the command issue unit 604.

At that time, the command queue 605 assigns the wait flag "W", indicating that the data corresponding to the instruction is in a state before correction, to the added instruction in the data holding area 650 holding the added instruction.

The instruction is transferred to the instruction storage areas 680A and 680B of the reservation station 608 according to the order of the data holding area 650 of the command queue 605.

An entry corresponding to the instruction transferred from the command queue 605 is created in the extended reorder buffer 606 and stored in the data holding area 660.

Based on the instruction from the command queue 605, the reservation station 608 reads the operand used for the calculation processing from the register 607.

The calculation circuit 609 executes the speculative calculation processing in the order that the instruction and the operand are prepared. The calculation circuit 609 returns the result of the speculative calculation processing P1 to the extended reorder buffer 606.

The instruction cache controller 603, the data cache controller 601, and the reorder buffer 606 wait for a flag from the MRAM1.

When a data transfer is requested from the reservation station 608, the reorder buffer 606 transfers the requested data and the wait flag ("W") to the reservation station 608.

In this way, in the computer system of this embodiment, the speculative calculation processing is executed in parallel with the read operation by the self-reference method.

In FIG. 15, an example in which the data DOUT1 is divided into four to be transferred is shown. The number of data divisions (the number of data units DU) is designed according to the specifications of the computer system 1000 and the processor 9.

Following the read operation by the reference cell method, the MRAM1 executes read operation X2 by the self-reference method.

As shown in FIG. 14, at the time t8a, the signal level of the signal S1 is set to the "H" level. At the time of the read operation by the self-reference method, the signal level of the signal S2 is set to the "L" level. Thereby, the reference cell RC is electrically separated from the capacitor C2.

The capacitor C1 is charged by a charge caused by a read current IRDa of the selected cell MC in the first data reading via the switch element SW1 in the ON state.

At time t9a, the signal level of the signal S1 is set to the "L" level. Consequently, the capacitor C1 is electrically separated from the selected cell MC by the switch element SW1 in the OFF state.

In the period from the time t9a to the time t10a, a control signal MTJ-WR is set to the "H" level in order to write preset data (reference data) to the selected cell MC, and the write circuit 125 is activated. Thereby, a write current is supplied to the MTJ element 400 in the selected cell MC.

At this time, the sense amplifier unit 261 is electrically isolated from the selected cell.

As described with reference to FIG. 4, in the MTJ element in the AP state, the magnetization alignment state of the MTJ element changes from the AP state to the P state due to supply of a write current for writing the "0" data. On the other hand, in the MTJ element in the P state, the magnetization alignment state of the MTJ element is maintained in the P state.

At the time t10a, the signal MTJ-WR is set to the "L" level. The signal level of the signal S3 is set to the "H" level.

After writing the reference data, the capacitor C2 is charged by a charge caused by the read current IRDb of the selected cell MC in the second data reading via the switch element SW3 in the ON state.

At time t11a, the signal level of the signal S3 is set to the "L" level. The capacitor C2 is electrically separated from the selected cell by the switch element SW3 in the OFF state.

At time t12a, the signal level of the signal SC is set to the "H" level.

Consequently, the charges of the capacitors C1 and C2 are respectively supplied to the two input terminals of the sense amplifier circuit 520.

At time t14a, the signal level of the sense enable signal SEN is set to the "H" level for activation of the sense amplifier circuit 520.

Consequently, the activated sense amplifier circuit 520 compares the signal from the capacitor C1 and the signal from the capacitor C2 by differential amplification and amplifies the signal indicating the comparison result.

As described above, the signal level of the signal SC may be set to the "L" level at a timing (for example, at time t13a) before the signal level of the signal SEN is set to the "H" level or may be set to the "L" level at a later timing after the signal level of the signal SEN is set to the "H" level.

At time t15a, the signal level of the control signal SEN is set to the "L" level.

Consequently, the sense amplifier circuit 520 is deactivated. The comparison result of the sense amplifier circuit 520 is latched in the sense amplifier circuit 520.

In a period from time t16a to time t17a, the result of the signal processing of the sense amplifier circuit 520 is output from the memory circuit 10, as the data DOUT2 read by the self-reference method.

After the output of the data DOUT, the memory circuit 10 executes writeback processing.

In a period from time t18a to time t19a, the signal level of a control signal MTJ-WR is set to the "H" level in order to write back the value (data DOUT2) read to the selected cell MC by the writeback processing. Thereby, a write current corresponding to the data DOUT2 is supplied to the selected cell MC. Data to be held is written to the selected cell MC.

The data DOUT2 read by the self-reference method is stored in the read buffer circuit 220.

In the output control circuit 200, when the data DOUT1 based on the reference cell method and the data DOUT2 based on the self-reference method are aligned in the buffer circuits 210 and 220, the comparison circuit 231 compares a value of data of the read buffer circuit 210 and a value of data of the read buffer circuit 220.

The comparison circuit 231 outputs a determination signal ER corresponding to the comparison result of the data unit DU in the two pieces of data DOUT1 and DOUT2.

When the two pieces of data DOUT1 and DOUT2 match based the comparison result, it is regarded that the value of the data DOUT1 by the reference cell method is valid.

As a result, the output control circuit 200 transmits the flag FLG including a valid signal SVLD to the processor 9.

As shown in FIG. 14, when the processor 9 receives the flag FLG including the valid signal SVLD, after the calculation processing P1 using the data based on the reference cell method is completed, the processor 9 commits the result of the calculation processing.

In this case (when the data by the reference cell method is valid), the extended reorder buffer 606 sets the flag FX of each item corresponding to the data DOUT1 to a valid flag ("V"). The extended reorder buffer 606 sets the state flag to commitment.

For example, the cache controller 601 writes the value of the data DOUT1 or a value corresponding to calculation processing using the data DOUT1 into the data cache 600, based on the valid signal SVLD from the MRAM1.

For example, based on the valid signal SVLD, the instruction cache controller 603 writes the value of the data DOUT1 or a value corresponding to the calculation processing using the data DOUT1 into the instruction cache 602.

The command queue 605 assigns the valid flag ("V") to the corresponding instruction in the queue 605. Further, the command queue 605 sets the valid flag ("V") in the flag FX when there is no error in the instruction.

As described above, when the data based on the reference cell method and the data based on the self-reference method in the computer system of the embodiment match, a desired calculation result is obtained by the speculative calculation processing P1 using the data by the reference cell method.

Figure 17:
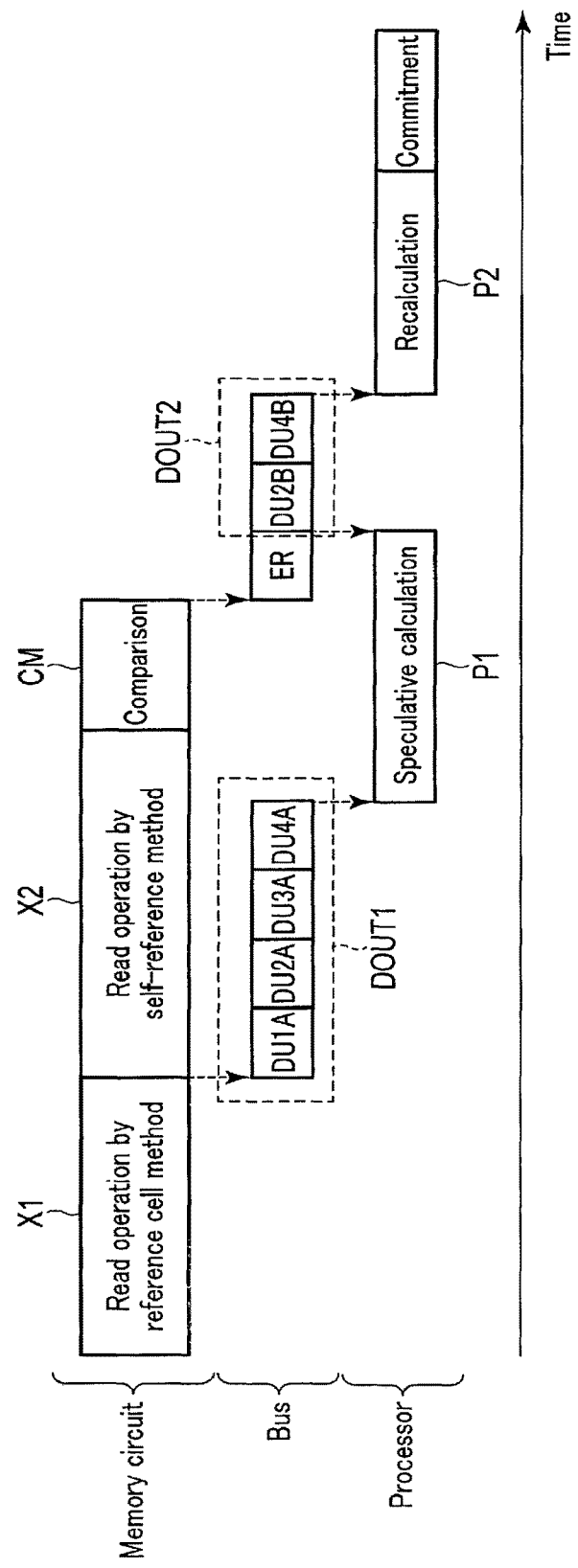

FIG. 17 is a timing chart when the data based on the reference cell method and the data based on the self-reference method in the computer system of this embodiment do not match.

As in the example of FIGS. 14 and 15, the MRAM1 successively executes the read operation by the reference cell method and the read operation by the self-reference method.

The core circuit 99 executes the speculative calculation processing P1 using data based on the reference cell method. The speculative calculation processing P1 is executed in parallel with the read operation by the self-reference method in the MRAM1.

In the MRAM1, the two pieces of data DOUT1 and DOUT2 read by different methods are compared by the comparison circuit 231.

When the two pieces of data DOUT1 and DOUT2 do not match, in the MRAM1, the output control circuit 200 transfers the flag FLG including the error signal XX to the processor 9. The error signal XX indicates a position of the data unit DU whose data values do not match.

When the two pieces of data DOUT1 and DOUT2 do not match, the output control circuit 200 transmits the data DOUT2 read by the self-reference method and serving as correction data to the processor 9.

For example, when comparison of the two pieces of data is executed by the data units DU corresponding to each other, the output control circuit 200 selectively transfers the data unit DU whose data values do not match. The output control circuit 200 does not transfer the data unit DU having the same data value from the MRAM1 to the processor 9.

In the example of FIG. 17, the second data unit DU2B and the fourth data unit DU4B in the data by the self-reference method are transferred as correction data from the MRAM1 to the processor 9. The first and third data units DU1B and DU3B are not transferred.

In this case, an error signal (for example, "0101" signal) XX indicating that the second and fourth data units of the data DOUT1 are errors is transferred as the flag FLG.

The processor 9 executes the calculation processing P2 using the data DOUT2 based on the flag FLG from the MRAM1 and the correction data DOUT2.

As in this embodiment, when correction data is transferred as the data unit DU from the MRAM1 to the processor 9, this is data transfer and calculation processing in the data unit. As a result, the computer system of this embodiment can shorten the period of data transfer and the period of calculation processing.

Based on the flag FLG of the MRAM1, when data used for the calculation processing is corrected (when the data by the reference cell method is invalid), the processor 9 replaces the data DU2A and DU4A indicated at a correction position of the error signal XX with correction data DU2B and DU4B based on the self-reference method. The processor 9 executes the recalculation processing P2 by using the data DU2B and DU4B.

For example, the core circuit 99 writes the correction data (data by the self-reference method) DOUT2 into the data cache 600 via the data cache controller 601.

Consequently, data without error is stored in the data cache 600. When the data unit DU is transferred as the correction data DOUT2, the data units DU2B and DU4B are replaced respectively with the corresponding data units DU2A and DU4A in the data DOUT1 by the reference cell method.

For example, based on the error signal XX, the instruction cache controller 603 writes the data units DU2B and DU4B of the correction data (data by the self-reference method) DOUT2, transferred together with the error signal XX, into the instruction cache 602. Consequently, the data in the instruction cache 602 is replaced with error-free data and stored.

In parallel with writing data to the instruction cache 602, the instruction cache controller 603 transfers the error signal and the correction data DOUT2 to the command queue 605.

When there is an error in the data, the command queue 605 rewrites the instruction (or data) in the queue 605 to a correct value based on the correction data DOUT2. The command queue 605 assigns the valid flag ("V") to the flag ZZ of the instruction rewritten to the correct value.

When an instruction is issued in the command queue 605, an instruction disappears from the queue 605. Thus, in some cases, no instruction corresponding to data exists in the command queue 605.

In this case, an entry corresponding to the lost instruction is formed in the extended reorder buffer 606. If there is an error in the instruction, a correct instruction is written to the command queue 605, and the subsequent entry in the extended reorder buffer 606 is deleted (flushed). In this way, a value of the subsequent entry of the instruction including the error is deleted because the correctness of the operation result after the instruction including the error is not guaranteed.

Based on the error signal XX, the extended reorder buffer 606 flushes all entries subsequent to the entry corresponding to the correction data DOUT2 received together with the flag FLG. The extended reorder buffer 606 writes the correction data (data unit) DOUT2 into the data holding area 660.

For example, after the entries are flushed, the calculation processing is continued by a new instruction from the command issue unit 604, or by the entry of the extended reorder buffer 606 written back to the command queue 605.

For each entry, when the calculation processing using the correction data is completed and the flag FLG becomes valid, the extended reorder buffer 606 sets the state flag to commitment (Commit).

In this way, the processor 9 executes the recalculation processing P2 using the correction data DOUT2. The result of the recalculation processing is committed. The result of the recalculation processing is written to each of the caches 600 and 602 and the register 607.

As described above, when the data based on the reference cell method and the data based on the self-reference method in the computer system of the embodiment do not match, the data by the reference cell method is replaced with the data by the self-reference method. In the computer system of this embodiment, a desired calculation result can be obtained by the calculation processing P2 using the data by the self-reference method.

As described above, the operation of the computer system of this embodiment is completed.

(3) Summary

As described above, the computer system of this embodiment and the memory device of this embodiment read data using the two different read methods and execute the calculation processing based on the read data.

In the computer system of this embodiment, the MRAM reads data by the relatively high speed read operation by the reference cell method.

In the computer system of this embodiment, in parallel with the execution of the calculation processing (speculative calculation processing) using the data based on the read operation by the reference cell method by the processor, the MRAM executes the read operation by the self-reference method.

In this embodiment, the data based on the read operation by the reference cell method and the data based on the read operation by the self-reference method are compared.

In the computer system of this embodiment, when two pieces of data do not match, the processor re-executes the calculation processing using the data based on the read operation by the self-reference method in which the reliability is relatively high.

Thereby, as described above, the computer system of this embodiment can speed up the operation and improve the reliability of the operation.

In this embodiment, error information on read data is notified by a flag based on the comparison result of the data. Further, in this embodiment, suitability of data (and calculation results based on data) from the MRAM in the processor is determined by setting a flag.

Thus, in the computer system of this embodiment, it is possible to avoid a large change in the configuration of the system and the processor and complication of processing.

Thereby, the computer system and the memory device of this embodiment can achieve high-speed operation and improve the reliability of the calculation processing.

[C] Second Embodiment

A computer system and a memory device of the second embodiment will be described with reference to FIGS. 18 and 19.

(C1) Configuration Example

FIG. 18 shows an example of a read circuit in the memory device (for example, MRAM) in the computer system of this embodiment.

As shown in FIG. 18, in a read circuit 126 of the MRAM of this embodiment, a sense amplifier unit 261A includes four capacitors C1A, C2A, C3A, and C4A.

The capacitors C1A and C2A are used for the read operation by the reference cell method.

One end of the capacitor C1A is connected to a connection node between a switch element SW1A and a switch element SWX1. The other end of the capacitor C1A is grounded.

The capacitor C1A is connected to a bit line bBL selected by a multiplexer 241 via the switch SW1A. The capacitor C1A is connected to one input terminal of a sense amplifier circuit 520 via the switch element SWX1.

One end of the capacitor C2A is connected to a connection node between a switch element SW2A and a switch element SWX2. The other end of the capacitor C2A is grounded.

The capacitor C2A is connected to the reference cell RC via the switch SW2A. The capacitor C2A is connected to the other input terminal of the sense amplifier circuit 520 via the switch element SWX2.

The capacitors C1A and C2A may be capacitive elements connected to the input terminal of the sense amplifier circuit 520. The capacitor C1A may be a capacitance component (parasitic capacitance) included in an interconnect (and element) connecting the input terminal of the sense amplifier circuit 520 and a memory cell array (selected cell). The capacitor C2A may be a capacitance component (parasitic capacitance) included in an interconnect (and element) connecting the input terminal of the sense amplifier circuit 520 and the reference cell.

The capacitors C3A and C4A are used for the read operation by the self-reference method.

One end of the capacitor C3A is connected to a connection node between a switch element SW3A and a switch element SWZ1. The other end of the capacitor C1A is grounded.

The capacitor C3A is connected to the bit line bBL selected by the multiplexer 241 via the switch SW3A. The capacitor C3A is connected to one input terminals of the sense amplifier circuit 520 via the switch element SWZ1.

One end of the capacitor C4A is connected to a connection node between a switch element SW4A and a switch element SWZ2. The other end of the capacitor C4A is grounded.

The capacitor C4A is connected to the bit line bBL selected by the multiplexer 241 via the switch SW4A. The capacitor C4A is connected to the other input terminal of the sense amplifier circuit 520 via the switch element SWZ2.

The capacitors C3A and C4A may be capacitive elements connected to the input terminal of the sense amplifier circuit 520. The capacitors C3A and C4A may be capacitance components (parasitic capacitances) included in each interconnect (and element) connecting the input terminal of the sense amplifier circuit 520 and a memory cell array (selected cell) 10.

The switch element SW1A controls connection between the selected cell MC and the capacitor C1A.

One end of the switch element SW1A is connected to a terminal of the multiplexer 241. The other end of the switch element SW1A is connected to one end of the capacitor C1A and the switch element SWX1.

The switch element SW2A controls connection between the reference cell RC and the capacitor C2A.

One end of the switch element SW2A is connected to the reference cell RC. The other end of the switch element SW2A is connected to one end of the capacitor C2 and the switch element SWX2.

The switch element SW3A controls connection between the selected cell MC and the capacitor C3A.

One end of the switch element SW3A is connected to the terminal of the multiplexer 241. The other end of the switch element SW3A is connected to one end of the capacitor C3A and the switch element SWZ1.

The switch element SW4A controls connection between the selected cell MC and the capacitor C4A.

One end of the switch element SW4A is connected to the terminal of the multiplexer 241. The other end of the switch element SW4A is connected to one end of the capacitor C4A and the switch element SWZ2.

Different control signals S1, S2, S3, and S4 are supplied to the gates of the switch elements SW1A, SW2A, SW3A, and SW4A. Consequently, turning on/off of the switch elements SW1, SW2, SW3, and SW4 is controlled independently of each other.

The switch element SWX1 controls connection between the capacitor C1A and the sense amplifier circuit 520. One end of the switch element SWX1 is connected to the capacitor C1A and the switch element SW1A. The other end of the switch element SWX1 is connected to one input terminal of the sense amplifier circuit 520.

The switch element SWX2 controls connection between the capacitor C2A and the sense amplifier circuit 520. One end of the switch element SWX2 is connected to the capacitor C2A and the switch element SW2A. The other end of the switch element SWX2 is connected to the other input terminal of the sense amplifier circuit 520.

The switch element SWZ1 controls connection between the capacitor C3A and the sense amplifier circuit 520. One end of the switch element SWZ1 is connected to the capacitor C3A and the switch element SW3A. The other end of the switch element SWZ1 is connected to one input terminal of the sense amplifier circuit 520.

The switch element SWZ2 controls connection between the capacitor C4A and the sense amplifier circuit 520. One end of the switch element SWZ2 is connected to the capacitor C4A and the switch element SW4A. The other end of the switch element SWZ2 is connected to the other input terminal of the sense amplifier circuit 520.

A common control signal SC1 is supplied to the gates of the switch elements SWX1 and SWX2.

Consequently, turning on/off of the switch elements SWX1 and SWX2 is commonly controlled.

A common control signal SC2 is supplied to the gates of the switch elements SWZ1 and SWZ2.

Consequently, turning on/off of the switch elements SWZ1 and SWZ2 is commonly controlled.

The signal level of a control signal SC1 can be controlled independently of the signal level of a control signal SC2.

The sense amplifier unit 261A may be connected to a bit line BL. In this case, the sense amplifier unit 261A holds a charge caused by discharge of the bit line BL.

The read circuit of FIG. 18 can realize relatively high speed operation by the operation shown in FIG. 19 below.

(C2) Operation Example

Figure 19:
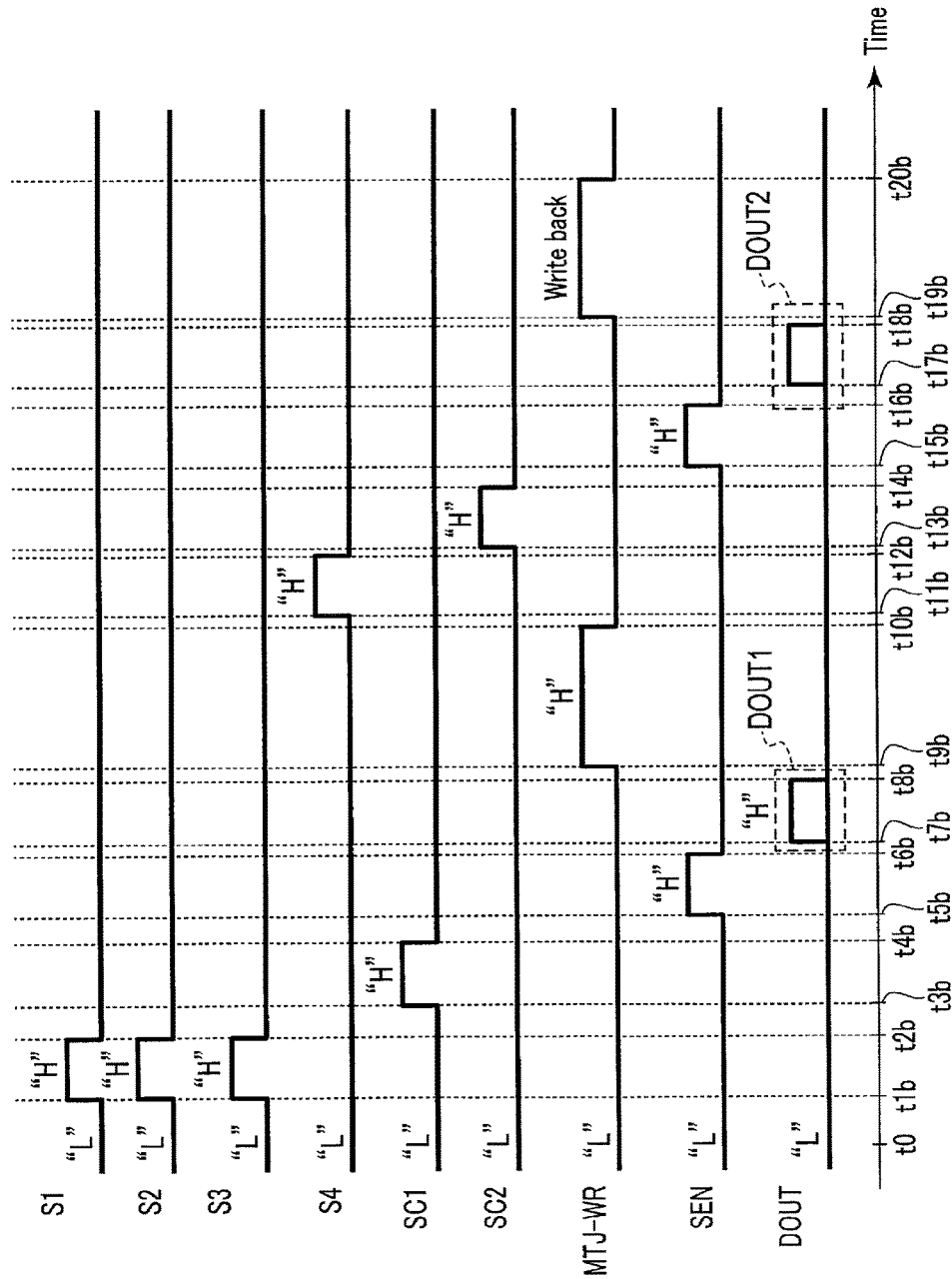

FIG. 19 is a timing chart for explaining read operation in the MRAM of this embodiment.

As shown in FIG. 19, the read operation is started at time t0. Drivers 500 and 590 supply a voltage or current to each of the cells MC and RC via switch elements CSW and 499 in an ON state.

At time t1b, the signal levels of the signals S1, S2, and S3 are set to "H" level.

The capacitor C1A is charged by a charge caused by a read current IRD of the selected cell MC via the switch element SW1A (and multiplexer 241) in the ON state.

The capacitor C3A is charged by the charge caused by the read current IRD of the selected cell MC via the switch element SW3A (and multiplexer 241) in the ON state.

A current IRef from the reference cell is supplied to the capacitor C2A via the switch element SW2A in the ON state. The capacitor C2A is charged by a charge caused by the current IRef. The signal level of a switch element S4A is set to "L" level.

The capacitor C4 is electrically separated from the selected cell by the switch element S4A in an OFF state.

In this embodiment, charging of the capacitor C3A for the first data reading by the self-reference method is performed simultaneously with charging of the capacitors C1A and C2A for the read operation by the reference cell method.

At time t2b, the signal levels of the signals S1, S2, and S3 are set to the "L" level. Consequently, the capacitors C1A and C3A are electrically separated from the selected cell MC by the switch elements SW1A and SW3A in the OFF state. The capacitor C2A is electrically separated from the reference cell RC by the switch element SW2A in the OFF state.

In a period from the time t1b to the time t2b, a charging period for the capacitor for the first reading in the read operation by the self-reference method overlaps with a charging period for the capacitor for the read operation by the reference cell method.

At time t3b, the signal level of the signal SC1 is set to the "H" level.

Consequently, signals corresponding to charges charged in the capacitors C1A and C2A are respectively supplied to the two input terminals of the sense amplifier circuit 520.

At this time, the signal SC2 is set to the "L" level. Thus, the capacitor C3A in a charged state is electrically separated from the sense amplifier circuit 520 by the switch element SWZ1 in the OFF state.

At time t5b, the signal level of a sense enable signal SEN is set to the "H" level. Consequently, the sense amplifier circuit 520 is activated.

At time t4b, the signal level of the signal SC1 is set to the "L" level in order to electrically separate the capacitors C1A and C2A from the sense amplifier circuit 520.

However, the signal level of the signal SC1 may be set to the "L" level after the time t5b (for example, at a timing between the time t5b and time t6b).

The sense amplifier circuit 520 senses a signal from the capacitor C1A and a signal from the capacitor C2A. The sense amplifier circuit 520 compares the magnitudes of the two sensed signals by differential amplification and amplifies the comparison result.

At time t6b, the signal level of the sense enable signal SEN is set to the "L" level. Consequently, the sense amplifier circuit 520 is deactivated. The comparison result is latched in the sense amplifier circuit 520.

The comparison result of the signals of the capacitors C1A and C2A corresponds to the data by the read operation by the reference cell method. In this way, the read operation by the reference cell method is executed.

In a period from time t7b to time t8b, the result of the signal processing of the sense amplifier circuit 520 is output as data DOUT1 read by the reference cell method.

In this embodiment, the first data reading (internal reading) in the read operation by the self-reference method is executed during the read operation by the reference cell method.

A signal charge accumulated in the capacitor C3A is the result of the first data reading in the read operation by the self-reference method.

Thus, in this embodiment, after completion of output of the data by the reference cell method, predetermined data (for example, "1" data) is written to the selected cell.

In a period from time t9b to time t10b, a control signal MTJ-WR is set to the "H" level. Consequently, a write circuit 125 is activated. A write current corresponding to reference data is supplied to an MTJ element 400 in the selected cell MC.

After the control signal MTJ-WR is set to the "L" level, the signal level of the signal S4 is set to the "H" level at time t11b.

Consequently, the second data reading in the read operation by the self-reference method is executed. The capacitor C4A is charged by the charge caused by the read current IRD of the selected cell MC via the switch element SW4A (and multiplexer 241) in the ON state.

At time t12b, the signal level of the signal S4 is set to the "L" level. Consequently, the capacitor C4A is electrically separated from the selected cell by the switch element SW4 in the OFF state.

At time t13b, the signal level of the control signal SC2 is set to the "H" level.

Consequently, the capacitors C3A and C4A are electrically connected to the sense amplifier circuit 520 via the switch elements SWZ1 and SWZ2 in the ON state. Consequently, the charges of the capacitors C3A and C4A are respectively supplied to the two input terminals of the sense amplifier circuit 520.

At time t15b, the signal level of a sense enable signal SEN is set to the "H" level. Consequently, a sense amplifier circuit 520B is activated.

At time t14b, the signal level of the signal SC2 is set to the "L" level in order to electrically separate the capacitors C3A and C4A from the sense amplifier circuit 520.

However, the signal level of the signal SC2 may be set to the "L" level after the time t15b (for example, at a timing between the time t15b and time t16b).

The sense amplifier circuit 520 senses a signal from the capacitor C3A and a signal from the capacitor C4A. The sense amplifier circuit 520 compares the sensed signals and amplifies the comparison result.

At the time t16b, the signal level of the sense enable signal SEN is set to the "L" level. Consequently, the sense amplifier circuit 520 is deactivated. The comparison result is latched in the sense amplifier circuit 520.

The comparison result of the signals of the capacitors C3A and C4A corresponds to the data by the read operation by the self-reference method. In this way, the read operation by the self-reference method is executed.

In a period from time t17b to time t18b, the result of the signal processing of the sense amplifier circuit 520 is output as data DOUT2 read by the self-reference method.

In a period from time t19b to time t20b, the control signal MTJ-WR is set to the "H" level in order to write back a value of the data DOUT2 read to the selected cell. A write current corresponding to the data DOUT2 is supplied to the MTJ element 400 in the selected cell MC by the activated write circuit 125.

In this way, writeback processing is executed on the selected cell in which data has been destroyed by the read operation by the self-reference method.

As described above, the data read operation in which the read operation by the reference cell method and the read operation by the self-reference method in the MRAM of this embodiment are continued is completed.

(C3) Summary

In the MRAM of the first embodiment described above, the first reading (charging of the capacitor) in the read operation by the self-reference method is executed after the data by the read operation by the reference cell method is output.

On the other hand, when the sense amplifier unit of FIG. 18 is used as in this embodiment, the charging of the capacitor C3A for the read operation by the self-reference method is executed simultaneously with the charging of the capacitors C1A and C2A for the read operation by the reference cell method.

Thus, immediately after the output of the data DOUT1 based on the reference cell method is completed, writing of the reference data to the MTJ element can be executed.

Accordingly, the MRAM of this embodiment can speedup the read operation.

As a result, the computer system including the MRAM of this embodiment can shorten a period for the calculation processing.

As described above, the computer system and the memory device of this embodiment can achieve high-speed operation.

[D] Third Embodiment

A computer system and a memory device of the third embodiment will be described with reference to FIG. 20.

As described with reference to FIG. 4, in the read operation by the destructive self-reference method in the MRAM, during two read operations (two chargings of capacitors), a step of supplying a write current corresponding to predetermined data (reference data) to the MTJ element is executed.

At the time of the read operation by the self-reference method, in order to restore the data destroyed by writing of the reference data between two read operations, after the second reading, a step of writing back the read data (writeback processing) is executed.

Thus, the execution period of the read operation by the destructive self-reference method is longer than the execution period of the read operation by the reference cell method.

In the MRAM of this embodiment, the read operation is executed using a voltage dependence of the resistance value of the MTJ element, whereby data can be read from the memory cell by the self-reference method without supply of a write current between two reading (without destruction of data).

(D1) Principle

The principle of the read operation by the non-destructive self-reference method in the MRAM of this embodiment will be described with reference to FIGS. 20 and 21.

FIG. 20 is a graph showing the voltage dependence of the resistance value of the magnetoresistive effect element (MTJ element).

In FIG. 20, the horizontal axis of the graph corresponds to a voltage applied to the MTJ element, and the vertical axis of the graph corresponds to the resistance value of the MTJ element. In FIG. 20, a characteristic PL1 of the MTJ element in the parallel state (P state) and a characteristic PL2 of the MTJ element in the antiparallel state (AP state) are shown.

As shown in FIG. 20, as the tendency of a relationship between the resistance value of the MTJ element and the applied voltage, as the applied voltage increases, the resistance value of the MTJ element decreases. If a write voltage (write current) or breakdown voltage is not applied to the MTJ element, the magnetization alignment of the MTJ element is maintained even if the resistance value of the MTJ element decreases due to an increase of the applied voltage.

The voltage dependent characteristic PL1 of the resistance value of the MTJ element in the P state is different from the voltage dependent characteristic PL2 of the resistance value of the MTJ element in the AP state.

As shown by the characteristic PL1, even if the applied voltage increases from a voltage value VR1 to a voltage value VR2, a change amount (decrease amount) Z1 of the resistance value of the MTJ element in the P state is small.

On the other hand, as shown by the characteristic PL2, in the range of the applied voltage from the voltage value VR1 to the voltage value VR2, a change amount Z2 of the resistance value of the MTJ element in the AP state is larger than the change amount Z1 of the resistance value of the MTJ element in the P state.

For example, when the voltage VR2 is applied to the MTJ element, the resistance value of the MTJ element in the AP state has a value close to the resistance value of the MTJ element in the P state.

In this way, the resistance value of the MTJ element in the case where a certain voltage is applied to the MTJ element and the change amounts Z1 and Z2 of the resistance value of the MTJ element to the applied voltage are different according to the magnetization alignment state of the MTJ element.

In the MRAM 1 of this embodiment, by utilizing the difference between the change amounts Z1 and Z2 of the resistance value of the MTJ element due to the voltage dependence, data corresponding to a resistance state of the MTJ element 400 is determined from two values (output) obtained from selected cell with different voltage application states.

The MRAM of this embodiment uses the voltage dependence of the resistance value of the MTJ element as described above to execute the read operation by the self-reference method without destroying the data of the MTJ element.

Figure 21:
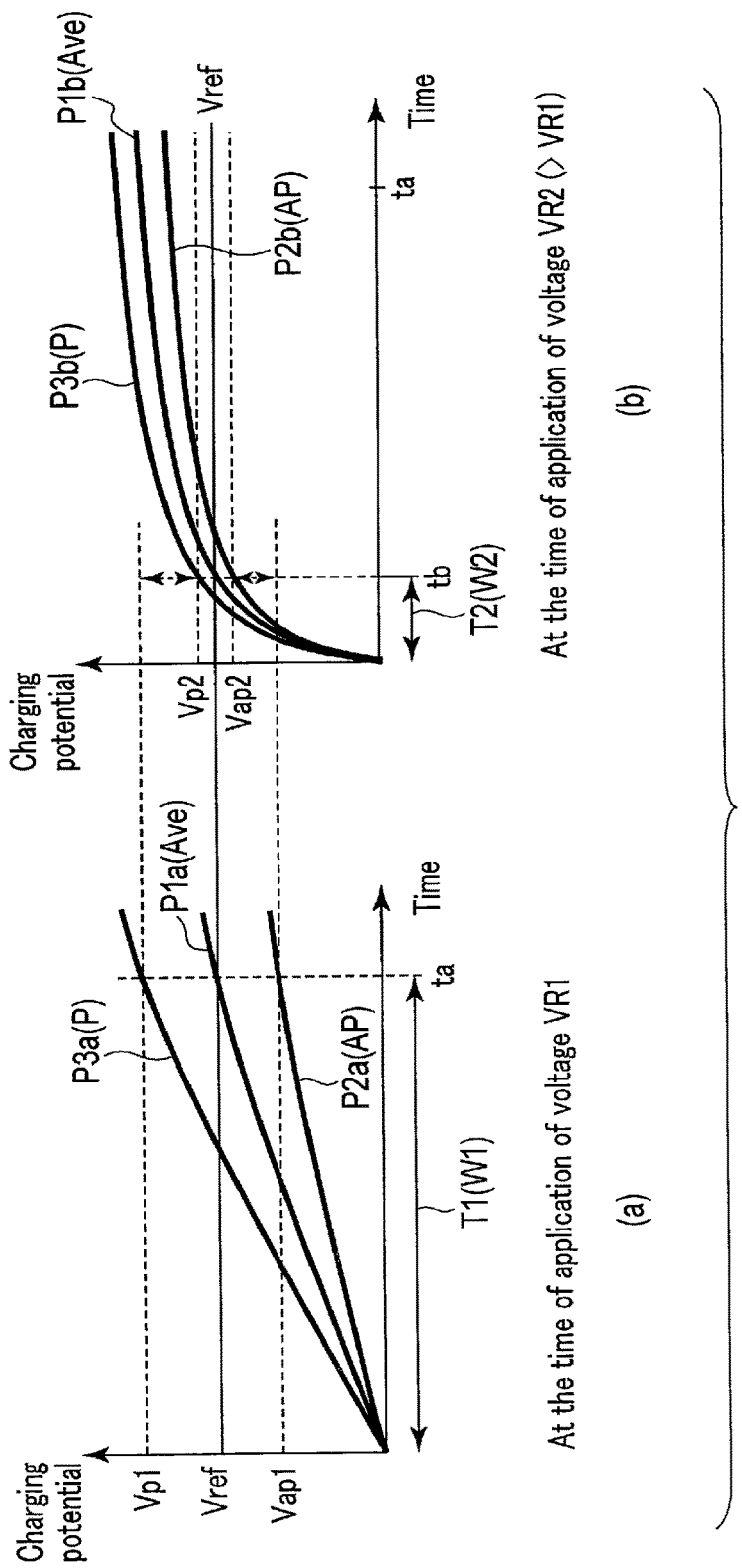

FIG. 21 is a diagram for explaining read operation in the MRAM of this embodiment.

(a) of FIG. 21 is a schematic diagram showing a relationship between a charging potential of a certain node (interconnect) due to an output current from the MTJ element at the time of application of the voltage VR1 and time. In (a)

of FIG. 21, the horizontal axis of the graph corresponds to time, and the vertical axis of the graph corresponds to the charging potential.

(b) of FIG. 21 is a schematic diagram showing the relationship between the charging potential of a certain node (interconnect) due to the output current from the MTJ element at the time of application of the voltage VR2 (VR2>VR1) and the time. In (b) of FIG. 21, the horizontal axis of the graph corresponds to time, and the vertical axis of the graph corresponds to the charging potential.

In each of (a) and (b) of FIG. 21, characteristic lines P2a and P2b indicating a relationship between the time and the charging potential in the MTJ element in the AP state and characteristic lines P3a and P3b indicating a relationship between the time and the charging potential in the MTJ element in the P state are shown.

In (a) and (b) of FIG. 21, the characteristic lines P1a and P1b indicate a relationship between the time and a charging voltage in the MTJ element having a resistance value between the resistance value of the MTJ element in the P state and the resistance value of the MTJ element in the AP state. The characteristic lines P1a and P1b correspond to a change of the charging potential between the charging potential of the MTJ element in the P state and the charging potential of the MTJ element in the AP state.

As shown in (a) of FIG. 21, in a period (charging period) T1 from a start of the application of the voltage VR1 to time ta, a certain node is charged by the output current (read current of the memory cell) of the MTJ element.

Thereby, at the time ta, the charging potential of a certain node reaches certain potentials Vap1 and Vp1 according to the resistance state of the MTJ element.

As indicated by the characteristic line P2a, with respect to the MTJ element in the AP state, a certain node is charged to the potential Vap1 at the time ta.

As indicated by the characteristic line P3a, with respect to the MTJ element in the P state, a certain node is charged to the potential Vp1 at the time ta.

As described with reference to FIG. 20, when the voltage VR1 is applied, the resistance value of the MTJ element in the P state is smaller than the resistance value of the MTJ element in the AP state. Thus, in the period Ti, the amount of a current (charge amount) output from the MTJ element in the P state is larger than the amount of a current output from the MTJ element in the AP state.

Thus, at the time ta, the charging potential Vp1 of a node connected to the MTJ element in the P state is higher than the charging potential Vap1 of a node connected to the MTJ element in the AP state.

As indicated by the characteristic line P1a, in the MTJ element having the resistance value between the resistance value of the MTJ element in the P state and the resistance value of the MTJ element in the AP state, the potential at the time ta is a potential Vref. The potential Vref is a value between a charging potential Vpa and a charging potential Vapa.

For example, the period T1 corresponds to a pulse width (read voltage application period) W1 of the read voltage VR1.

As shown in (b) of FIG. 21, a certain node is charged by the output current of the MTJ element (memory cell) to which the voltage VR2 (>VR1) is applied. In a relationship between the charging potential in the MTJ element in the P state and the charging potential in the MTJ element in the AP state, similarly to the example in (a) of FIG. 21, at a certain time in (b) of FIG. 21, the charging potential in the MTJ element in the P state is higher than the charging potential in the MTJ element in the AP state.

As described with reference to FIG. 20, since the resistance value of the MTJ element decreases as the voltage VR2 applied to the MTJ element increases, a current output from the memory cell increases. Thus, when the voltage VR2 higher than the voltage VR1 is applied to the memory cell including the MTJ element, the charging speed of a node at the time of the application of the voltage VR2 is higher than the charging speed of a node at the time of the application of the voltage VR1.

In a period T2 from a start of the application of the voltage VR2 to time tb, as indicated by the characteristic lines P2b and P3b in (b) of FIG. 21, a change in the charging potential of a node in the MTJ element at the time of the application of the voltage VR2 is steeper than a change in the charging potential of a node in the MTJ element at the time of the application of the voltage VR1.

When the voltage VR2 is applied to the MTJ element, a voltage value between the charging potential of a node relating to the MTJ element in the P state and the charging potential of a node relating to the MTJ element in the AP state reaches the voltage value Vref in the period T2 shorter than the period T1.

The voltage value Vref at the time tb at the time of the application of the voltage VR2 is the same value as the voltage value Vref at the time to at the time of the application of the voltage VR1.

At the time tb, the charging potential of the node in the MTJ element in the P state has a voltage value Vp2 higher than the voltage value Vref. At the time tb, the charging potential of the node in the MTJ element in the AP state has a voltage value Vap2 lower than the voltage value Vref.

However, with respect to the MTJ element in the P state, the voltage value Vp2 at the time tb is lower than the voltage value Vp1 at the time ta.

Conversely, with respect to the MTJ element in the AP state, the voltage value Vap2 at the time tb is higher than the voltage value Vap1 at the time ta.

A magnitude relation between the charging potential at the time ta at the time of the application of the voltage VR1 and the charging potential at the time tb at the time of the application of the voltage VR2 is reversed between the MTJ element in the AP state and the MTJ element in the P state, and as described with reference to FIG. 20, this is because the amount of decrease in the resistance value of the MTJ element in the AP state is larger than the amount of decrease in the resistance value of the MTJ element in the P state due to the voltage dependence of the resistance value of the MTJ element.

In this way, in the MRAM of this embodiment, when the two different voltages VR1 and VR2 are used, the magnitude relation of the charging potential of a certain node at the times ta and tb at which this node reaches the common voltage value Vref is opposite between the MTJ element in the P state and the MTJ element in the AP state.

The MRAM of this embodiment uses the read voltages VR1 and VR2 set so as to enable comparison of the charging potential based on the voltage dependence of the resistance value of the MTJ element to compare the charging potential of a certain node at the time of application of the read voltage VR1 with the charging potential of a certain node at the time of application of the read voltage VR2.

The period T1 from the start of the application of the voltage VR1 to the time to corresponds to the pulse width W1 of the read voltage VR1. The period T2 from the start of the application of the voltage VR2 to the time tb corresponds to a pulse width W2 of the read voltage VR2. The period T2 is shorter than the period until the charging potential due to output of an MTJ element 100 reaches a saturation state. The first read period T1 (the pulse width W1 of the first read voltage VR1) may be the same as the second read period T2 (the pulse width W2 of the second read voltage VR2).

In the MRAM of this embodiment, in consideration of a period during which the charging potential of a node reaches a certain common potential, the pulse widths W1 and W2 of the voltages VR1 and VR2 are controlled such that, regarding the MTJ element in the P state, the charging potential of the node at the time of the application of the voltage VR2 is lower than the charging potential of the node at the time of the application of the voltage VR1, and regarding the MTJ element in the AP state, the charging potential of the node at the time of the application of the voltage VR2 is higher than the charging potential of the node at the time of the application of the voltage VR1.

Consequently, in the MRAM of this embodiment, even if the application of the read voltages VR1 and VR2 with different voltage values is executed to the selected cell in order to discriminate data in the selected cell, comparison of the two charging potentials relating to the MTJ element in the P state based on the application of the two read voltages VR1 and VR2 and comparison of the two charging potentials relating to the MTJ element in the AP state based on the application of the two read voltages VR1 and VR2 can be executed.

The voltage values and the pulse widths W1 and W2 of the read voltages VR1 and VR2 can be set based on an experimental result of the MRAM, a simulation result, and a test process of a chip of the MRAM. The results of the experiment and the test process are held, in a chip of the MRAM1, as setting information on the read voltage (and write voltage).

The read circuit of FIG. 18 can be used for the configuration of the read circuit of the MRAM of this embodiment.

(D2) Operation Example

An operation example of the MRAM of this embodiment will be described with reference to FIG. 22.

FIG. 22 is a timing chart for explaining read operation in the MRAM of this embodiment.

As shown in FIG. 22, in a period from time t1c to time t2c, switch elements SW1A, SW2A, and SW3A are set to ON states, and capacitors C1A, C2A, and C3A are charged. When the capacitors C1A, C2A, and C3A are charged, the voltage VR1 is applied from read drivers 500 and 590 to a bit line BL.

Consequently, charging of the capacitor for reading by the reference cell method and the first reading in the read operation by the self-reference method are executed.

After the signal levels of the signals S1, S2, and S3 are set to "L" level (time t2c), the signal level of a signal SC1 is set to "H" level at time t3c. Consequently, the signals of the capacitors C1A and C2A are supplied to a sense amplifier circuit 520.

Subsequently, the signal level of a signal S4 is set to the "H" level (for example, at time t4c), in the second reading in the read operation by the self-reference method, a capacitor C4A is charged by a charge caused by a read current IRDb of a selected cell MC via a switch element SW4A in the ON state.

In this embodiment, the supply of a write current for writing the reference data is not executed between charging of the capacitor C3A and charging of the capacitor C4A.

In the read operation by the non-destructive self-reference method of this embodiment, the voltage VR2 is applied from the read driver 500 to the bit line BL when the capacitor C4A is charged.

The voltage VR2 is higher than the voltage VR1. For example, the pulse width of the voltage VR2 is smaller than the pulse width of the voltage VR1.

In this embodiment, the second reading in the read operation by the self-reference method is executed in parallel with the supply of charges charged in the capacitors C1A and C2A to the sense amplifier circuit 520 in the read operation by the reference cell method.

At time t5c, the signal level of the signal SC1 is set to the "L" level. Consequently, the capacitors C1A and C2A are electrically separated from the sense amplifier circuit 520.

At time t6c, the signal level of the signal S4 is set to the "L" level. The capacitor C4A is electrically separated from the selected cell MC by the switch element SW4A in the OFF state. The pulse width of the voltage VR2 may be controlled by an ON/OFF period of the switch element SW4A (period of "H" level of the signal S4).

At time t7c, the signal level of the sense enable signal SEN is set to the "H" level. Consequently, the sense amplifier circuit 520 is activated. The sense amplifier circuit 520 compares (differential-amplifies) a signal from the capacitor C1A and a signal from the capacitor C2A.

At time t8c, the signal level of the control signal SEN is set to the "L" level. Consequently, the sense amplifier circuit 520 is deactivated.

In a period from time t9c to time t10c, the result of the signal processing of the sense amplifier circuit 520 is output as the data DOUT1 read by the reference cell method.

At time t11c, the signal level of the control signal SC2 is set to the "H" level.

Consequently, charges charged in the capacitors C3A and C4A are respectively supplied to two input terminals of the sense amplifier circuit 520.

An activation timing of the switch element SW4A is not limited to the timing from the time t4c to the time t6c as long as the timing is earlier than the time at which the control signal SC2 is set to the "H" level.

At time t12c, the signal level of the control signal SC2 is set to the "L" level.

Consequently, the capacitors C3A and C4A are electrically separated from the sense amplifier circuit 520 by the switch element SWZ1, SWZ2 in the OFF state.

At time t13c, the signal level of the control signal SEN is set to the "H" level.

Consequently, a sense amplifier circuit 520 is activated. The sense amplifier circuit 520 compares the supplied signals from the capacitors C3A and C4A.

At time t14c, the signal level of the sense enable signal SEN is set to the "L" level.

In a period from time t15c to time t16c, the result of the signal processing of the sense amplifier circuit 520 is output as the data DOUT2 read by the self-reference method.

In order to secure the reliability of data in the memory cell, the writeback processing may be executed after outputting the data DOUT2.

As described above, in the MRAM of this embodiment, the read operation by the reference cell method and the read operation by the non-destructive self-reference method are executed successively.

(D3) Summary

In the MRAM of this embodiment, at the time of the read operation by the self-reference method, the read operation by the self-reference method can be executed without supplying the write current between the two reading and writing back data. Thus, the MRAM of this embodiment can speed up the read operation.

As a result, the computer system including the MRAM of this embodiment can shorten a period for the calculation processing.

As described above, the computer system and the memory device of this embodiment can achieve high-speed operation.

[E] Fourth Embodiment

A computer system and a memory device of the fourth embodiment will be described with reference to FIGS. 23 to 25.

(E1) Configuration Example

A configuration example of the computer system of this embodiment will be described with reference to FIG. 23.

FIG. 23 shows an example of a read circuit in the memory device (for example, MRAM) in the computer system of this embodiment.

As shown in FIG. 23, in a read circuit 126 of the MRAM of this embodiment, a sense amplifier unit 261E includes four capacitors C1A, C2A, C3A, and C4A, two sense amplifier circuits 520A and 520B, and a selection circuit 550.

The capacitors C1A and C2A and the sense amplifier circuit 520A are used for read operation by a reference cell method.

The capacitor C1A is connected to one input terminal of the sense amplifier circuit 520A via a switch element SWX1. The capacitor C2A is connected to the other input terminal of the sense amplifier circuit 520A via a switch element SWX2.

A control signal SEN1 is supplied to the sense amplifier circuit 520A. Activation/deactivation of the sense amplifier circuit 520A is controlled by the control signal SEN1.

The capacitors C1A and C2A may be capacitive elements connected to the input terminal of the sense amplifier circuit 520A. The capacitor C1A may be a capacitance component (parasitic capacitance) included in an interconnect (and element) connecting the input terminal of the sense amplifier circuit 520A and a memory cell array (selected cell) 10. The capacitor C2A may be a capacitance component (parasitic capacitance) included in an interconnect (and element) connecting the input terminal of the sense amplifier circuit 520A and a reference cell RC.

The capacitors C3A and C4A and the sense amplifier circuit 520B are used for read operation by a self-reference method.

The capacitor C3A is connected to one input terminal of the sense amplifier circuit 520E via a switch element SWZ1. The capacitor C4A is connected to the other input terminal of the sense amplifier circuit 520B via a switch element SWZ2.

A control signal SEN2 is supplied to the sense amplifier circuit 520B. Activation/deactivation of the sense amplifier circuit 520B is controlled by the control signal SEN2. The signal level of the control signal SEN2 is controlled independently of the signal level of the control signal SEN1. Consequently, the sense amplifier circuit 520B can be driven independently of the sense amplifier circuit 520A.

The capacitors C3A and C4A may be capacitive elements connected to the input terminal of the sense amplifier circuit 520B. The capacitors C3A and C4A may be capacitance components (parasitic capacitances) included in each interconnect (and element) connecting the input terminal of the sense amplifier circuit 520B and the memory cell array (selected cell) 10.

One input terminal of the selection circuit 550 is connected to an output terminal of the sense amplifier circuit 520A. The other input terminal of the selection circuit 550 is connected to an output terminal of the sense amplifier circuit 520B.

A selection signal (control signal) SEL is supplied to the selection circuit 550.

The selection circuit 550 selects either an output signal of the sense amplifier circuit 520A or an output signal of the sense amplifier circuit 520B based on the selection signal SEL.

The selection circuit 550 outputs the selected signal as read data DOUT.

The sense amplifier unit 261B may be connected to the bit line BL. In this case, the sense amplifier unit 261B holds a charge caused by discharge of the bit line BL.

(E2) Operation Example

An operation example of the computer system of this embodiment will be described with reference to FIGS. 24 and 25.

<Operation Example 1>

An operation example 1 of the MRAM of this embodiment will be described with reference to FIG. 24.

Figure 24:
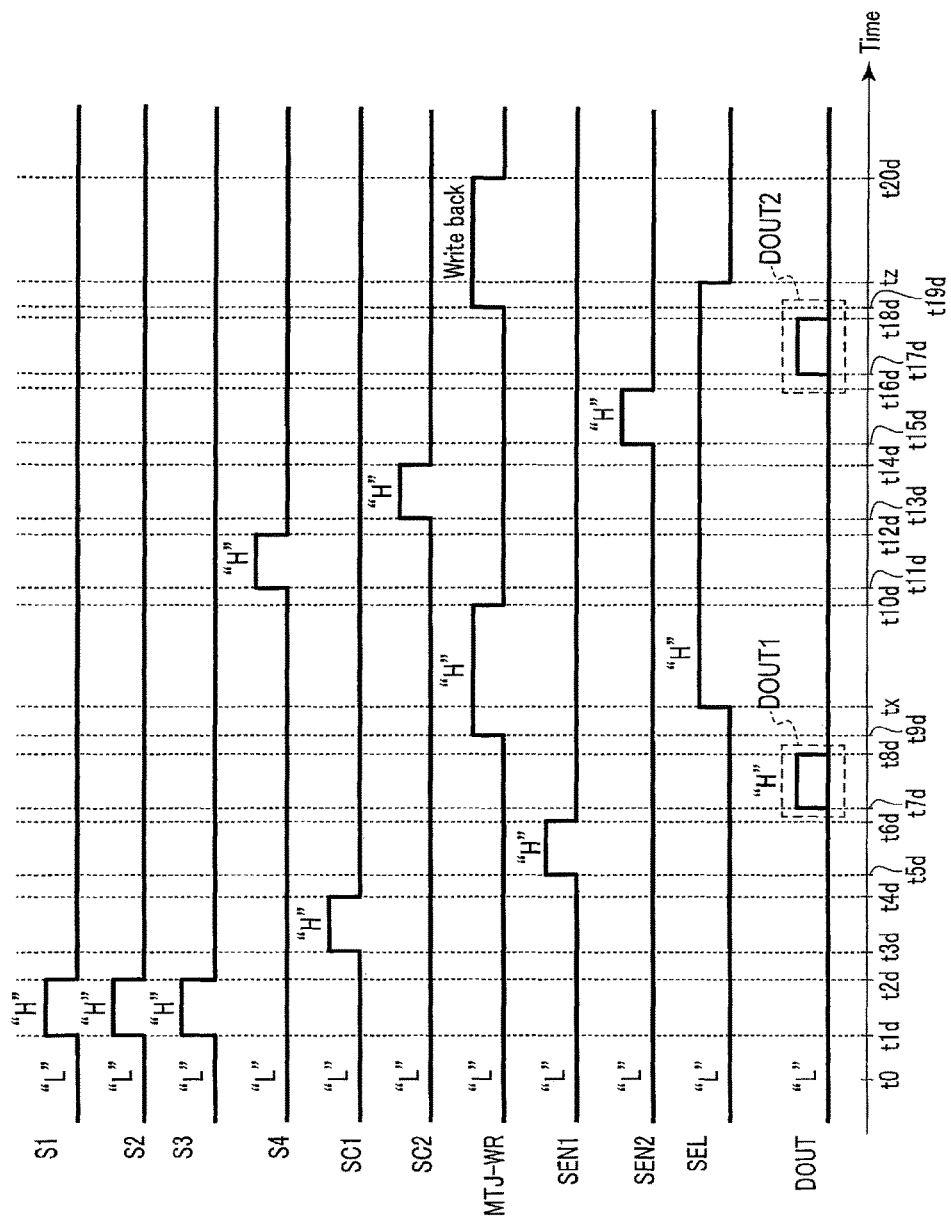

FIG. 24 is a timing chart for explaining an operation example of the read circuit shown in FIG. 23 in the memory device of this embodiment. The timing chart of FIG. 24 shows an example in which the read circuit of FIG. 23 executes read operation by a destructive self-reference method.

At time t1$d$, the signal levels of signals S1, S2, and S3 are set to "H" level.

The capacitors C1A and C3A are charged by a current of the selected cell via switch elements SW1A and SW3A in ON states. The capacitor C2A is charged by a current of the reference cell RC via a switch element SW2A in the ON state.

At time t2$d$, the signal levels of the signals S1, S2, and S3 are set to "L" level. Consequently, the capacitors C1A and C3A are electrically separated from the selected cell MC by the switch elements SW1A and SW3A in the OFF state. The capacitor C2A is electrically separated from the reference cell RC by the switch element SW2A in the OFF state.

At time t3$d$, the signal level of a signal SC1 is set to the "H" level. Consequently, charges charged in the capacitors C1A and C2A are respectively supplied to the two input terminals of the sense amplifier circuit 520A.

For example, at time t4$d$, the signal level of the signal SC1 is set to the "L" level. Consequently, the capacitors C1A and C2A are electrically separated from the input terminal of the sense amplifier circuit 520A by the switch elements SWX1 and SWX2 in the OFF state.

At time t5$d$, the signal level of the sense enable signal SEN1 is set to the "H" level. Consequently, the sense amplifier circuit 520A is activated.

The signal level of the signal SC1 may be set to the "L" level after the time t5$d$ (for example, at a timing between the time t5$d$ and time t6$d$).

By differential amplification, the sense amplifier circuit 520A compares a signal from the capacitor C1A and a signal from the capacitor C2A and amplifies the comparison result.

At this time, the signal level of the selection signal SEL is controlled such that the output signal of the sense amplifier circuit 520A is output from the selection circuit 550. For example, the signal level of the selection signal SEL is set to the "L" level.

At the time t6$d$, the signal level of the control signal SEN1 is set to the "L" level.

Consequently, the sense amplifier circuit 520A is deactivated. The comparison result is latched in the sense amplifier circuit 520A (or the selection circuit 550).

In a period from time t7d to time t8d, by the selection signal SEL at the "L" level, the result of signal processing of the sense amplifier circuit 520A is output from an output terminal DOUT of the selection circuit 550, as data DOUT1 read by the reference cell method.

In a period from time t9d to time t10d, the signal level of a control signal MTJ-WR is set to the "H" level. A write current for writing reference data is supplied to an MTJ element 400 in the selected cell MC by an activated write circuit 125.

At time tx, the signal level of the selection signal SEL is set to the "H" level. Consequently, the selection circuit 550 is set so as to select the output signal of the sense amplifier circuit 520B.

At time t11d, the signal level of a signal S4 is set to the "H" level.

In the second reading in the read operation by the self-reference method, the capacitor C4A is charged by a charge caused by a read current IRDb of the selected cell MC via a switch element SW4A in the ON state.

At time t12d, the signal level of the signal S4 is set to the "L" level. Consequently, the capacitor C4A is electrically separated from the selected cell MC by the switch element SW4A in the OFF state.

At time t13d, the signal level of a control signal SC2 is set to the "H" level.

Consequently, charges charged in the capacitors C3A and C4A are respectively supplied to the two input terminals of the sense amplifier circuit 520B.

For example, at time t14d, the signal level of the control signal SC2 is set to the "L" level. Consequently, the capacitors C3A and C4A are electrically separated from the input terminal of the sense amplifier circuit 520B by the switch elements SWZ1 and SWZ2 in the OFF state.

At time t15d, the signal level of the sense enable signal SEN2 is set to the "H" level. Consequently, the sense amplifier circuit 520B is activated.

The signal level of the control signal SC2 may be set to the "L" level after the time t15d.

The sense amplifier circuit 520B compares a signal from the capacitor C3A and a signal from the capacitor C4A and amplifies a signal indicating the comparison result.

At time t16d, the signal level of the sense enable signal SEN2 is set to the "L" level. Consequently, the sense amplifier circuit 520B is deactivated.

In a period from time t17d to time t18d, by the selection signal SEL at the "H" level, the result of the signal processing of the sense amplifier circuit 520A is output from the output terminal DOUT of the selection circuit 550, as data DOUT2 read by the self-reference method.

In a period from time t19d to time t20d, the write circuit 125 is activated by the control signal MTJ-WR at the "H" level. Consequently, in writeback processing, the data DOUT2 is written to the selected cell.

For example, at time tz between the time t19d and the time t20d, the signal level of the selection signal SEL is set to the "L" level.

As described above, in the MRAM of this embodiment, output of data based on the read operation by the self-reference method and output of data based on the read operation by the destructive self-reference method are successively executed by the read circuit of FIG. 23.

<Operation Example 2>

An operation example 2 of the memory device of this embodiment will be described with reference to FIG. 25.

Figure 25:
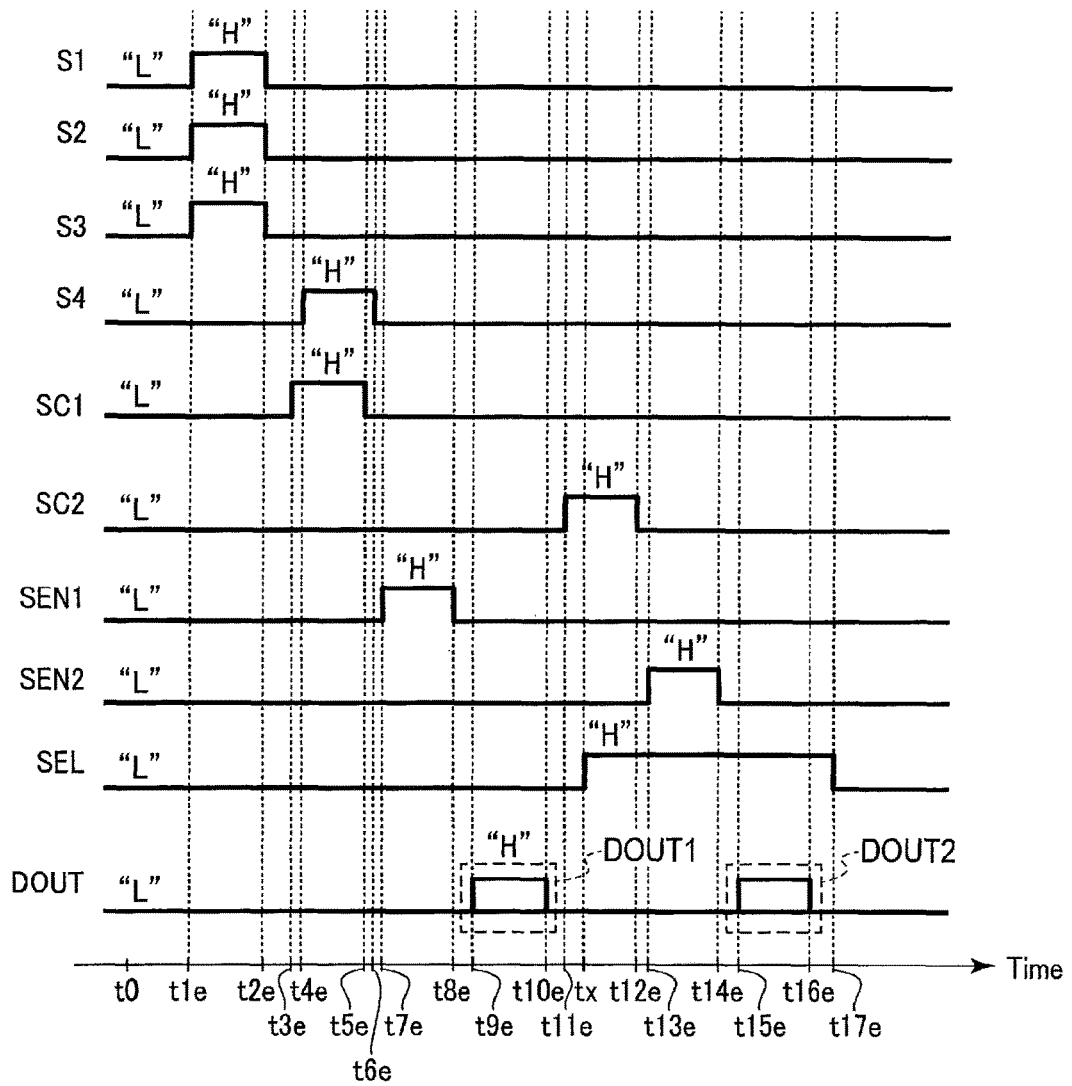

FIG. 25 is a timing chart for explaining an operation example of the read circuit shown in FIG. 23 in the memory device of this embodiment.

The timing chart of FIG. 25 shows an example in which the read circuit of FIG. 23 executes read operation by a non-destructive self-reference method.

As shown in FIG. 25, at time tie, the signal levels of the signals S1, S2, and S3 are set to the "H" level.

The capacitors C1A and C3A are charged by a charge caused by a read current IRDa of the selected cell MC via the switch elements SW1A and SW3A in the ON state, respectively.

The capacitor C2A is charged by a charge caused by a current IRef from the reference cell RC via the switch element SW2A in the ON state. The read current IRDa and the reference current IRef are generated by application of a voltage VR1 to the selected cell MC and the reference cell RC.

At time t2e, the signal levels of the signals S1, S2, and S3 are set to "L" level. Consequently, the capacitors C1A and C3A are electrically separated from the selected cell MC by the switch elements SW1A and SW3A in the OFF state. The capacitor C2A is electrically separated from the reference cell RC by the switch element SW2A in the OFF state.

At time t3e, the signal level of the signal SC1 is set to the "H" level.

Consequently, charges charged in the capacitors C1A and C2A are respectively supplied to the two input terminals of the sense amplifier circuit 520A.

At time t4e, the signal level of the signal S4 is set to the "H" level.

In the second reading in the read operation by the self-reference method, the capacitor C4A is charged by the charge caused by the read current IRDb of the selected cell MC via the switch element SW4A in the ON state. For example, the read current IRDb is generated by application of a voltage VR2 to the selected cell MC.

In this way, charging of the capacitor C4A is executed without writing the reference data to the selected cell. The capacitor C4A is charged during a period when signals of the capacitors C1A and C2A are supplied to the sense amplifier circuit 520A.

At time t5e, the signal level of the signal SC1 is set to the "L" level. Consequently, the capacitors C1A and C2A are electrically separated from the input terminal of the sense amplifier circuit 520A by the switch elements SWX1 and SWX2 in the OFF state.

At time t6e, the signal level of the signal S4 is set to the "L" level. Consequently, the capacitor C4A is electrically separated from the selected cell by the switch element SW4A in the OFF state.

At time t7e, the signal level of the sense enable signal SEN1 is set to the "H" level. Consequently, the sense amplifier circuit 520A is activated.

The signal level of the signal SC1 is set to the "L" level after the time t7e (for example, at a timing between the time t7e and time t8e).

The sense amplifier circuit 520A compares the signal from the capacitor C1A and the signal from the capacitor C2A by differential amplification and amplifies the signal indicating the comparison result.

At this time, the signal level of the selection signal SEL is controlled such that the output signal of the sense amplifier circuit 520A is output from the selection circuit 550. For example, the signal level of the selection signal SEL is set to the "L" level.

At time t8e, the signal level of the control signal SEN1 is set to the "L" level.

Consequently, the sense amplifier circuit 520A is deactivated.

In a period from time t9e to time t10e, by the selection signal SEL at the "L" level, the result of the signal processing of the sense amplifier circuit 520A is output from the output terminal DOUT of the selection circuit 550, as the data DOUT1 read by the reference cell method.

At time t11e, the signal level of the control signal SC2 is set to the "H" level.

Consequently, charges charged in the capacitors C3A and C4A are respectively supplied to the two input terminals of the sense amplifier circuit 520B.

An activation timing of the switch element SW4A is not limited to the timing from the time t4e to the time t6e as long as the timing is earlier than the time at which the control signal SC2 is set to the "H" level.

For example, at time tx between the time t11e and the time t12e, the signal level of the selection signal SEL is set to the "H" level, for example. Consequently, the output signal of the sense amplifier circuit 520B is controlled so as to be output from the selection circuit 550.

At the time t12e, the signal level of the control signal SC2 is set to the "L" level. Consequently, the capacitors C3A and C4A are electrically separated from the input terminal of the sense amplifier circuit 520B by the switch elements SWZ1 and SWZ2 in the OFF state.

At time t13e, the signal level of the sense enable signal SEN2 is set to the "H" level. Consequently, a sense amplifier circuit 520B is activated.

The signal level of the signal SC1 is set to the "L" level after the time t13e (for example, at a timing between the time t13e and time t14e).

The sense amplifier circuit 520B compares the signal from the capacitor C3A and the signal from the capacitor C4A by differential amplification and amplifies the signal indicating the comparison result.

At this time, the signal level of the selection signal SEL is set such that the output signal of the sense amplifier circuit 520B is output from the selection circuit 550. For example, the signal level of the selection signal SEL is set to the "H" level at the time tx.

At time t14e, the signal level of the control signal SEN2 is set to the "L" level. Consequently, the sense amplifier circuit 520B is deactivated.

In a period from time t15e to time t16e, by the selection signal SEL at the "H" level, the result of the signal processing of the sense amplifier circuit 520B is output from the output terminal DOUT of the selection circuit 550, as the data DOUT1 read by the self-reference method.

As described above, in the MRAM of this embodiment, output of data by the reference cell method and output of data by the non-destructive self-reference method are successively executed by the read circuit of FIG. 23.

(E3) Summary

As shown in FIGS. 23 to 25, in the MRAM of this embodiment, the read circuit of FIG. 23 can successively execute the read operation by the reference cell method and the read operation by the self-reference method.

In the read circuit of the MRAM of this embodiment, the sense amplifier circuit 520A for the read operation by the reference cell method and the sense amplifier circuit 520B for the read operation by the self-reference method are provided. The two sense amplifier circuits 520A and 520B each independently execute the signal processing of the corresponding capacitors C1A, C2A, C3A, and C4A.

In the read circuit of the MRAM of this embodiment, the selection circuit 550 performs control such that either one of the two pieces of data is output.

According to this constitution, in the MRAM of this embodiment, as compared with a case where a sense amplifier circuit executes both signal comparison in the reference cell method and signal comparison in the self-reference method, it is possible to shorten a period for transferring the data by the reference cell method and the data by the self-reference method from the MRAM to the processor.

Accordingly, the computer system and the memory device of this embodiment can achieve high-speed operation.

[F] Fifth Embodiment

A computer system and a memory device of the fifth embodiment will be described with reference to FIGS. 26 and 27.

(F1) Configuration Example

A configuration example of the computer system and the memory device of this embodiment will be described with reference to FIGS. 26 and 27.

FIG. 26 is a block diagram for explaining the configuration example of the computer system of this embodiment.

In the computer system of FIG. 26, an MRAM1 includes an error detection/correction circuit (hereinafter also referred to as an ECC circuit) 250.

The ECC circuit 250 is provided in an output control circuit 200 of an I/F circuit 20, for example.

The ECC circuit 250 executes error detection processing in data read by a reference cell method and data read by a self-reference method and correction processing for the detected error.

Data from a memory circuit is stored in each of read buffer circuits 210 and 220 via the ECC circuit 250.

The MRAM1 including the ECC circuit 250 as in this embodiment is effective when a read error rate of data read from a memory circuit 10 is high.

FIG. 27 is a block diagram showing an internal configuration of the output control circuit in the MRAM of this embodiment.

As shown in FIG. 27, the ECC circuit 250 receives read data from the memory circuit 10.

The ECC circuit 250 executes the error detection processing on the read data.

When an error in the data is detected, the ECC circuit 250 executes the correction processing on the detected error. Consequently, the error in the data is corrected.

When the data whose error is detected and corrected is the data based on the reference cell method, the ECC circuit 250 sends the corrected data to the read buffer circuit 210.

When the data whose error is detected and corrected is the data based on the self-reference method, the ECC circuit 250 sends the corrected data to the read buffer circuit 220.

When an error in the data is not detected, the ECC circuit 250 supplies the data to the corresponding read buffer circuit 210 or 220 without the correction processing.

(F2) Operation Example

An operation example of the MRAM and the computer system of this embodiment will be described.

In the operation example of the MRAM of this embodiment, as in the operation example in each of the above-described embodiments, the read operation by the reference cell method and the read operation by the self-reference method are executed successively.

Data DOUT1 based on the reference cell method is supplied to the ECC circuit 250 in the output control circuit 200. The ECC circuit 250 applies ECC processing to the data DOUT1.

The ECC-processed data DOUT1 is held in the read buffer circuit 210.

The data DOUT1 in the read buffer circuit 210 is transferred to the processor 9 in advance.

The processor 9 executes speculative calculation processing P1 using the data DOUT1 based on the reference cell method.

In the memory circuit 10, data DOUT2 based on the read operation by the self-reference method is supplied to the ECC circuit 250 after the read operation by the reference cell method.

The ECC circuit 250 applies the ECC processing to the data DOUT2.

The ECC-processed data DOUT2 is held in the read buffer circuit 220. When the two pieces of data DOUT1 and DOUT2 are aligned in the read buffer circuits 210 and 220, a comparison circuit 231 compares the ECC-processed data DOUT1 and DOUT2.

As in each of the above-described embodiments, when the two pieces of data DOUT1 and DOUT2 match, the MRAM1 transmits a flag including a valid signal to the processor 9.

Based on the valid signal, the processor 9 commits the result of the speculative calculation processing.

When the two pieces of data DOUT1 and DOUT2 do not match, the MRAM1 transmits a flag including an error signal and the data DOUT2 by the self-reference method (data unit DU corresponding to an error position) to the processor 9.

Based on the error signal, the processor 9 executes recalculation processing using the data DOUT2. The processor 9 commits the result of the recalculation processing.

As described above, the calculation processing by the computer system of this embodiment is completed.

(F3) Summary

As described above, in the computer system of this embodiment, the MRAM includes the error detection/correction circuit.

Even when the error detection/correction circuit is provided in the MRAM, the read operation in the MRAM and the calculation processing in the processor are executed with substantially the same operation as each of the above-described embodiments.

As in this embodiment, when the MRAM includes the error detection/correction circuit, the reliability of read data is further improved.

As a result, in this embodiment, the reliability of the calculation processing in the processor is improved.

Accordingly, the computer system and the memory device of this embodiment can obtain high reliability.

[G] Sixth Embodiment

A computer system and a memory device of the sixth embodiment will be described with reference to FIGS. 28 to 31.

(G1) Configuration Example

A configuration example of the computer system and the memory device of this embodiment will be described with reference to FIGS. 28 and 29.

Various processing on read data based on the reference cell method and read data based on the self-reference method may be executed by the processor 9.

FIG. 28 is a block diagram showing the configuration example of the computer system of this embodiment.

As shown in FIG. 28, the processor 9 includes a memory processing circuit 910 in a memory controller 90.

The memory processing circuit 910 compares data by the reference cell method and data by the self-reference method sent from the MRAM1, generates flags, and the like.

When the data processing circuit 910 is provided on the processor 9 side, in the interface circuit 20 of the MRAM1, the read buffer circuits 210 and 220 are connected to an I/O circuit 234 without via a control circuit.

FIG. 29 is a block diagram for explaining an internal configuration of the data processing circuit 910 in the computer system of this embodiment.

As shown in FIG. 29, within the memory controller 90 on the processor 9 side, the data processing circuit 910 at least includes two read buffer circuits 911 and 912, a comparison circuit 913, and a control circuit 914.

The read buffer circuit 911 temporarily holds data based on the reference cell method from the MRAM1.

The read buffer circuit 912 temporarily holds data based on the self-reference method from the MRAM1.

The comparison circuit 913 compares the data DOUT1 in the read buffer circuit 911 with the data DOUT2 in the read buffer circuit 912.

When the two pieces of data DOUT1 and DOUT2 match, the comparison circuit 913 outputs the flag including the valid signal. When the two pieces of data DOUT1 and DOUT2 do not match, the comparison circuit 913 outputs the flag including the error signal.

The control circuit 914 controls each circuit in the data processing circuit 910.

(G2) Operation Example

An operation example of the computer system of this embodiment will be described with reference to FIGS. 30 and 31.

Figure 31:
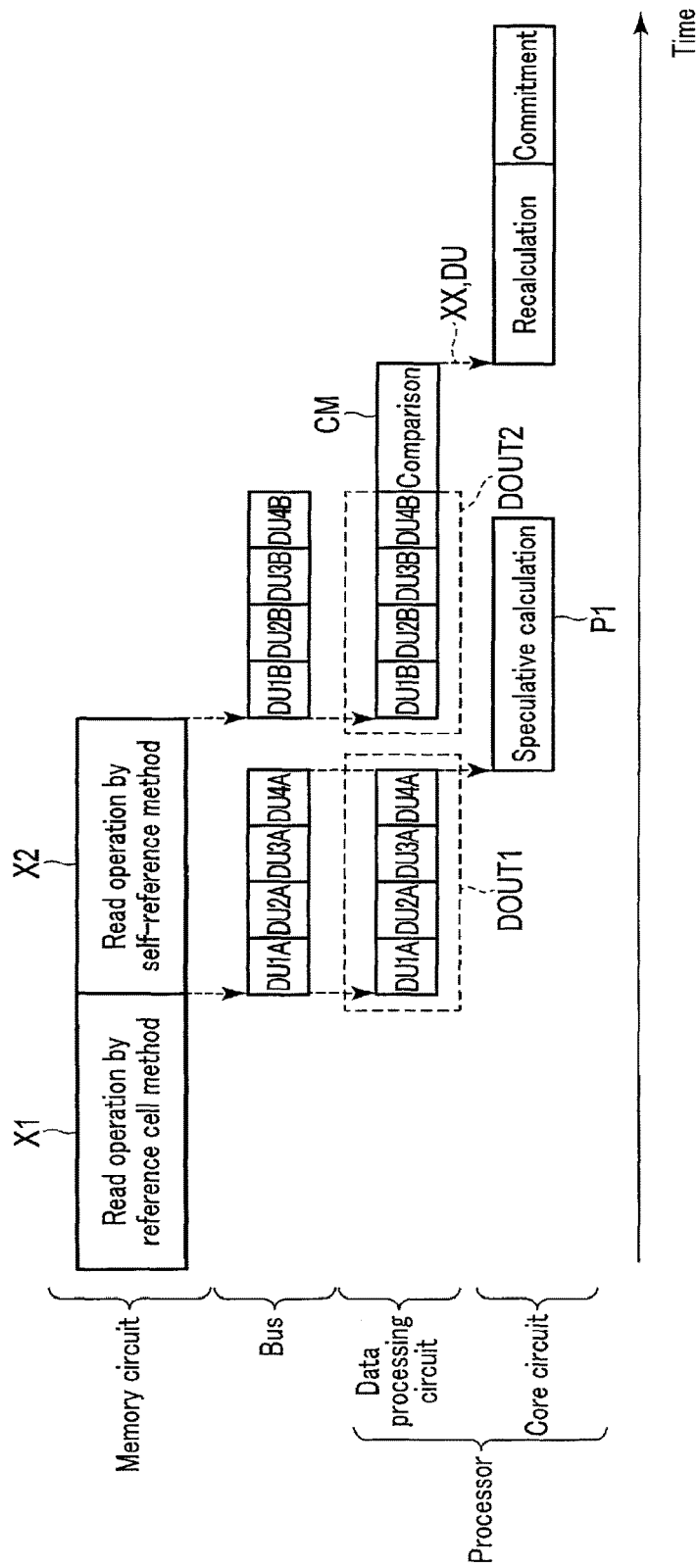

FIGS. 30 and 31 are timing charts for explaining an operation example of the computer system of this embodiment.

FIG. 30 is a timing chart when the data based on the reference cell method and the data based on the self-reference method in the computer system of this embodiment match.

As shown in FIG. 30, the MRAM1 executes read operation X1 by the reference cell method. In the MRAM1, the I/O circuit 234 transfers the data DOUT1 based on the reference cell method to the memory controller 90 via a bus 8.

Following the read operation by the reference cell method, the MRAM1 executes the read operation by the self-reference method. In the MRAM1, the I/O circuit 234 transfers the data DOUT2 based on the self-reference method to the memory controller 90 via the bus 8 after transferring the data DOUT1.

The data DOUT1 and DOUT2 are supplied to the data processing circuit 901 of the memory controller 90.

The data DOUT1 by the reference cell method is stored in the buffer circuit 911.

The data processing circuit 910 sends the data DOUT1 to the core circuit 99.

The core circuit 99 executes speculative calculation processing P1 on the data DOUT1. The speculative calculation processing P1 is executed in parallel with the read operation X2 by the self-reference method.

For example, during the execution of the speculative calculation processing P1, the data DOUT2 by the self-reference method is stored in the buffer circuit 912.

In the data processing circuit 910, the comparison circuit 913 executes comparison processing CM between the data DOUT1 and the data DOUT2.

When each of the data DOUT1 and DOUT2 includes a plurality of the data units DU, the comparison circuit 913 performs comparison processing for each of the corresponding data units DU1 and DU2 as described with reference to FIG. 12.

When the two pieces of data DOUT1 and DOUT2 match, the data processing circuit 910 sends a flag FLG including a valid signal SVLD to the core circuit 99.

The core circuit 99 commits the result of the speculative calculation processing P1 based on the valid signal SVLD.

In this way, in the computer system of this embodiment, the calculation processing in the case where the data DOUT1 based on the reference cell method and the data DOUT2 based on the self-reference method match is completed.

FIG. 31 is a timing chart when the data based on the reference cell method and the data based on the self-reference method in the computer system of this embodiment do not match.

As in the example of FIG. 30, the MRAM1 successively executes the read operation X1 by the reference cell method and the read operation X2 by the self-reference method.

The core circuit 99 executes the speculative calculation processing P1 using the data DOUT1 based on the reference cell method.

The data processing circuit 910 receives data by the self-reference method during the execution of the speculative calculation processing P1.

The comparison circuit 913 compares the two pieces of data DOUT1 and DOUT2 in the buffer circuits 911 and 912 for each of the data units DU1 and DU2 by the comparison processing CM.

If the two pieces of data DOUT1 and DOUT2 do not match, the data processing circuit 910 sends a flag, an error position, and correction data (data unit) to the core circuit 99.

The core circuit 99 executes recalculation processing P2 using the data (data unit) DOUT2 by the self-reference method as correction data.

The core circuit 99 commits the result of the recalculation processing P2.

In this way, in the computer system of this embodiment, the calculation processing in the case where the data based on the reference cell method and the data based on the self-reference method do not match is completed.

The ECC circuit may be provided in the data processing circuit 910 of FIG. 29 provided on the processor side. The ECC circuit in the data processing circuit 910 executes the ECC processing on the data DOUT1 and DOUT2 from the MRAM1. The ECC-processed data is stored in the data processing circuit buffer circuits 911 and 912.

(G3) SUMMARY

As described above, in the computer system of this embodiment, the data by the reference cell method and the data by the self-reference method from the MRAM1 are subjected to the comparison processing by the circuit in the processor 9.

The computer system of this embodiment executes determination of appropriateness of the result of the calculation processing and the recalculation processing based on the comparison result of the two pieces of data in the processor 9.

Even in this case, the computer system of this embodiment can execute processing similar to those of other embodiments described above.

Thus, the computer system of this embodiment can obtain substantially the same effect as each of the above-described embodiments.

Accordingly, the computer system of this embodiment can achieve high-speed processing and improve the reliability.

[H] Other

In the memory device of this embodiment, an example in which the data in the memory cell is read by charging the capacitor in the read circuit is shown. In the memory device of this embodiment, in the capacitors holding the output signal of the selected cell in each read method in the read circuit, the potential (potential corresponding to the charge amount remaining in the capacitor) held by the capacitor discharged in accordance with the output signal from the selected cell (and reference cell) is sensed and amplified by the sense amplifier circuit, whereby the data of the memory cell may be read.

The MRAM as the memory device of this embodiment may be mounted in the processor 9. The MRAM of this embodiment may be used in a memory in the memory controller 90 or in a memory in the core circuit 99.

In the computer system of the embodiment, an example in which the MRAM is used as the memory device is shown. However, the memory device used in this embodiment may be a magnetic memory using a magnetoresistive effect element (for example, MTJ element) other than the MRAM.

The memory device in this embodiment may be a memory other than the MRAM (magnetic memory) as long as it is a memory device to which two different read methods can be applied.

For example, a memory device selected from among ReRAM, PCRAM, an ion memory, DRAM, SRAM, and a flash memory may be applied to the computer system and the memory device of this embodiment.

In this embodiment, an in-plane (a parallel) magnetization type MTJ element may be used as the MTJ element 400. In the in-plane magnetization type MTJ element, the magnetization directions of magnetic layers 401 and 402 are substantially parallel to layer surfaces of the magnetic layers. In the in-plane magnetization type MTJ element, in the magnetic anisotropy of the magnetic layers 401 and 402, the magnetization directions of the magnetic layers 401 and 402 are rendered substantially parallel to the layer surfaces of the magnetic layers by utilizing the shape magnetic anisotropy of the magnetic layer and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A computer system comprising:
a memory device including a memory cell array, the memory device configured to execute first read operation of a first read method and second read operation of a second read method on the memory cell array;

a processor configured to receive a first data from the memory device, the first data read from a selected region in the memory cell array by the first read operation, configured to execute first calculation processing using the first data during the second read operation to the selected region, and configured to acquire a result of the first calculation processing by a first signal based on a comparison result of the first data and a second data, the first signal indicating that the first data is valid, and the second data read from the selected region by the second read operation.

2. The system according to claim 1, wherein
when it is determined that the first data and the second data match based on the comparison result of the first data and the second data, the first signal is output, and
when it is determined that the first data and the second data do not match based on the comparison result of the first data and the second data, a second signal indicating that the first data is erroneous is output, and
the processor is configured to executes second calculation processing using the second data based on the second signal and configured to acquire a result of the second calculation processing.

3. The system according to claim 2, wherein
the first data includes a plurality of first data units, the second data includes a plurality of second data units,
the memory device transmits, among the second data units, at least one second data unit, corresponding to at least one first data unit including an error, to the processor, and
the processor executes the second calculation processing using the transmitted at least one second data unit.

4. The system according to claim 1, wherein
the memory device includes a comparison circuit which compares the first data and the second data.

5. The system according to claim 1, wherein
the processor includes a buffer circuit which holds the first data and a flag indicating a state of the first data, and
the flag is set to a value indicating that the first data is in a valid state based on the first signal.

6. The system according to claim 1, wherein
the memory device includes a read circuit configured to execute the first and second read operations,
the read circuit includes
a sense amplifier circuit having first and second input terminals,
a first interconnect connected between the first input terminal and the memory cell array,
a second interconnect connected between the first input terminal and the memory cell array,
a third interconnect connected to the second input terminal,
a fourth interconnect connected between the second input terminal and the memory cell array, and
a reference cell connected to the third interconnect,
in a first period, the first and second interconnects hold a potential corresponding to a first output signal from the selected region, the third interconnect holds a potential corresponding to a second output signal from the reference cell, and
in a second period after the first period, the second interconnect holds the potential corresponding to the first output signal, and the fourth interconnect holds a potential corresponding to a third output signal from the selected region.

7. The system according to claim 6, wherein
in a third period between the first period and the second period, a write current is supplied to the selected region.

8. The system according to claim 6, wherein
the selected region includes a magnetoresistive effect element as a memory element,
a first voltage is applied to the magnetoresistive effect element when the first output signal is output from the selected region, and
a second voltage higher than the first voltage is applied to the magnetoresistive effect element when the third output signal is output from the selected region.

9. The system according to claim 1, wherein
the memory device includes a read circuit configured to execute the first and second read operations,
the read circuit includes
a first sense amplifier circuit having first and second input terminals and a first output terminal,
a second sense amplifier circuit having third and fourth input terminals and a second output terminal,
a selection circuit having a fifth input terminal connected to the first output terminal, a sixth input terminal connected to the second output terminal, a third output terminal, and a control terminal to which a control signal is supplied,
a first interconnect connected between the first input terminal and the memory cell array,
a second interconnect connected to the second input terminal,
a third interconnect connected between the third input terminal and the memory cell array,
a fourth interconnect connected between the fourth input terminal and the memory cell array, and
a reference cell connected to the second interconnect, and
the selection circuit outputs either one of an output signal of the first sense amplifier circuit and an output signal of the second sense amplifier circuit from the third output terminal, based on the control signal.

10. The system according to claim 1, wherein
the first read method is a reference cell method, and the second read method is a self-reference method.

11. A memory device comprising:
a memory cell array;
a read circuit configured to, based on a read command, obtain a first data by first read operation of a first read method with respect to a selected region of the memory cell array and obtain a second data by second read operation of a second read method with respect to the selected region; and
an output control circuit configured to output the first data, compare the first data and the second data, and output a first signal indicating that the first data is valid when the first data and the second data match.

12. The device according to claim 11, wherein
the output control circuit is configured to output a second signal, indicating that the first data is erroneous, when it is determined that the first data and the second data do not match based on a comparison result of the first data and the second data.

13. The device according to claim 12, wherein
when the first data and the second data match, an external device coupled to the output control circuit executes first calculation processing using the first data and acquires a result of the first calculation processing based on the first signal, and
when the first data and the second data do not match, the external device executes second calculation processing using the second data and acquires a result of the second calculation processing based on the second signal.

14. The device according to claim 11, wherein
the first data includes a plurality of first data units, the second data includes a plurality of second data units, and
the output control circuit outputs, among the plurality of second data units, at least one second data unit corresponding to at least one first data unit including an error.

15. The device according to claim 11, further comprising:
a comparison circuit configured to compare the first data and the second data.

16. The device according to claim 11, further comprising:
a read circuit configured to execute the first and second read operations,
wherein the read circuit includes
a sense amplifier circuit having first and second input terminals,
a first interconnect connected between the first input terminal and the memory cell array,
a second interconnect connected between the first input terminal and the memory cell array,
a third interconnect connected to the second input terminal,
a fourth interconnect connected between the second input terminal and the memory cell array, and
a reference cell connected to the third interconnect,
in a first period, the first and second interconnects hold a potential corresponding to a first output signal from the selected region, the third interconnect holds a potential corresponding to a second output signal from the reference cell, and
in a second period after the first period, the second interconnect holds the potential corresponding to the first output signal, and the fourth interconnect holds a potential corresponding to a third output signal from the selected region.

17. The device according to claim 16, wherein
in a third period between the first period and the second period, a write current is supplied to the selected region.

18. The device according to claim 16, wherein
the selected region includes a magnetoresistive effect element as a memory element,
a first voltage is applied to the magnetoresistive effect element when the first output signal is output from the selected region, and
a second voltage higher than the first voltage is applied to the magnetoresistive effect element when the third output signal is output from the selected region.

19. The device according to claim 11, further comprising:
a read circuit configured to execute the first and second read operations,
wherein the read circuit includes
a first sense amplifier circuit having first and second input terminals and a first output terminal,
a second sense amplifier circuit having third and fourth input terminals and a second output terminal,
a selection circuit having a fifth input terminal connected to the first output terminal, a sixth input terminal connected to the second output terminal, a third output terminal, and a control terminal to which a control signal is supplied,
a first interconnect connected between the first input terminal and the memory cell array,
a second interconnect connected to the second input terminal,
a third interconnect connected between the third input terminal and the memory cell array,
a fourth interconnect connected between the fourth input terminal and the memory cell array, and
a reference cell connected to the second interconnect, and
the selection circuit outputs either one of an output signal of the first sense amplifier circuit and an output signal of the second sense amplifier circuit from the third output terminal, based on the control signal.

20. The device according to claim 11 wherein
the first read method is a reference cell method, and the second read method is a self-reference method.

* * * * *